(12) United States Patent
Ishikawa et al.

(10) Patent No.: US 6,359,919 B1
(45) Date of Patent: *Mar. 19, 2002

(54) GALLIUM NITRIDE-BASED COMPOUND SEMICONDUCTOR LASER AND METHOD OF MANUFACTURING THE SAME

(75) Inventors: Masayuki Ishikawa, Yokohama; Masahiro Yamamoto, Sagamihara; Shinya Nunoue, Ichikawa; Johji Nishio, Kawasaki; Genichi Hatakoshi, Yokohama; Hidetoshi Fujimoto, Kawasaki, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/642,646

(22) Filed: Aug. 22, 2000

Related U.S. Application Data

(62) Division of application No. 09/373,624, filed on Aug. 13, 1999, now Pat. No. 6,118,801, which is a division of application No. 09/900,121, filed on Jul. 25, 1997, now Pat. No. 5,987,048.

(30) Foreign Application Priority Data

Jul. 26, 1996 (JP) .............................................. 8-197856

(51) Int. Cl.[7] .............................................. H01S 5/323
(52) U.S. Cl. ............................................ 372/45; 372/46
(58) Field of Search ..................................... 372/45, 46

(56) References Cited

U.S. PATENT DOCUMENTS 5,042,043 A    8/1991  Hatano et al. ................. 372/45
5,148,439 A    9/1992  Wunstel et al. ................ 372/46
5,153,687 A   10/1992  Ishikawa et al. ............. 359/248
5,247,533 A    9/1993  Okazaki et al. ................ 372/45
5,361,271 A   11/1994  Takiguchi et al. ............. 372/46
5,585,649 A   12/1996  Ishikawa et al. .............. 259/94
5,966,396 A * 10/1999  Okazaki et al. ................ 372/46
5,970,080 A * 10/1999  Hata .......................... 372/45
5,990,496 A * 11/1999  Kunisato et al. .............. 257/94

FOREIGN PATENT DOCUMENTS

JP    06-112586    4/1994
JP    08-097502    4/1996
JP    08-097503    4/1996

* cited by examiner

*Primary Examiner*—James W. Davie
*Assistant Examiner*—Jeffrey Zahn
(74) *Attorney, Agent, or Firm*—Oblon, Spivak, McClelland, Maier & Neustadt, P.C.

(57) ABSTRACT

A gallium nitride-based compound semiconductor laser has a double-heterojunction structure, in which an active layer is sandwiched between cladding layers, on a sapphire substrate. A GaN current blocking layer having a striped opening portion is formed on the p-cladding layer. A p-GaN buried layer and a contact layer through which a current is injected into the opening portion of the current blocking layer and which are larger in area than the opening portion are formed. The active layer has a multiple quantum well structure constituted by a cyclic structure formed by cyclically stacking two types of InGaAlN layers which have different band gaps and are 10 nm or less thick.

22 Claims, 28 Drawing Sheets

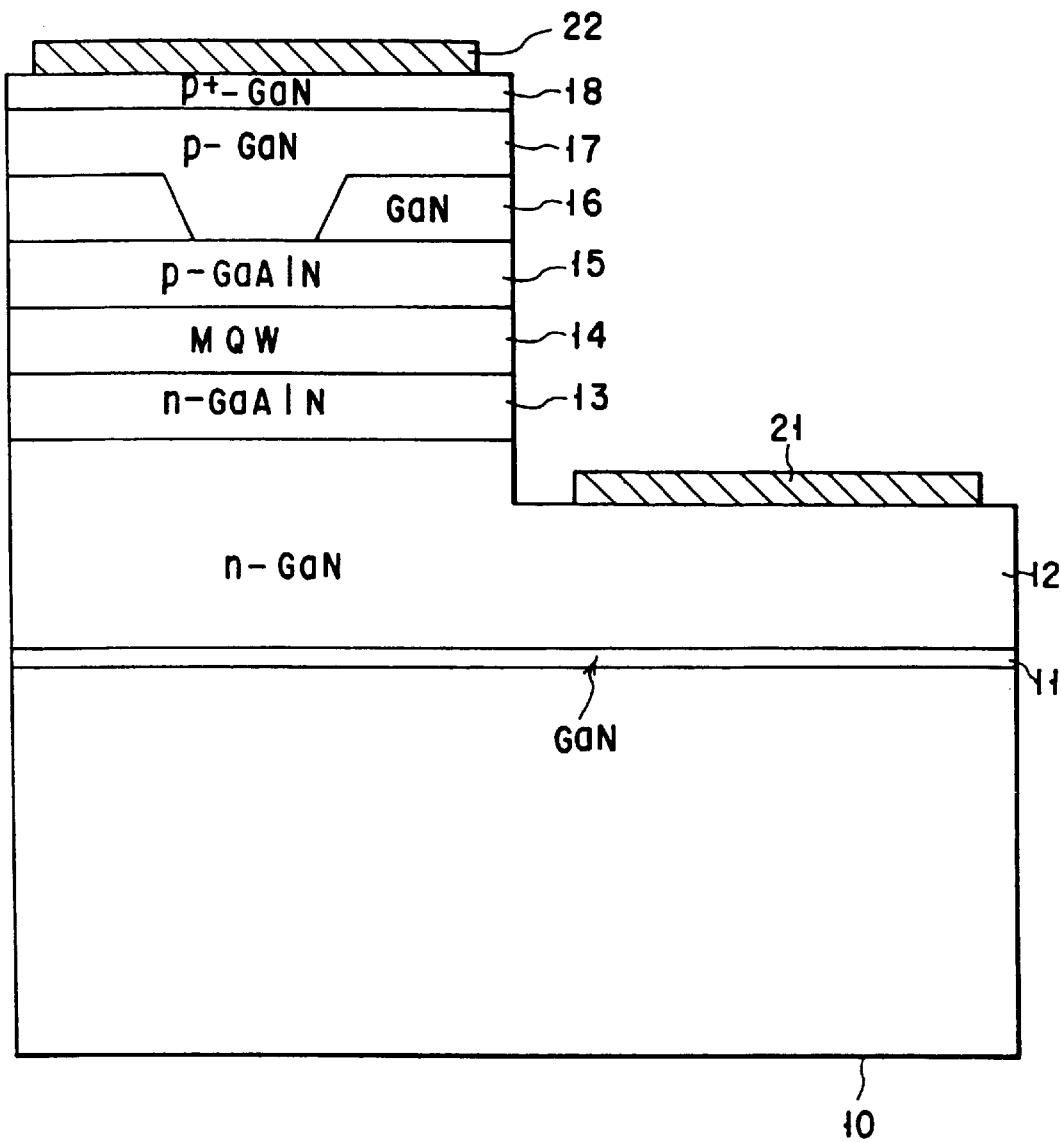
F I G. 1

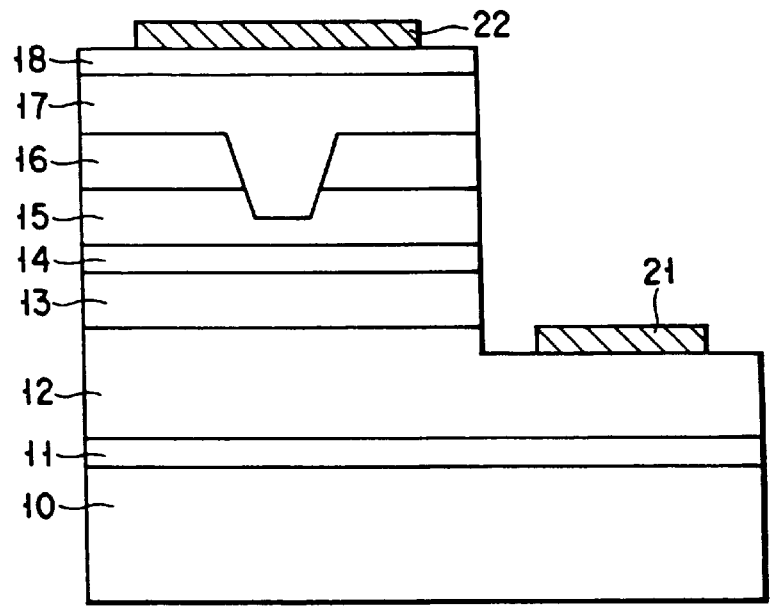
F I G. 17
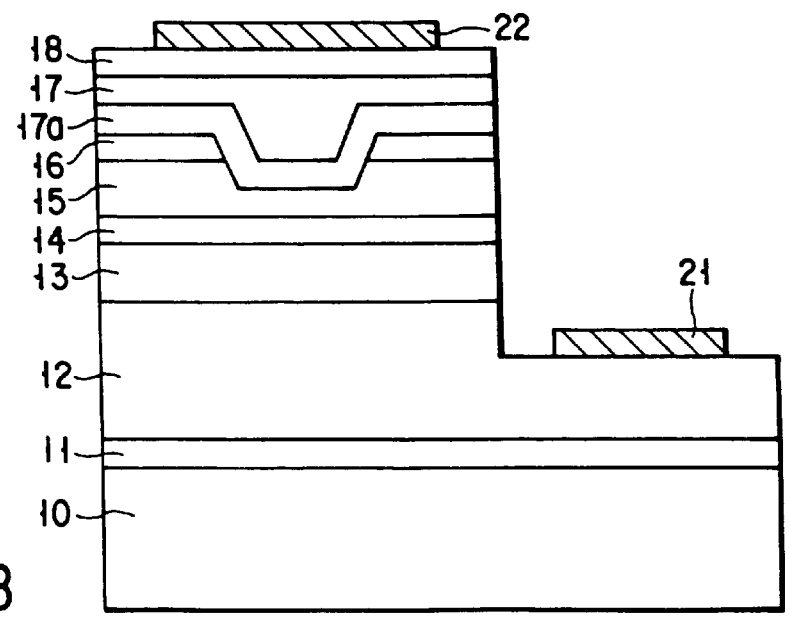
F I G. 18

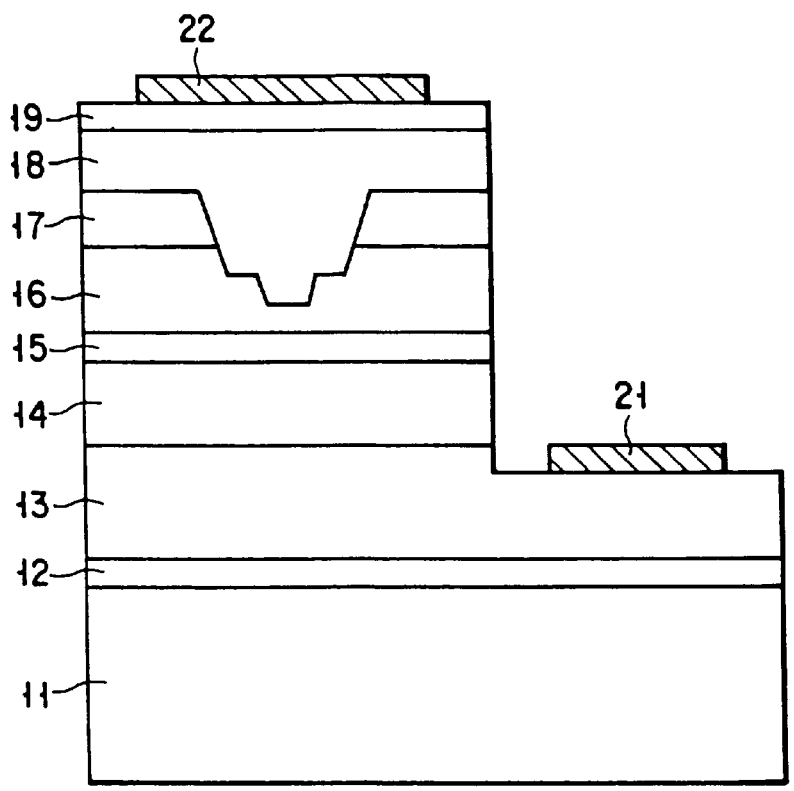
F I G. 19
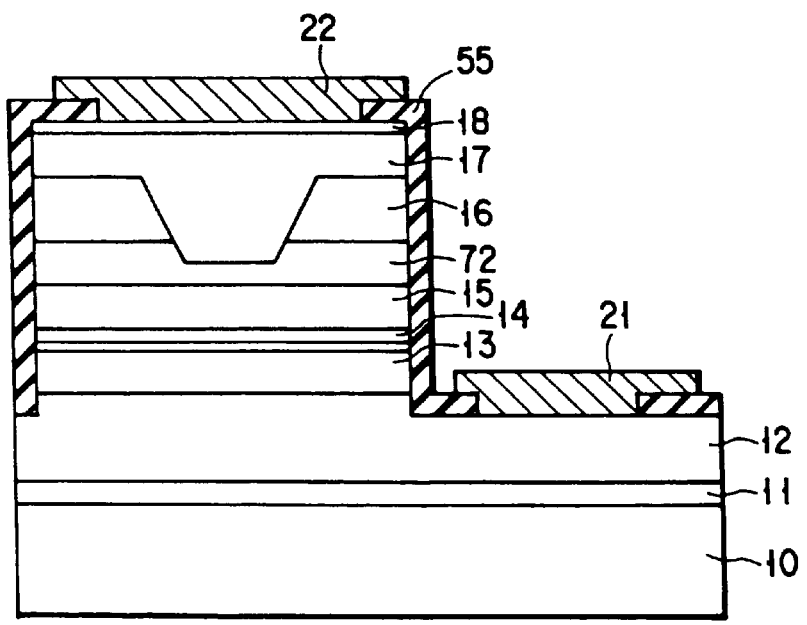
F I G. 20

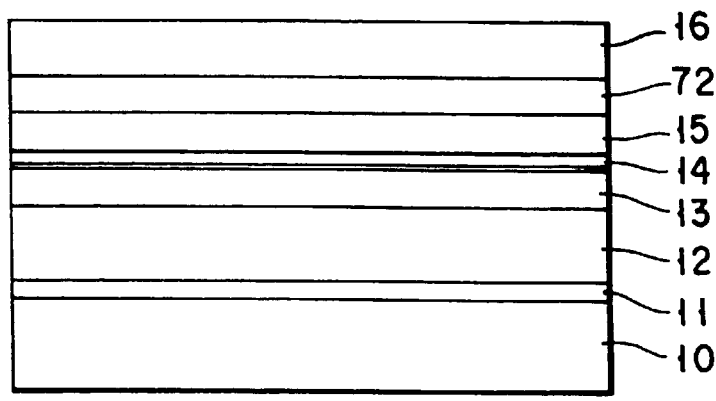
F I G. 30A
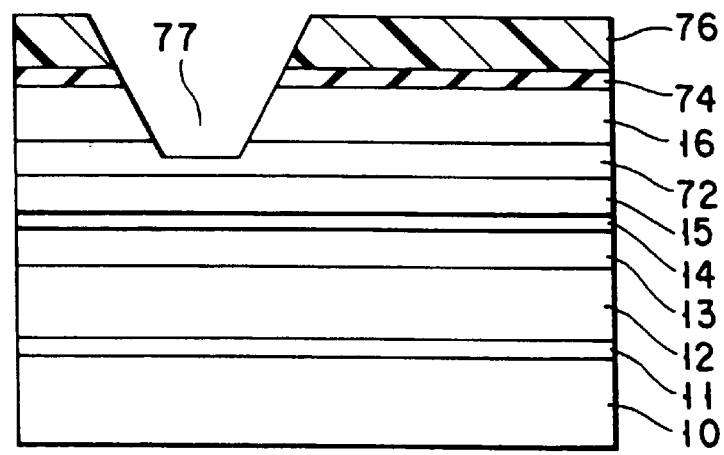
F I G. 30B
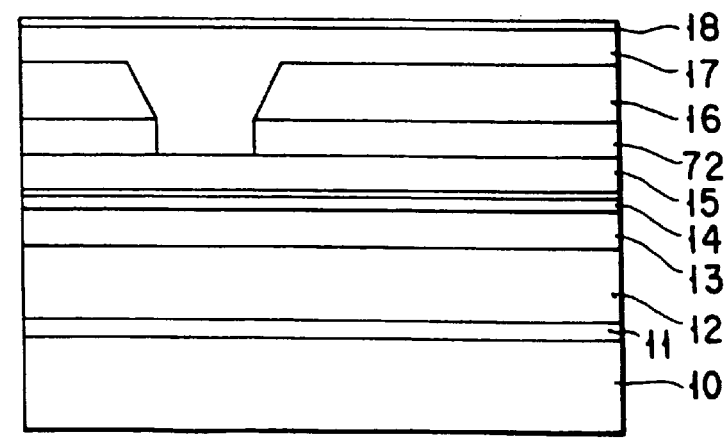
F I G. 30C

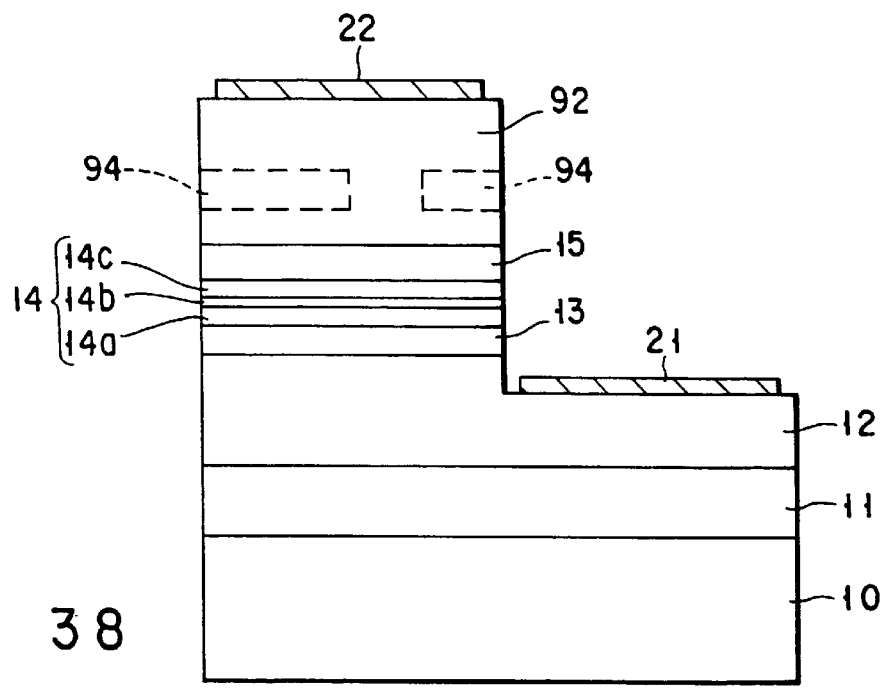
F I G. 38
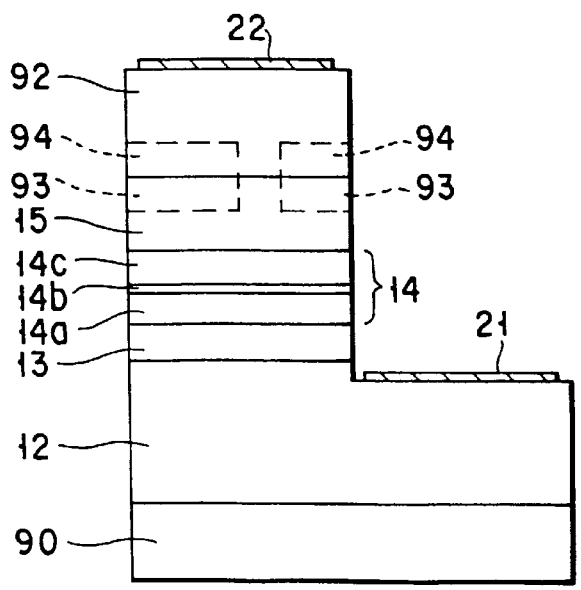
F I G. 39
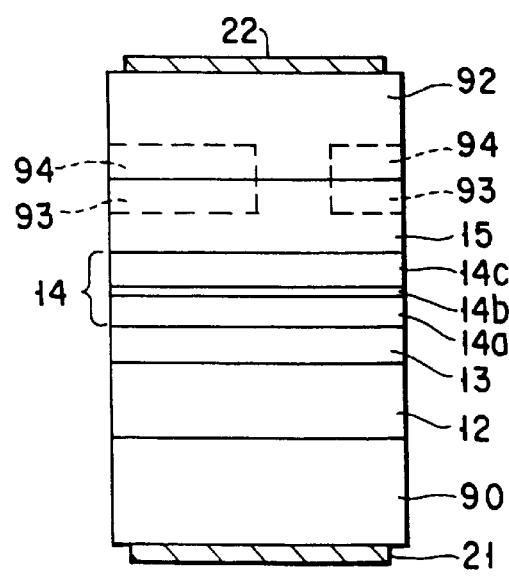
F I G. 40

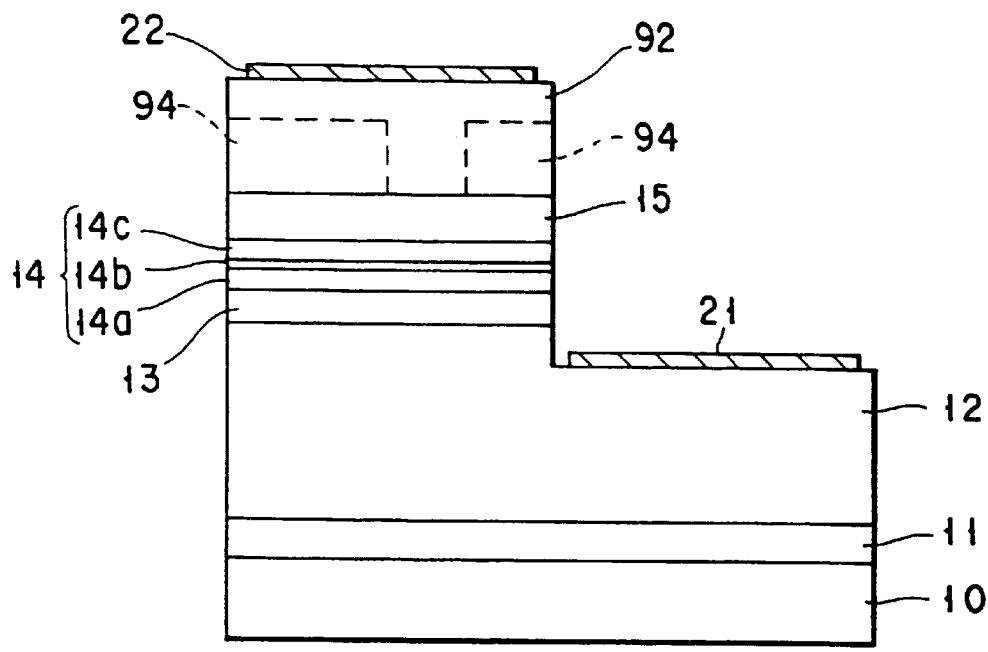
F I G. 41
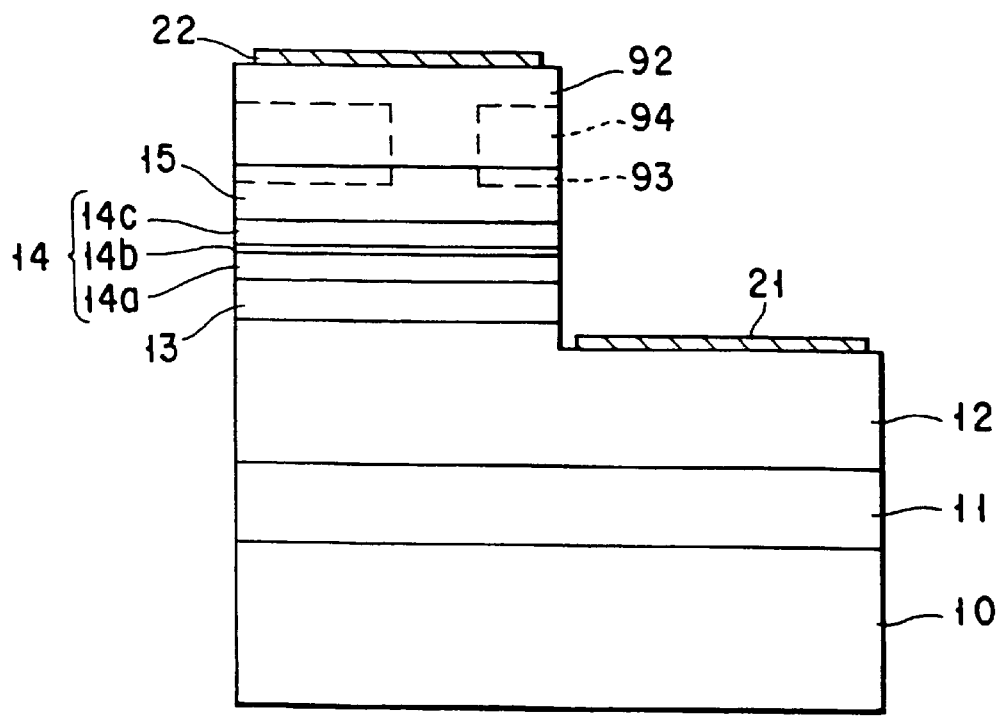
F I G. 42

GALLIUM NITRIDE-BASED COMPOUND SEMICONDUCTOR LASER AND METHOD OF MANUFACTURING THE SAME

CROSS REFERENCE TO RELATED APPLICATION

This application is a divisional application Ser. No. 09/373,624, filed Aug. 13, 1999, now U.S. Pat. No. 6,118,801, which is a divisional application of Ser. No. 08/900,121, filed Jul. 25, 1997, now U.S. Pat. No. 5,987,048; and claims priority to Japanese Application No. 8-197856 filed Jul. 26, 1996, the entire contents of which being incorporated herein by reference.

BACKGROUND OF THE INVENTION

The present invention relates to a semiconductor device using a gallium nitride-based compound semiconductor and a manufacturing technique for the same and, more particularly, to a gallium nitride-based compound semiconductor laser, a method of manufacturing the same, and a method of manufacturing a gallium nitride-based compound semiconductor device.

In recent years, gallium nitride-based compound semiconductors such as GaN, InGaN, GaAlN, and InGaAlN have received a great deal of attention as materials for blue semiconductor lasers. Semiconductor lasers using these materials are designed as short-wavelength lasers and hence can focus beams to small diameters. Owing to this advantage, these lasers are expected to be used as light sources for high-density information processing such as processing in optical disks.

Various structures and manufacturing methods have been proposed for semiconductor lasers of this type. In either of these proposed techniques, a laser having satisfactory characteristics has not been obtained because a gallium nitride-based compound semiconductor layer is difficult to cause crystal growth. That is, even if a gallium nitride-based compound semiconductor layer is formed by crystal growth, a high-quality crystal cannot be obtained. Since the crystal quality is poor, carriers cannot be efficiently injected into the active layer. In addition, in a structure having a striped opening in a current blocking layer, the crystal quality of the regrown layer formed after etching for forming the striped opening deteriorates, resulting in voltage drops at the electrode contacts and the like.

To realize a highly reliable blue semiconductor laser which is used for optical disks and the like and operates at a low threshold and a low voltage, it is important to efficiently inject carriers into the active layer and suppress voltage drops at the electrode contacts and the like. However, with the prior techniques, these requirements cannot be satisfied.

According to a semiconductor laser using a gallium nitride-based compound semiconductor material, it is difficult to cause crystal growth of the material and to obtain a high-quality crystal layer. In addition, the crystal quality of the regrown layer formed after etching for forming a striped opening deteriorates. For these reasons, carriers cannot be efficiently injected into the active layer, and voltage drops occur at the electrode contacts and the like. That is, it is difficult to realize a highly reliable device which is used for optical disks and the like and operates at a low threshold and a low voltage.

That a gallium nitride-based compound semiconductor layer cannot be satisfactorily regrown after it is etched applies to various semiconductor devices using gallium nitride-based compound semiconductors as well as semiconductor lasers.

BRIEF SUMMARY OF THE INVENTION

The present invention has been made in consideration of the above situations, and has as its object to provide a highly reliable gallium nitride-based compound semiconductor laser which allows efficient injection of carriers into the active layer, can suppress voltage drops at the electrode contacts and the like, is used for optical disks and the like, and operates at a low threshold and a low voltage, and a method of manufacturing the same.

It is another object of the present invention to provide a method of manufacturing a gallium nitride-based compound semiconductor device, in which a gallium nitride-based compound semiconductor can be properly regrown once it is etched, thereby contributing to an improvement in the characteristics of various semiconductor devices.

According to a first aspect of the present invention, there is provided a gallium nitride-based compound semiconductor laser comprising:

an active layer having a cyclic structure formed by cyclically stacking not less than two types of semiconductor layers;

first and second cladding layers of first and second conductivity types formed to sandwich the active layer so as to form a double-heterojunction structure;

first and second electrodes connected to the first and second cladding layers;

a current blocking layer formed between the second electrode and the second cladding layer and having a striped opening portion for constricting a current for the double-heterojunction structure; and a current injection layer formed between the second electrode and the current blocking layer and in the opening portion and having an area larger than that of the opening portion, wherein each of the first and second cladding layers, the current blocking layer, the current injection layer consists essentially of a material represented by the following composition formula:

$In_xGa_yAl_zN$ where $x+y+z=1$, and $0 \leq x, y, z \leq 1$, and
when a thickness of the current blocking layer is represented by TA, and a distance between the current blocking layer and the active layer is represented by TB, a condition of TB<TA is satisfied.

According to a second aspect of the present invention, there is provided a gallium nitride-based compound semiconductor laser comprising:

an active layer having a cyclic structure formed by cyclically stacking not less than two types of semiconductor layers;

first and second cladding layers of first and second conductivity types formed to sandwich the active layer so as to form a double-heterojunction structure;

first and second electrodes connected to the first and second cladding layers;

a current blocking layer formed between the second electrode and the second cladding layer and having a striped opening portion for constricting a current for the double-heterojunction structure; and a current injection layer formed between the second electrode and the current blocking layer and in the opening portion and having an area larger than that of the opening portion, wherein each of the first and second cladding layers, the current blocking layer, the current injection layer consists essentially of a material represented by the following composition formula:

$In_xGa_yAl_zN$ where x+y+z=1, and 0≦x, y, z≦1, and when a thickness of the current blocking layer is represented by TA, and a thickness of the current injection layer excluding a portion in the opening portion is represented by TC, a condition of TC<TA is satisfied.

According to a third aspect of the present invention, there is provided a gallium nitride-based compound semiconductor laser comprising:

an active layer having a cyclic structure formed by cyclically stacking not less than two types of semiconductor layers;

first and second cladding layers of first and second conductivity types formed to sandwich the active layer so as to form a double-heterojunction structure;

first and second electrodes connected to the first and second cladding layers;

a current blocking layer formed between the second electrode and the second cladding layer and having a striped opening portion for constricting a current for the double-heterojunction structure; and a current injection layer formed between the second electrode and the current blocking layer and in the opening portion and having an area larger than that of the opening portion, wherein each of the first and second cladding layers, the current blocking layer, the current injection layer consists essentially of a material represented by the following composition formula:

$In_xGa_yAl_zN$ where x+y+z=1, and 0≦x, y, z≦1, and when a distance between the current blocking layer and the active layer is represented by TB, and a thickness of the current injection layer excluding a portion in the opening portion is represented by TC, a condition of TB<TC is satisfied.

According to a fourth aspect of the present invention, there is provided a gallium nitride-based compound semiconductor laser comprising:

an active layer having a cyclic structure formed by cyclically stacking not less than two types of semiconductor layers;

first and second cladding layers of first and second conductivity types formed to sandwich the active layer so as to form a double-heterojunction structure;

first and second electrodes connected to the first and second cladding layers;

a current blocking layer formed between the second electrode and the second cladding layer and having a striped opening portion for constricting a current for the double-heterojunction structure; and a current injection layer formed between the second electrode and the current blocking layer and in the opening portion and having an area larger than that of the opening portion, wherein each of the first and second cladding layers, the current blocking layer, the current injection layer consists essentially of a material represented by the following composition formula:

$In_xGa_yAl_zN$ where x+y+z=1, and 0≦x, y, z≦1, and a portion, of the current injection layer, which is near the active layer has a band gap larger than a band gap corresponding to an emission wavelength of the active layer and a refractive index higher than that of the current blocking layer.

According to a fifth aspect of the present invention, there is provided a gallium nitride-based compound semiconductor laser comprising:

an active layer having a cyclic structure formed by cyclically stacking not less than two types of semiconductor layers;

first and second cladding layers of first and second conductivity types formed to sandwich the active layer so as to form a double-heterojunction structure;

first and second electrodes connected to the first and second cladding layers;

a current blocking layer formed between the second electrode and the second cladding layer and having a striped opening portion for constricting a current for the double-heterojunction structure; and a current injection layer formed between the second electrode and the current blocking layer and in the opening portion and having an area larger than that of the opening portion, wherein each of the first and second cladding layers, the current blocking layer, the current injection layer consists essentially of a material represented by the following composition formula:

$In_xGa_yAl_zN$ where x+y+z=1, and 0≦x, y, z≦1, and the current blocking layer has a band gap larger than a band gap corresponding to an emission wavelength of the active layer, and a refractive index higher than that of a portion, of the current injection layer, which is near the active layer.

According to a sixth aspect of the present invention, there is provided a gallium nitride-based compound semiconductor laser comprising:

an active layer having a cyclic structure formed by cyclically stacking not less than two types of semiconductor layers;

first and second cladding layers of first and second conductivity types formed to sandwich the active layer so as to form a double-heterojunction structure;

first and second electrodes connected to the first and second cladding layers;

a current blocking layer formed between the second electrode and the second cladding layer and having a striped opening portion for constricting a current for the double-heterojunction structure; and a current injection layer formed between the second electrode and the current blocking layer and in the opening portion and having an area larger than that of the opening portion, wherein each of the first and second cladding layers, the current blocking layer, the current injection layer consists essentially of a material represented by the following composition formula:

$$In_xGa_yAl_zN$$

where $x+y+z=1$, and $0 \leq x, y, z \leq 1$, and
a portion, of the current injection layer, which is near the active layer has a band gap larger than a band gap corresponding to an emission wavelength of the active layer, and the current blocking layer has a band gap smaller than the band gap corresponding to the emission wavelength of the active layer.

According to a seventh aspect of the present invention, there is provided a gallium nitride-based compound semiconductor laser comprising:
an active layer having a cyclic structure formed by cyclically stacking not less than two types of semiconductor layers;
first and second cladding layers of first and second conductivity types formed to sandwich the active layer so as to form a double-heterojunction structure;
first and second electrodes connected to the first and second cladding layers;
a current blocking layer formed between the second electrode and the second cladding layer and having a striped opening portion for constricting a current for the double-heterojunction structure; and
a current injection layer formed between the second electrode and the current blocking layer and in the opening portion and having an area larger than that of the opening portion,
wherein each of the first and second cladding layers, the current blocking layer, the current injection layer consists essentially of a material represented by the following composition formula:

$$In_xGa_yAl_zN$$

where $x+y+z=1$, and $0 \leq x, y, z \leq 1$, and
a striped groove continuous with the opening portion is formed in an upper surface of the second cladding layer, and the current injection layer is formed to be in contact with the second cladding layer in the groove.

According to an eighth aspect of the present invention, there is provided a method of manufacturing a gallium nitride-based compound semiconductor laser, the semiconductor laser including:
an active layer;
first and second cladding layers of first and second conductivity types formed to sandwich the active layer so as to form a double-heterojunction structure;
first and second electrodes connected to the first and second cladding layers;
a current blocking layer formed between the second electrode and the second cladding layer and having a striped opening portion for constricting a current for the double-heterojunction structure; and
a current injection layer formed between the second electrode and the current blocking layer and in the opening portion and having an area larger than that of the opening portion,
wherein each of the first and second cladding layers, the current blocking layer, the current injection layer consists essentially of a material represented by the following composition formula:

$$In_xGa_yAl_zN$$

where $x+y+z=1$, and $0 \leq x, y, z \leq 1$,
the method comprising the steps of:
forming a multilayer film having the double-heterojunction structure on a support substrate;
stacking the current blocking layer and a surface protective layer on the multilayer film;
forming the striped opening portion by partly etching the surface protective layer and the current blocking layer; and
forming the current injection layer in the opening portion and on the current blocking layer after removing the surface protective layer by leaving the surface protective layer in a vapor phase at a high temperature to re-evaporate crystals.

According to a ninth aspect of the present invention, there is provided a method of manufacturing a gallium nitride-based compound semiconductor laser, the semiconductor laser including:
an active layer;
first and second cladding layers of first and second conductivity types formed to sandwich the active slayer so as to form a double-heterojunction structure;
first and second electrodes connected to the first and second cladding layers;
a current blocking layer formed between the second electrode and the second cladding layer and having a striped opening portion for constricting a current for the double-heterojunction structure; and
a current injection layer formed between the second electrode and the current blocking layer and in the opening portion and having an area larger than that of the opening portion,
wherein each of the first and second cladding layers, the current blocking layer, the current injection layer consists essentially of a material represented by the following composition formula:

$$In_xGa_yAl_zN$$

where $x+y+z=1$, and $0 \leq x, y, z \leq 1$,
the method comprising the steps of:
forming a multilayer film having the double-heterojunction structure on a support substrate;
forming the current blocking layer on the multilayer film;
forming the striped opening portion by partly etching the current blocking layer; and
forming the current injection layer in the opening portion and on the current blocking layer after dipping the support substrate, the multilayer film, and the current blocking layer in a solution of $HNO_3:HCl=3:1$ heated to not less than 100° C.

According to a tenth aspect of the present invention, there is provided a method of manufacturing a gallium nitride-based compound semiconductor laser, the semiconductor laser including:
an active layer;
first and second cladding layers of first and second conductivity types formed to sandwich the active layer so as to form a double-heterojunction structure;
first and second electrodes connected to the first and second cladding layers;

a current blocking layer formed between the second electrode and the second cladding layer and having a striped opening portion for constricting a current for the double-heterojunction structure; and a current injection layer formed between the second electrode and the current blocking layer and in the opening portion and having an area larger than that of the opening portion, wherein each of the first and second cladding layers, the current blocking layer, the current injection layer consists essentially of a material represented by the following composition formula:

where $x+y+z=1$, and $0 \leq x, y, z \leq 1$, the method comprising the steps of:
forming a multilayer film having the double-heterojunction structure on a support substrate;
forming the current injection layer on the multilayer film; and
forming the current blocking layer having the striped opening portion by introducing an impurity into a portion of a selected layer formed of at least one of the cladding layer and the current injection layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a sectional view showing the device structure of a gallium nitride-based compound semiconductor laser according to an embodiment of the present invention;

FIGS. 13 to 19 are sectional views showing the device structures of gallium nitride-based compound semiconductor lasers according to other embodiments of the present invention;

FIG. 20 is a sectional view showing the device structure of a gallium nitride-based compound semiconductor laser according to still another embodiment of the present invention;

FIGS. 30A to 30C are sectional views showing a method of manufacturing the semiconductor laser in FIG. 29;

FIGS. 38 to 42 are sectional views showing the device structures of gallium nitride-based compound semiconductor lasers according to other embodiments of the present invention;

DETAILED DESCRIPTION OF THE INVENTION

Figure 2A:
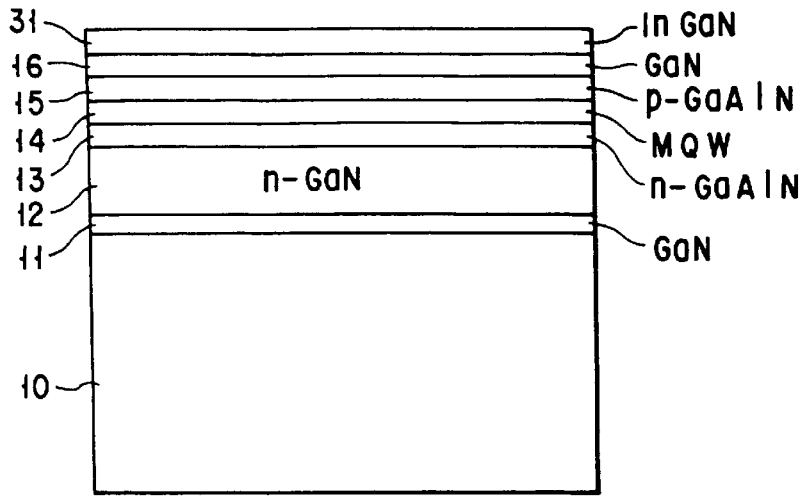
FIGS. 2A to 2C are sectional views showing the first half of a manufacturing process in a method of manufacturing the semiconductor laser in FIG. 1.

FIG. 1 is a sectional view showing the structure of a gallium nitride-based compound semiconductor laser according to an embodiment of the present invention. The same reference numerals denote parts having substantially the same functions and arrangements in the following description, and a repetitive description thereof will be made as needed.

A GaN buffer layer 11, a GaN buffer layer 11, an Si-doped n-GaN contact layer 12, an Si-doped n-GaAlN cladding layer 13, an MQW active layer 14, an Mg-doped p-GaAlN cladding layer 15, and an undoped GaN current blocking layer 16 are stacked on a sapphire substrate 10. The GaN current blocking layer 16 is etched in the form of a stripe. The MQW active layer 14 has a multiple quantum well (MQW) structure having a cyclic structure formed by cyclically stacking two types of InGaAlN layers which are different in band gap energy and 10 nm or less thick.

An Mg-doped p-GaN buried layer 17 and an Mg-doped p$^+$-GaN contact layer 18 are stacked on a portion, of the p-GaAlN cladding layer 15, which is exposed upon etching of the GaN current blocking layer 16, and the GaN current blocking layer 16. An n-side electrode 21 is formed on a portion, of the n-GaN contact layer 12, which is exposed when the above layers, from the contact layer 18 to an upper portion of the contact layer 12, are partly etched. A p-side electrode 22 is formed on the upper surface of the contact layer 18.

As described above, in this embodiment, the cyclic structure formed by cyclically stacking the two types of InGaAlN layers which are different in band energy and 10 nm or less thickness is used as the MQW active layer 14, and regrowth for the formation of a current constriction structure is performed on the MQW active layer 14. For this reason, crystal defects assumed to occur on a regrowth interface and a regrown layer decrease, and a flat regrowth surface can be obtained, thereby obtaining an device which has a low contact resistance at the p-side electrode 22 and operates at a low operating voltage.

In addition, since crystal defects can be reduced by using the cyclic structure, carriers can be efficiently injected into the MQW active layer 14. Furthermore, since the respective layers required for the device portion are not directly formed on the sapphire substrate 10 but are formed through the buffer layer 11, the crystal quality of each layer of the device portion can be improved. This contributes to an improvement in carrier injection efficiency and a decrease in contact resistance.

A method of manufacturing the gallium nitride-based compound semiconductor laser in FIG. 1 will be described next.

First of all, as shown in FIG. 2A, the buffer layer 11 formed from GaN, AlN, AlGaN, or the like is grown to a thickness to about 10 nm to 200 nm on the sapphire substrate 10 by metal organic chemical vapor deposition (MOCVD). The Si-doped n-GaN contact layer 12 is then grown to a thickness of 4 μm on the resultant structure by MOCVD. The Si-doped n-Ga$_{0.8}$Al$_{0.2}$N cladding layer 13 is grown to a thickness of 250 nm by MOCVD. Although no description will be made on a growth method, all layers are grown by MOCVD.

Subsequently, the MQW active layer 14 is formed by stacking a 200-nm thick undoped GaN light guide layer, a multiple quantum well (MQW) structure obtained by cyclically stacking 50 pairs of two types of InGaAlN layers, i.e., 1.5-nm thick undoped In$_{0.25}$Ga$_{0.75}$N layers and 3-nm thick undoped In$_{0.05}$Ga$_{0.95}$N layers, and a 200-nm thick undoped GaN light guide layer.

The p-Ga$_{0.8}$Al$_{0.2}$N cladding layer 15 is grown on the MQW active layer 14. An undoped GaN layer is then grown to a thickness of 0.6 μm as the current blocking layer 16. In addition, an undoped In$_{0.15}$Ga$_{0.85}$N layer is grown to a thickness of 0.2 μm as a surface protective layer 31. In this case, the surface protective layer 31 is grown in an atmosphere mainly containing nitrogen and ammonia gases at 900° C. or lower.

Figure 2B:
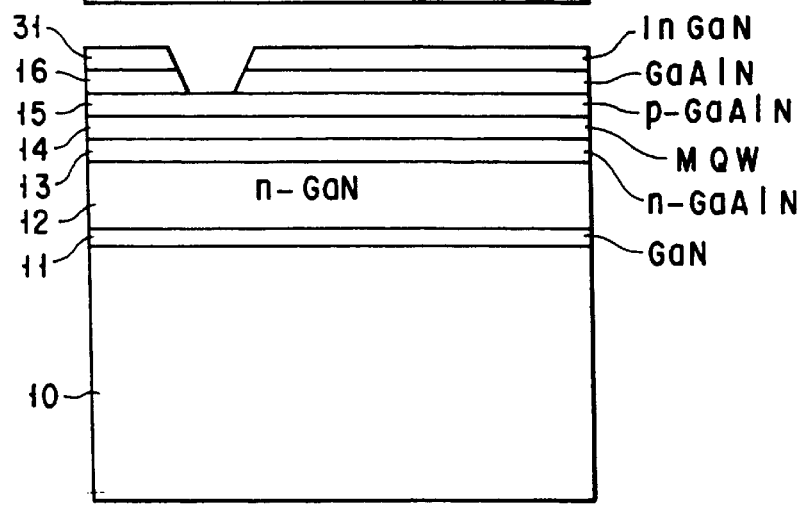

The wafer is unloaded from a growth apparatus. As shown in FIG. 2B, the surface protective layer 31 and the current blocking layer 16 are partly etched in the form of a 5-μm wide stripe by reactive ion etching (RIE) to form an opening portion, thereby exposing the cladding layer 15.

Figure 2C:
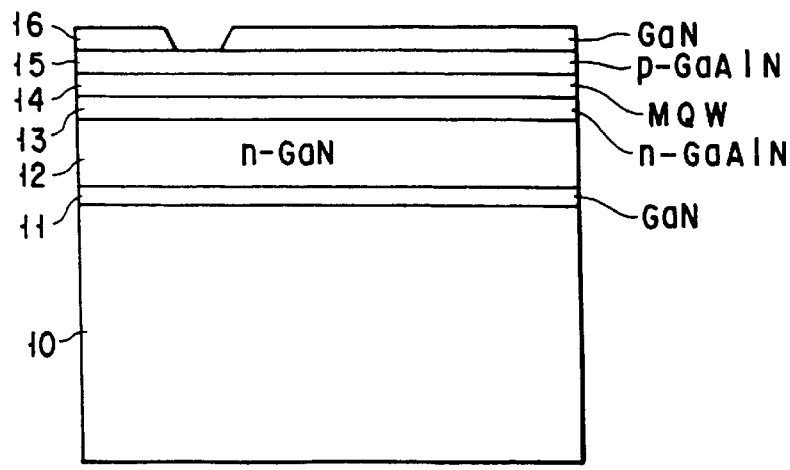

The wafer is loaded into the growth apparatus again to be exposed to an atmosphere mainly containing hydrogen gas in addition to nitrogen and ammonia gases at a temperature higher than 900° C. As a result, as shown in FIG. 2C, the surface protective layer 31 is evaporated to form a clean current blocking layer surface.

Figure 3A:
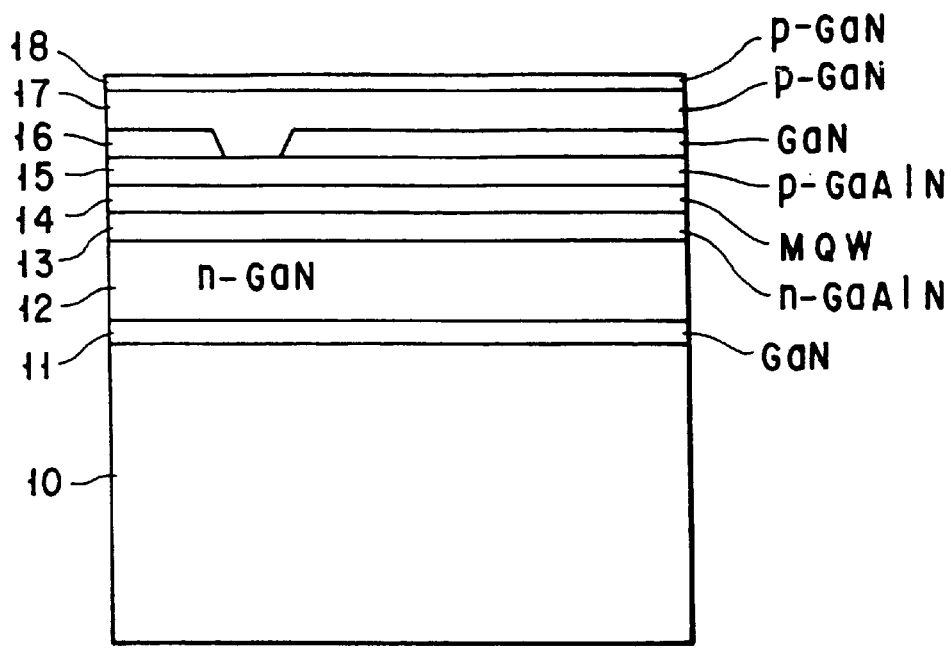
FIGS. 3A and 3B are sectional views showing the second half of the process in the method of manufacturing the semiconductor laser in FIG. 1.

As shown in FIG. 3A, the 0.8-μm thick Mg-doped p-GaN buried layer 17 and the 0.2-μm thick p$^+$-GaN contact layer 18 doped with Mg at a concentration higher than the Mg concentration of the buried layer 17 are sequentially grown on the current blocking layer 16 and the exposed portion of the cladding layer 15.

Figure 3B:
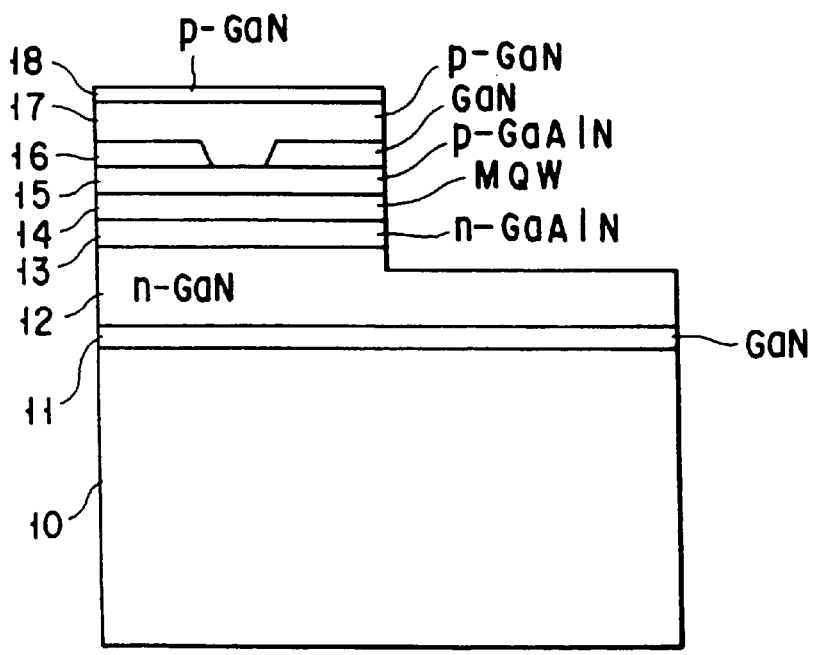

The wafer is unloaded from the growth apparatus. As shown in FIG. 3B, a portion, of the contact layer 12, on which the n-side electrode 21 is to be formed is exposed by partly etching the above layers, from the contact layer 18 to an upper portion of the contact layer 12.

The n-side electrode 21 formed from Ti—Au is formed on the contact layer 12. The p-side electrode 22 formed form Pd—Au is formed on the contact layer 18 to cover the portion immediately above the striped opening portion of the current blocking layer 16 so as to be larger in area than the opening portion. With this process, the structure shown in FIG. 1 is obtained. Note that the p-side electrode 22 may be formed from Pt—Au, Ni—Au, or the like.

Figure 4:
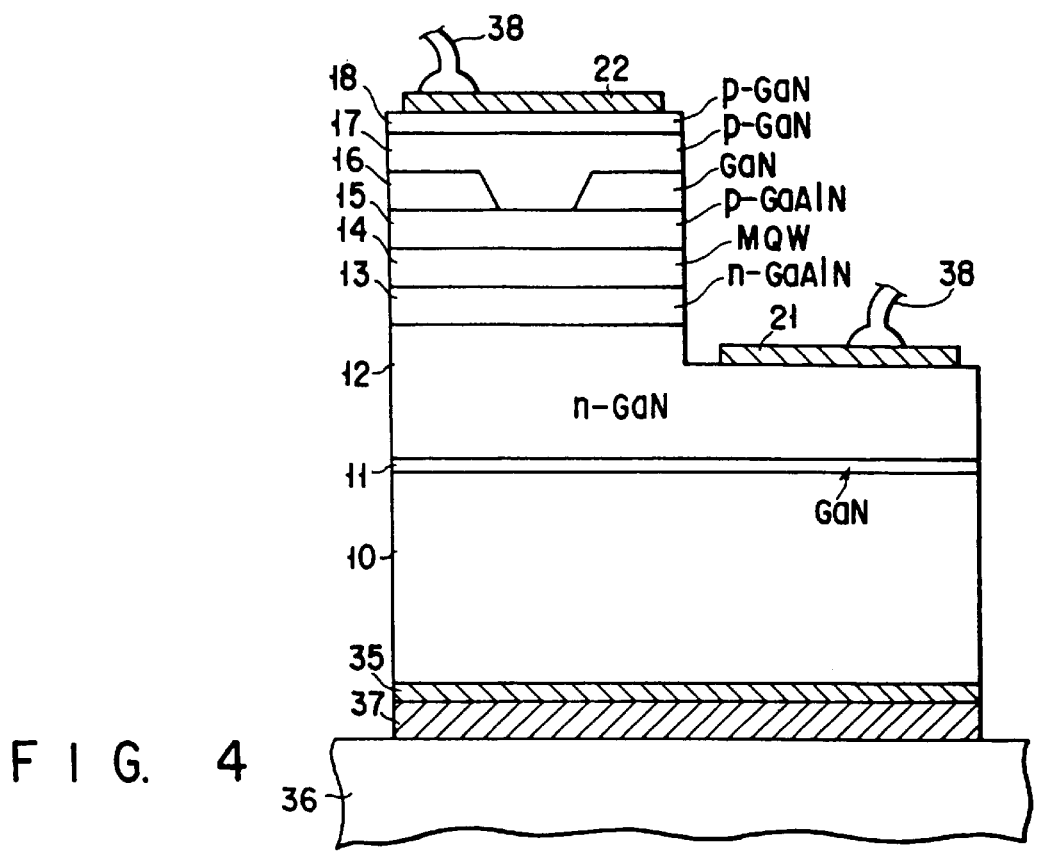
FIG. 4 is a sectional view showing the mounted state of the semiconductor laser in FIG. 1.

Subsequently, as shown in FIG. 4, the lower surface of the sapphire substrate 10 is polished to a thickness of 80 μm or less, and a film formed from Ti—Au, Cr—Au, or the like is formed as a lower surface metal film 35. The lower surface of the resultant structure is scribed into a laser end face, and the structure is formed into a chip. This chip is then mounted on a heat sink 36 formed from diamond, copper, or the like by using a fused metal 37 such as Au—Sn, Pd—Sn, In, or the like. Thereafter, wires 38 are bonded to the n-side electrode 21 and the p-side electrode 22. With this process, a laser device is obtained.

It was confirmed that the semiconductor laser obtained in the above manner continuously oscillated at a wavelength of 420 nm at room temperature, the highest temperature during the continuous operation was 80° C., and the laser continuously operated for 100 hours or more under conditions of 50° C. and 3 mW. In the above embodiment, laser oscillation could be performed without the undoped $In_{0.15}Ga_{0.85}N$ layer. In this case, however, the highest oscillation temperature was as low as 50° C. This difference in oscillation temperature is made because the use of the surface protective layer 31 facilitates regrowth and can improve the crystal quality of a regrown layer.

In the manufacturing method of this embodiment, the contact layer 12, the cladding layer 13, the MQW active layer 14, the cladding layer 15, the current blocking layer 16, and the surface protective layer 31 are formed first on the sapphire substrate 10, and the cladding layer 15 is then exposed by partly removing the surface protective layer 31 and the current blocking layer 16 by RIE or the like. Thereafter, the resultant structure is exposed to a gas flow atmosphere containing a mixture of ammonia, hydrogen, and nitrogen gases for 15 minutes with the substrate temperature being kept at 1,100° C. to evaporate the surface protective layer 31 immediately before the buried layer 17 is formed by MOCVD. As a result, the GaN current blocking layer 16 has a clean surface. With this process, the occurrence of defects at the interface between the current blocking layer 16 and the buried layer 17 is suppressed, and the upper surface of the contact layer 18 to be subsequently stacked on the resultant structure is readily planarized. Therefore, a good contact can be formed between the contact layer 18 and the p-side electrode 22 formed on the upper surface of the contact layer 18, thereby obtaining an device with a low operating voltage.

Such effects can be easily enhanced by forming the surface portion of the current blocking layer from InGaAlN having a high Al composition ratio and exhibiting high resistance to re-evaporation, and forming the surface protective layer from InGaAlN having a lower Al composition ratio or InGaN and exhibiting a tendency to re-evaporation.

Figure 5:
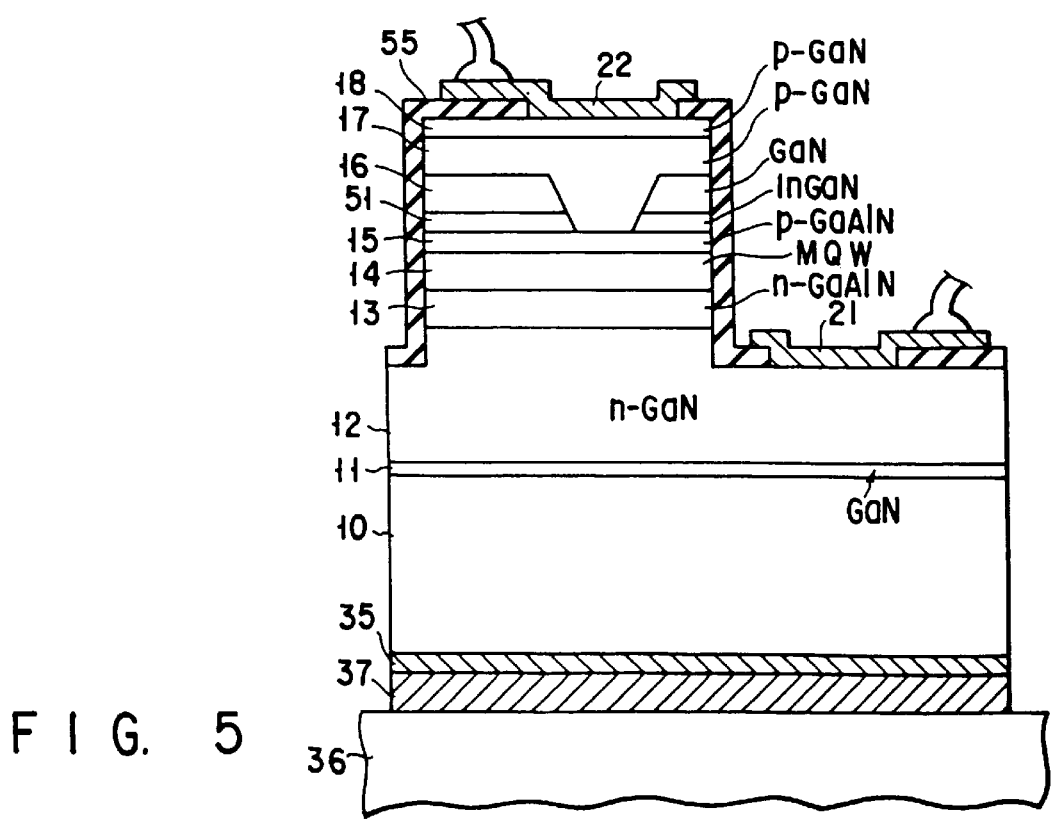
FIG. 5 is a sectional view showing the device structure of a gallium nitride-based compound semiconductor laser according to another embodiment of the present invention.
Figure 6A:
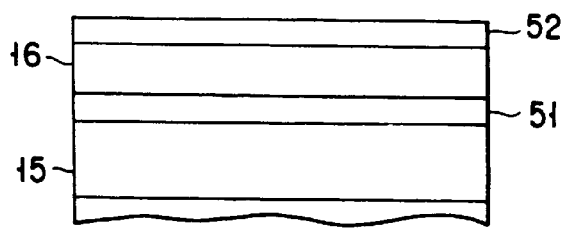
FIGS. 6A to 6C are sectional views showing a method of manufacturing the semiconductor laser in FIG. 5.
Figure 6B:
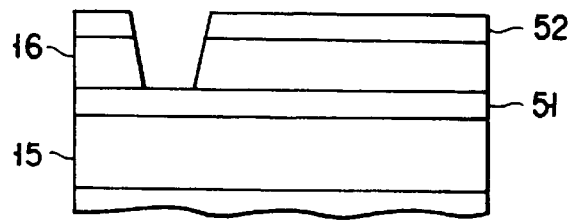
Figure 6C:
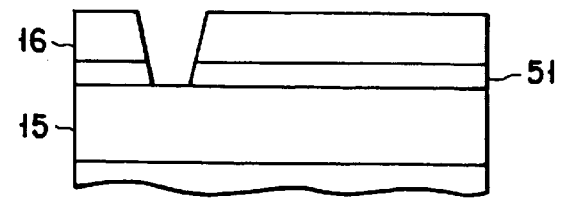

FIG. 5 is a sectional view showing the device structure of a gallium nitride-based compound semiconductor layer according to another embodiment of the present invention. FIGS. 6A to 6C are sectional views showing the process of manufacturing this device.

This embodiment differs from the embodiment shown FIG. 1 in the structure of a current constriction portion and the method of forming it. In addition, a passivation film is additionally formed.

As in the embodiment shown in FIG. 1, in the embodiment shown in FIG. 5, a buffer layer 11, an n-contact layer 12, an n-cladding layer 13, an MQW active layer 14, and a p-cladding layer 15 are formed on a sapphire substrate 10. Thereafter, as shown in FIG. 6A, an undoped $In_{0.15}Ga_{0.85}N$ layer is grown to a thickness of 0.2 μm as a first surface protective layer 51 on the cladding layer 15. An undoped GaN layer is grown to a thickness of 0.6 μm as a current blocking layer 16 on the cladding layer 15. In addition, an undoped $In_{0.15}Ga_{0.85}N$ layer is grown to a thickness of 0.2 μm as a second surface protective layer 52 on the current blocking layer 16. In this case, the first and second surface protective layers 51 and 52 are grown in an atmosphere mainly containing nitrogen and ammonia gases at 900° C. or lower.

Subsequently, the wafer is unloaded from the growth apparatus. As shown in FIG. 6B, the second surface protective layer 52 and the current blocking layer 16 are partly etched in the form of a 5-μm wide stripe to form an opening portion, thereby exposing the first surface protective layer 51.

The wafer is loaded into the growth apparatus again to be exposed to an atmosphere mainly containing hydrogen gas in addition to nitrogen and ammonia gases at a temperature higher than 900° C. With this process, as shown in FIG. 6C, the portion, of the first surface protective layer 51, which is exposed to the opening portion and the second surface protective layer 52 are evaporated to obtain a clean cladding layer surface and a clean current blocking layer surface.

An Mg-doped p-GaN buried layer 17 and a $p^+$-GaN contact layer 18 are sequentially grown on the current blocking layer 16 and the exposed portion of the cladding layer 15. Thereafter, the wafer is unloaded from the growth apparatus, and a portion, of the contact layer 12, on which an n-side electrode 21 is to be formed is exposed by etching. In this case, if the striped opening portion of the current blocking layer 16 is located nearer to the side on which the n-side electrode 21 is formed than the mesa center, the series resistance to a current flowing in the contact layer 12 in the lateral direction can be reduced. As a result, the operating voltage can be decreased.

Subsequently, a passivation film 55 formed from $SiO_2$ is formed on the resultant structure except for an opening portion in which an electrode contact is to be formed, thereby reducing a leakage current flowing in the mesa side surfaces and the like. The opening portion, of the passivation film 55, which corresponds to a p-side electrode 22 is formed to cover a portion immediately above the striped opening portion of the current constriction structure so as to be larger in area than the opening portion.

The n-side electrode 21 formed from Ti—Au and the p-side electrode 22 formed from Pd—Au are formed. Note that the p-side electrode 22 may be formed from Pt—Au, Ni—Au, or the like. The n-side electrode 21 and the p-side electrode 22 are arranged on the passivation film 55 and coupled to bonding pads, each located on the far side of the electrode contact portion with respect to the mesa side surface of the striped opening portion of the current blocking layer 16. With this structure, the emission portion can be made more resistant to damage caused by wire bonding.

In addition, similar to the embodiment shown in FIG. 1, the lower surface of the sapphire substrate 10 is polished, and a lower surface metal film 35 is formed to form a laser end face, and to form the overall structure into a chip. The sapphire substrate 10 is then mounted on a heat sink 36 by using a fused metal 37, and wires are bonded to the n-side electrode 21 and the p-side electrode 22, thereby obtaining a laser device.

It was confirmed that the laser device obtained in the above manner continuously oscillated at a wavelength of 420 nm at room temperature, the highest temperature in the continuous operation was 90° C., and the device operated for 1,000 hours or more under the conditions of 50° C. and 3 mW.

Figure 7:
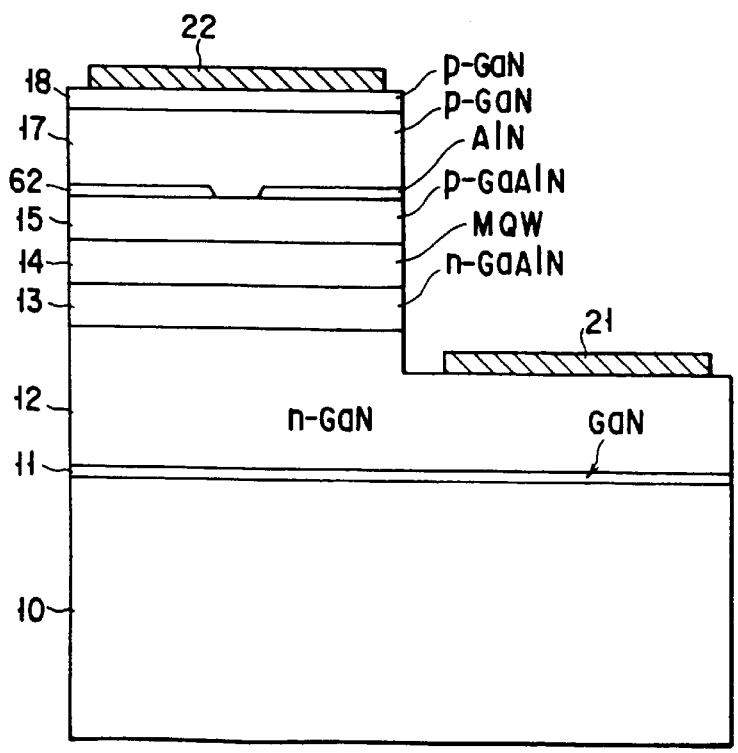
FIGS. 7 to 9 are sectional views showing the device structures of gallium nitride-based compound semiconductor lasers according to other embodiments of the present invention.

FIG. 7 is a sectional view showing the device structure of a gallium nitride-based compound semiconductor laser according to still another embodiment of the present invention.

The embodiment shown in FIG. 7 differs from the embodiment shown in FIG. 1 in that a current blocking layer is formed from AlN.

As in the embodiment shown in FIG. 1, in the embodiment shown in FIG. 7, a buffer layer 11, an n-contact layer 12, an n-cladding layer 13, a MQW active layer 14, and a p-cladding layer 15 are formed on a sapphire substrate 10. Thereafter, an undoped AlN layer is grown to a thickness of 30 nm as a current blocking layer 62 on the cladding layer 15. In addition, an undoped GaN layer is grown to a thickness of 0.1 μm as a surface protective layer (not shown). In this case, the surface protective layer is grown in an atmosphere mainly containing nitrogen and ammonia gases.

Subsequently, the wafer is unloaded from the growth apparatus, and the surface protective layer and the current blocking layer 62 are partly etched in the form of a 5-μm wide stripe to form an opening portion, thereby exposing the cladding layer 15. The wafer is loaded into the growth apparatus again and exposed to an atmosphere containing more hydrogen gas or less ammonia gas than the atmosphere for the formation of the surface protective layer at a temperature higher than at least the temperature at which the surface protective layer was formed. With this process, the surface protective layer is evaporated to form a clean current blocking layer surface. In this case, since an InGaAlN layer having a high Al composition ratio such as an AlN layer is highly resistance to re-evaporation, and need not be thick to block current injection, the regrowth interface need not have an excessive step height. A high-quality regrowth crystal can therefore be easily obtained.

Subsequently, an Mg-doped p-GaN buried layer 17 and a p$^+$-GaN contact layer 18 are stacked on the current blocking layer 62 and the exposed portion of the cladding layer 15, as in the embodiment shown in FIG. 1.

When the wafer obtained in this manner was formed into a laser device, and its characteristics were evaluated as in the embodiment shown in FIG. 1, it was confirmed that the device continuously oscillated at a wavelength of 420 nm at room temperature, the highest temperature in the continuous operation was 90° C., and the device continuously operated for 1,000 hours or more under the conditions of 50° C. and 3 mW.

In the embodiment shown in FIG. 7, no surface protective layer is formed between the cladding layer 15 and the current blocking layer 62. Apparently, however, a surface protective layer formed from, e.g., p-GaN may be formed.

Figure 8:
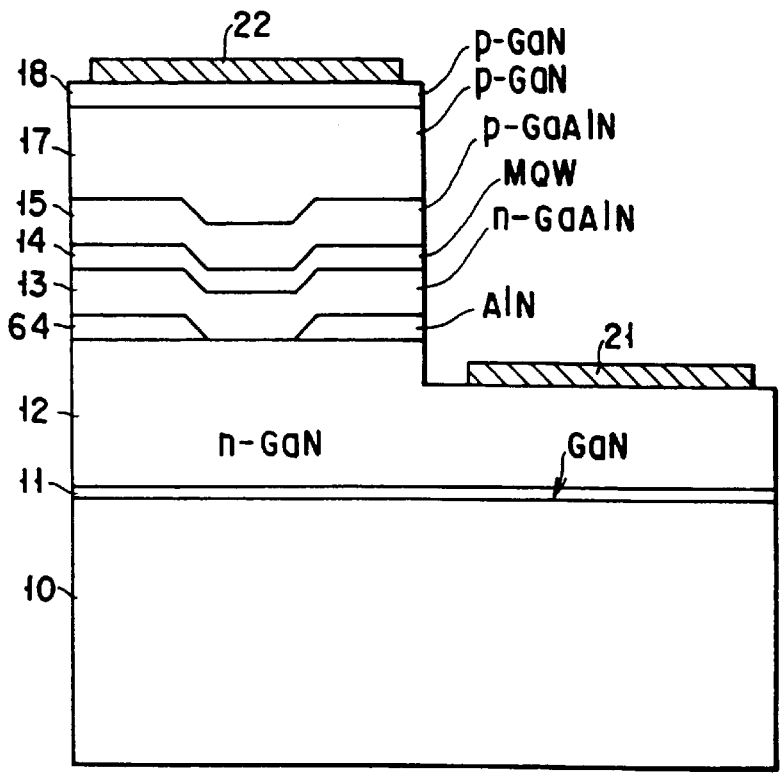

FIG. 8 is a sectional view showing the device structure of a gallium nitride-based compound semiconductor laser. according to still another embodiment of the present invention.

The embodiment shown in FIG. 8 differs from the embodiment shown in FIG. 1 in that a current blocking layer is formed on the substrate side.

As in the embodiment shown in FIG. 1, in the embodiment shown in FIG. 8, a buffer layer 11 and an n-contact layer 12 are formed on a sapphire substrate 10 by MOCVD. Thereafter, an undoped or Mg-doped AlN layer is grown to a thickness of 30 nm as a current blocking layer 64 on the contact layer 12. In addition, an undoped GaN layer is grown to a thickness of 0.1 μm as a surface protective layer (not shown). In this case, the surface protective layer is grown in an atmosphere mainly containing nitrogen, hydrogen, and ammonia gases.

Subsequently, the wafer is unloaded from the growth apparatus, and the surface protective layer and the current blocking layer 64 are partly etched in the form of a 5-μm wide stripe to form an opening portion, thereby exposing the contact layer 12.

The wafer is loaded into the growth apparatus again and exposed to an atmosphere containing more hydrogen gas or less ammonia gas than the atmosphere for the formation of the surface protective layer at a temperature higher than at least the temperature at which the surface protective layer was formed. With this process, the surface protective layer is evaporated to obtain a clean current blocking layer surface. The current blocking layer may be formed from a material other than AlN as long as it has the property of easily blocking current injection. For example, InGaAlN having a high Al composition ratio may be used.

Subsequently, the Si-doped n-Ga$_{0.8}$Al$_{0.2}$N cladding layer 13 having a thickness of 250 nm is formed on the current blocking layer 64 and the exposed portion of the contact layer 12. An MQW active layer 14 having a multiple quantum well structure constituted by a cyclic structure like the one in the embodiment shown in FIG. 1 is formed. An Mg-doped p-Ga$_{0.8}$Al$_{0.2}$N cladding layer 15 is formed on the MQW active layer 14. A 0.8-μm thick Mg-doped p-GaN buried layer 17 is formed on the cladding layer 15. A 0.2-μm thick p$^+$-GaN contact layer 18 doped with Mg at a concentration higher than the Mg concentration of the buried layer 17 is formed thereon.

When the wafer obtained in this manner was formed into a laser device, and its characteristics were evaluated as in the embodiment shown in FIG. 1, it was confirmed that the device continuously oscillated at a wavelength of 420 nm at room temperature, the highest temperature in the continuous operation was 90° C., and the device continuously operated for 1,000 hours or more under the conditions of 50° C. and 3 mW. Owing to the light guide effect in the lateral direction which was assumed to be produced by the bent active layer structure, the astigmatic difference became 10 μm or less. This characteristic was effective in focusing a laser beam to a small spot.

Figure 9:
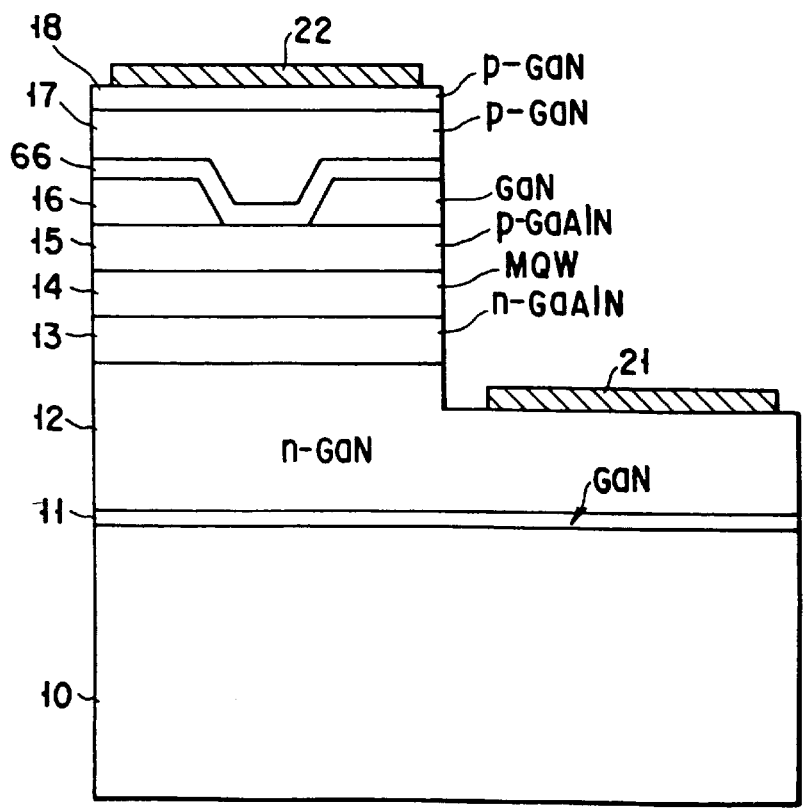

FIG. 9 is a sectional view showing the device structure of a gallium nitride-based compound semiconductor laser according to still another embodiment of the present invention.

In addition to the arrangement of the embodiment shown in FIG. 1, the embodiment shown in FIG. 9 has a cyclic structure formed on the opposite side to a substrate having a double-heterojunction structure.

In addition to the arrangement shown in FIG. 1, a cyclic structure portion 66 obtained by cyclically stacking two types of gallium nitride-based compound semiconductor layers, each having a thickness of 10 nm or less, is formed between a current blocking layer 16, a p-cladding layer 15 exposed to the opening portion of the current blocking layer 16, and a p-buried layer 17.

More specifically, the cyclic structure portion 66 is constituted by 50 pairs of GaN layers (on the cladding side) and In$_{0.2}$Ga$_{0.8}$N layers (on the contact side), each formed from an Mg-doped p-type crystal and having a thickness of 2.5 nm, or 50 pairs of GaN layers (on the cladding side) and Ga$_{0.8}$Al$_{0.2}$N layers (on the contact side), each formed from an Mg-doped p-type crystal and having a thickness of 2.5 nm.

With this structure, in addition to the effect of reducing crystal defects, which is obtained by an MQW active layer 14 as in the embodiment shown in FIG. 1, crystal defects can be reduced by the cyclic structure portion 66. Since the cyclic structure portion 66 is located above the current blocking layer 16, in particular, defects caused by etching of the current blocking layer 16 can also be reduced, contributing to a reduction in contact resistance.

In each of the embodiments described with reference to FIGS. 1 to 9, the cyclic structure portion serves as the MQW in the active layer. However, it suffices if a cyclic structure is formed at at least any portion between the electrode contact portion and the active layer as long as the formation of the cyclic structure planarizes the contact layer surface and realizes a structure that attains a decrease in operating voltage and an improvement in reliability. Although the details of the MQW structure may change depending on oscillation wavelengths, operating currents, noise characteristics, and the like, it suffices if they satisfy conditions for enhancing the effect of planarizing the contact layer surface.

In addition, each embodiment, the undoped high-resistance layer is formed as the current blocking layer. However, the present invention is not limited to this, and various modifications can be made. For example, an n-current blocking layer doped with Sn, Se, Te, Ge, S, or the like may be formed, and current constriction may be performed by using a reverse junction. In addition, a current blocking layer may be doped with Zn, P, or O to have a high energy level, or may be doped with Mg to form a barrier using a hetero-interface so as to perform current constriction.

According to each of the embodiments described with reference to FIGS. 1 to 9, the influences of defects caused during crystal growth can be eliminated to improve the crystallinity by forming a cyclic structure portion at at least any portion between the electrode contact portion and the active layer. More specifically, the defects caused during crystal growth are buried when the cyclic structure portion is formed. As a result, the crystal quality can be improved. For this reason, the efficiency of injection of carriers into the active layer can be improved, and voltage drops at the electrode contacts and the like, thereby attaining a decrease in threshold and an improvement in reliability.

In each manufacturing method described above, a surface protective layer is formed in advance on an underlying film (e.g., a current blocking layer) for regrowth, and the surface protective layer is left in a vapor phase at a high temperature to be re-evaporated after a desired etching process is performed for the underlying film. As a result, a clean underlying film surface can be obtained. In addition, the next layer can be continuously formed without exposing the clean surface to the outer atmosphere. This process therefore facilitates subsequent regrowth, and improves the crystal quality of the regrown layer, thereby contributing to an improvement in the characteristics of various semiconductor devices, including semiconductor lasers, which use gallium nitride-based compound semiconductors.

Figure 10:
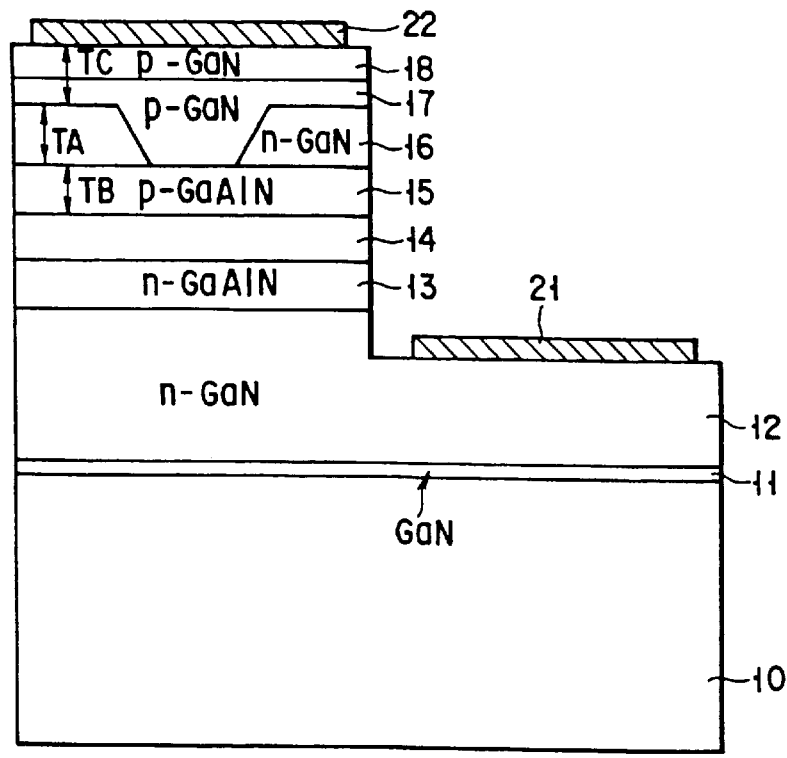
FIG. 10 is a sectional view showing the device structure of a gallium nitride-based compound semiconductor laser according to still another embodiment of the present invention.

FIG. 10 is a sectional view showing the device structure of a gallium nitride-based compound semiconductor laser according to still another embodiment of the present invention.

In the embodiment shown in FIG. 10, a GaN buffer layer 11, an Si-doped n-GaN contact layer 12, an Si-doped n-GaAlN cladding layer 13, an active layer 14 having a multiple quantum well (MQW) structure and the like, an Mg-doped p-GaAlN cladding layer 15, and an Si-doped GaN current blocking layer 16 are stacked on a sapphire substrate 10. The current blocking layer 16 is etched in the form of a stripe.

An Mg-doped p-GaN buried layer 17 and a $p^+$-GaN upper current injection layer (p-contact layer) 18 doped with Mg at a high concentration are stacked on a portion, of the cladding layer 15, which is exposed upon etching of the current blocking layer 16 and the current blocking layer 16. An n-side electrode 21 is formed on a portion, of the contact layer 12, which is exposed when the above layers, from the contact layer 18 to an upper portion of the contact layer 12, are partly etched. A p-side electrode 22 is formed on the upper surface of the contact layer 18.

A method of manufacturing the gallium nitride-based compound semiconductor laser in FIG. 10 and its structure will be described in detail next.

First of all, the buffer layer 11 formed from GaN, AlN, GaAlN, or the like is grown to a thickness of about 10 nm to 200 nm on the sapphire substrate 10 by metal organic chemical vapor deposition (MOCVD). The Si-doped n-GaN contact layer 12 is then grown to a thickness of 4 µm on the resultant structure. The Si-doped n-$Ga_{0.85}Al_{0.15}N$ cladding layer 13 is grown to a thickness of 300 nm on the contact layer 12. Although no description will be made on a growth method, all layers are grown by MOCVD.

Subsequently, the MQW active layer 14 is formed by stacking/growing a 100-nm thick light guide layer, a multiple quantum well (MQW) structure formed by cyclically stacking 10 pairs of two types of InGaAlN layers, i.e., 2-nm thick undoped $In_{0.2}Ga_{0.8}N$ layers and 4-nm thick undoped $In_{0.05}Ga_{0.95}N$ layers, a 40-nm thick Mg-doped p-$Al_{0.2}Ga_{0.8}N$ cap layer, and a 100-nm thick Mg-doped p-GaN light guide layer.

The Mg-doped p-$Ga_{0.85}Al_{0.15}N$ cladding layer 15 having a thickness of 300 nm is formed on the resultant structure. An Si-doped GaN layer is grown to a thickness of 1.5 µm as the current blocking layer 16 on the cladding layer 15.

Subsequently, the wafer is unloaded from the growth apparatus, and the current blocking layer 16 is partly etched in the form of a 3-µm thick stripe by reactive ion etching (RIE) to form an opening portion, thereby exposing the cladding layer 15.

The wafer is loaded into the growth apparatus again to form the 800-nm thick Mg-doped p-GaN lower buried layer 17 and the 200-nm thick $p^+$-GaN upper current injection layer (p-contact layer) 18 doped with Mg at a high concentration are stacked on the current blocking layer 16 and the exposed portion of the cladding layer 15.

The wafer is unloaded from the growth apparatus. The above layers, from the contact layer 18 to an upper portion of the contact layer 12, are partly etched by RIE to expose the portion of the contact layer 12 on which the n-side electrode is to be formed.

The n-side electrode 21 formed from Al—Ti—Au is formed on the contact layer 12. The p-side electrode 22 formed from Pt—Ti—Pt—Au is formed on the contact layer 18 to cover a portion immediately above the striped opening portion of the current blocking layer so as to be larger in area than the opening portion. With this process, the structure shown in FIG. 10 is obtained.

It was confirmed that the laser device obtained in the above manner continuously oscillated at a wavelength of 420 nm at room temperature, the highest temperature in the continuous operation was 100° C., and the device continuously operated for 1,000 hours or more under the conditions of 50° C. and 3 mW.

To obtain such device characteristics, the thicknesses of the layers constituting the device need to be set to satisfy the following inequalities:

$$TB < TA \quad (1)$$

$$TC < TA \quad (2)$$

$$TB < TC \quad (3)$$

where TA is the thickness of the current blocking layer 16, TB is the thickness of the cladding layer 15 (the thickness of the p-layer between the current blocking layer 16 and the MQW active layer 14), and TC is the total thickness of the buried layer 17 and the contact layer 18, i.e., the thickness of the current injection layer (the thickness of the p-layer between the current blocking layer 16 and the electrode 22).

In the embodiment shown in FIG. 10, the thickness of the current blocking layer 16 is set to be greater than the thickness of the cladding layer 15, i.e., the distance between the current blocking layer and the active layer 14; the thickness of the current blocking layer 16 is set to be greater than the thickness of the current injection layer; and the thickness of the current injection layer is set to be greater than the distance between the current blocking layer 16 and the active layer 14. If, however, conditions were set to satisfy at least one of these relationships of thicknesses, a good current constriction effect could be obtained. When a plurality or all of the relationships are satisfied, the effect of realizing the above device characteristics was enhanced.

By satisfying the following inequality:

$$2TB < TA \quad (4)$$

a better current constriction effect was obtained because the mixing of a p-type impurity due to a memory effect (to be described later) could be further suppressed. When, however, the thickness of the current blocking layer 16 became more than 10 times the distance between the current blocking layer 16 and the active layer 14, the opening portion of the current blocking layer 16 was difficult to form with high controllability, resulting in a decrease in yield.

By satisfying the following inequality:

$$1.2TC < TA \quad (5)$$

a better current constriction effect was obtained because the mixing of a p-type impurity due to diffusion could be suppressed. When, however, the thickness of the current blocking layer 16 became more than two times the thickness of the current injection layer, satisfactory crystallinity could not be obtained at a portion, of the opening portion of the current blocking layer 16, on which the current injection layer was formed, and the electrode contact formed on the current injection layer became poor, resulting in an increase in operating voltage.

In addition, conditions are preferably set to satisfy the following inequality:

$$1.7TB < TC < 5TB \quad (6)$$

Where the current injection layer has a thickness larger than this range, relative to the thickness of the p-cladding layer 15, an increase in operating voltage is brought about due to an increase in DC resistance. Where the current injection layer has a thickness smaller than this range, light confinement becomes unsatisfactory.

In the embodiment shown in FIG. 10, the active layer has the MQW. However, this active layer may have a structure formed of a single quantum well (SQW), a thick layer having no quantum effect, or layers having no quantum effect and stacked on each other through layers having large band gaps.

When a p-layer other than a p-cladding layer is inserted between the active layer and the current blocking layer, the thicknesses of the respective layers are set to satisfy the above conditions, regarding the thickness of the p-layer as part of the thickness TB of the cladding layer. 15.

Figure 11:
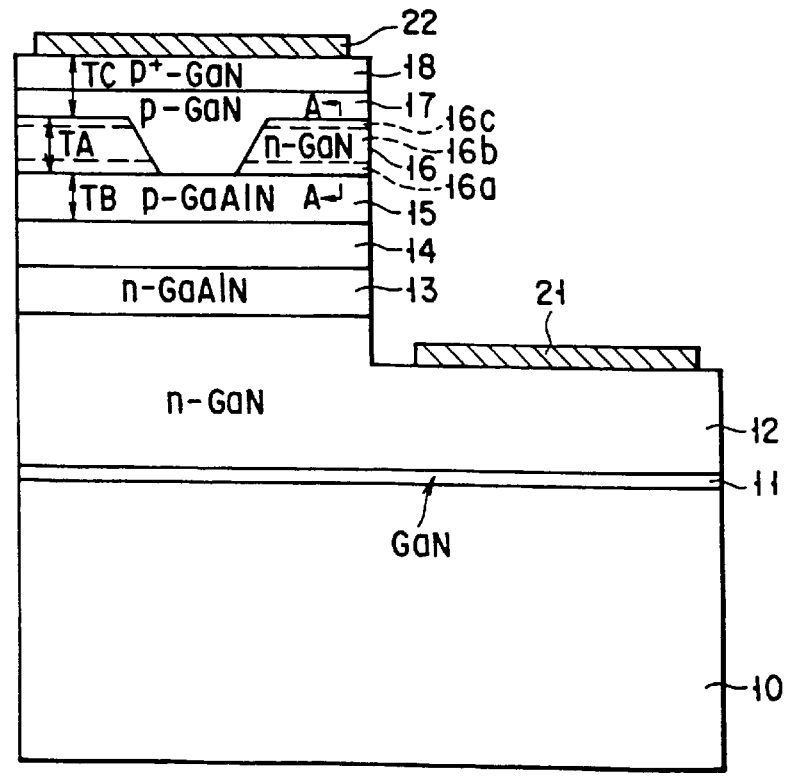
FIG. 11 is a sectional view showing the device structure of a gallium nitride-based compound semiconductor laser according to still another embodiment of the present invention.
Figure 12:
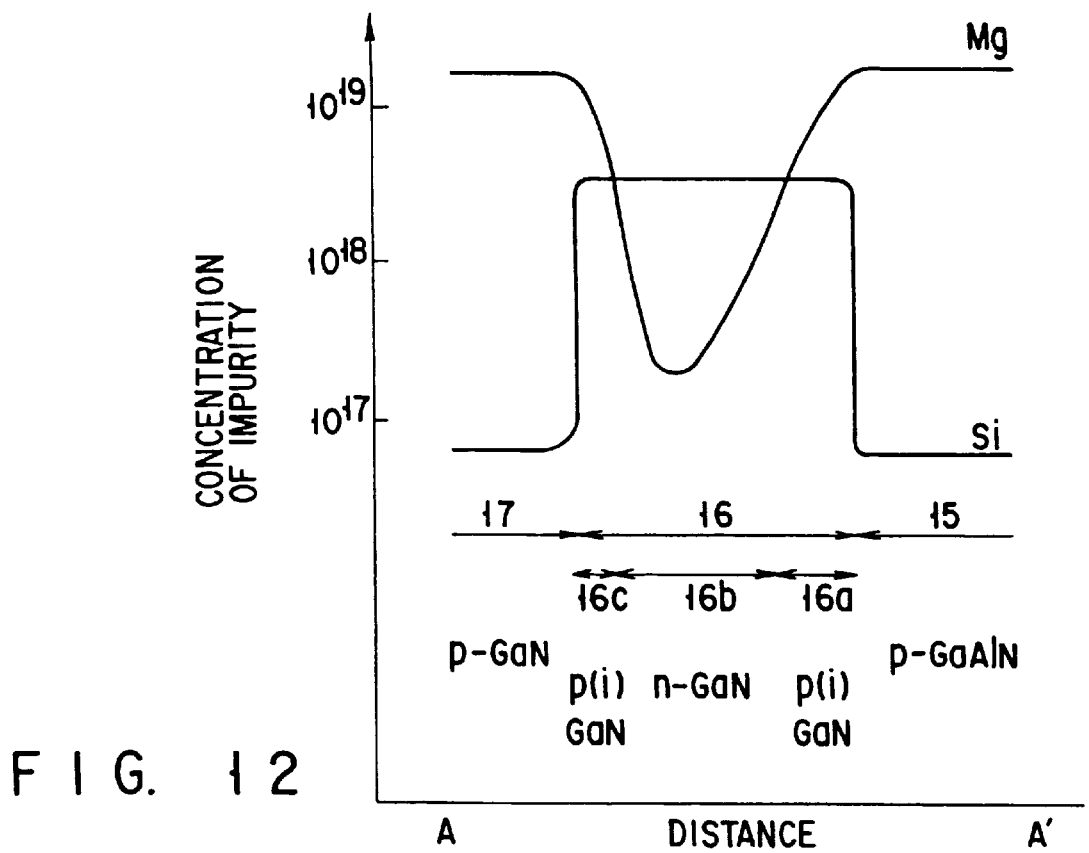
FIG. 12 is a graph showing an impurity concentration profile of a portion near the current blocking layer of the semiconductor laser in FIG. 11.

FIG. 11 is a sectional view showing the device structure of a gallium nitride-based compound semiconductor laser according to still another embodiment of the present invention. FIG. 12 shows the profile of impurity doping near a current constriction portion in the embodiment in FIG. 11.

In the embodiment shown in FIG. 11, a buffer layer 11, an n-contact layer 12, an n-cladding layer 13, an active layer 14, a p-cladding layer 15, and an Si-doped GaN current blocking layer 16 are stacked on a sapphire substrate 10. The current blocking layer 16 is etched in the form of a stripe.

A p-lower current injection layer 17 and a p-upper current injection layer (p-contact layer) 18 are stacked on a portion, of the cladding layer 15, which is exposed upon etching of the current blocking layer 16 and the current blocking layer 16. An n-side electrode 21 is formed on the upper surface of a portion, of the contact layer 12, which is exposed when the above layers, from the contact layer 18 to an upper portion of the contact layer 12, are partly etched. A p-side electrode 22 is formed on the upper surface of the contact layer 18.

A method of manufacturing the gallium nitride-based compound semiconductor laser in FIG. 11 and its structure, especially a portion around the current blocking layer 16, will be described in detail next.

A 300-nm thick p-$Ga_{0.85}Al_{0.15}N$ cladding layer 15 doped with Mg at $3\times10^{19}$ cm$^{-3}$ is formed on the active layer 14. The GaN current blocking layer 16 doped with Si at $3\times10^{18}$ cm$^{-3}$ is grown to a thickness of 1.5 μm on the cladding layer 15. The wafer is then unloaded from the growth apparatus, and the current blocking layer 16 is partly etched in the form of a 3-μm width stripe by reactive ion etching (RIE) to form an opening, thereby exposing the cladding layer 15. The wafer is loaded into the growth apparatus again to stack the 800-nm thick p-GaN lower current injection layer 17 doped with Mg at $3\times10^{19}$ cm$^{-3}$ and the 200-nm thick p$^+$-GaN upper current injection layer (p-contact layer) 18 doped with Mg at $8\times10^{19}$ cm$^{-3}$ on the current blocking layer 16 and the exposed portion of the cladding layer 15. With the same electrode forming process as that in the embodiment shown in FIG. 10, the structure shown in FIG. 11 is obtained.

As shown in FIG. 11, in the current blocking layer 16, a p-type or high-resistance i-type region 16a, an n-type region 16b, an a p-type or high-resistance I-type region 16c are formed. The p-type or high-resistance i-type region 16a is formed near the interface between the current blocking layer 16 and the cladding layer 15 formed thereunder. The p-type or high-resistance i-type region 16c is formed near the interface between the current blocking layer 16 and the p-lower current injection layer 17. This structure can be formed by implanting Mg as a p-type impurity into the current blocking layer to have a desired profile by using the effects to be described later and the diffusion effect. Note that the typical thicknesses of the regions 16a and 16c are about 600 nm and 200 nm, respectively.

Defects such as pinholes tend to be generated in the interface between the current blocking layer 16 and the p-layer formed thereunder and the interface between the current blocking layer 16 and the p-current injection layer. If these interfaces and the p-n junction surface are formed at substantially the same position, generation-recombination caused by the defects in the p-n junction surface becomes a cause that generates an ineffective current, resulting in a deterioration in current constriction characteristics. In contrast to this, if the p-n junction surface and the interfaces between the crystal layers in the current blocking layer are positively shifted from each other as in the embodiment shown in FIG. 11, the ineffective current generated by the generation-recombination caused by the defects in the p-n junction surface is reduced. With this effect, decreases in threshold and operating voltage and an improvement in reliability can be attained. As indicated by this embodiment, in particular, when a current blocking layer is to be formed near a crystal layer containing Al, defects tend to occur in a portion, of the current blocking layer, which is near the interface. In this case, the effects of the present invention are noticeable.

It was confirmed that the laser device obtained in the above manner continuously oscillated at a wavelength of 420 nm at room temperature, the highest temperature in the continuous operation was 120° C., and the device continuously operated for 3,000 hours or more under the conditions of 50° C. and 3 mW.

The regions other than the n-type region in the embodiment shown in FIG. 11 are formed near the interfaces between the current blocking layer and the layer formed thereunder and between the current blocking layer and the p-current injection layer, in which defects are easily generated. Even if such a region is formed near only one of the interfaces, some effect can be obtained. The regions other than the n-type region are formed by adding a p-type impurity such as Mg which is used to form a layer other than the current blocking layer. However, such regions may be formed by intentionally adding a p-type impurity in the process of forming the current blocking layer.

Figure 13:
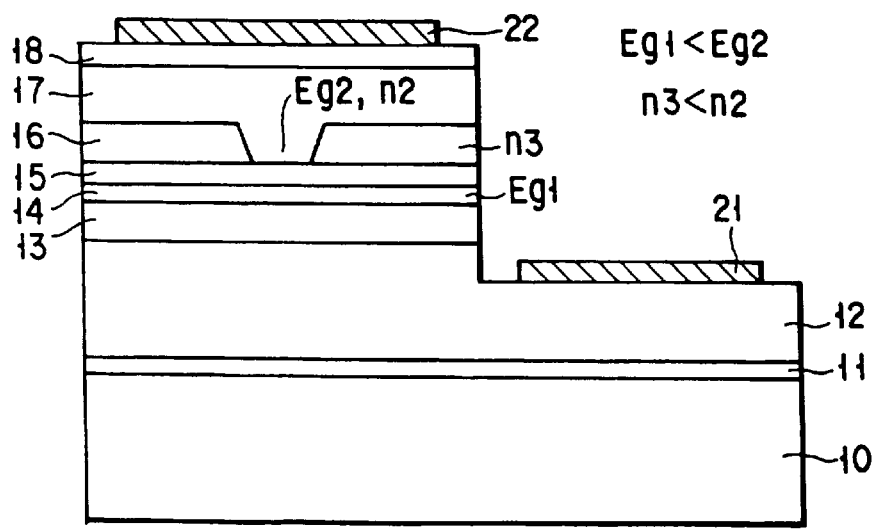

FIG. 13 is a sectional view showing the device structure of a gallium nitride-based compound semiconductor laser according to still another embodiment of the present invention.

In the embodiment shown in FIG. 13, a buffer layer 11, an n-contact layer 12, an n-cladding layer 13, an active layer 14, a p-cladding layer 15, and an Si-doped GaN current blocking layer 16 are stacked on a sapphire substrate 10. The current blocking layer 16 is etched in the form of a stripe.

A p-lower current injection layer (second p-cladding layer) 17 and a p-upper current injection layer (p-contact layer) 18 are stacked on a portion, of the cladding layer 15, which is exposed upon etching of the current blocking layer 16 and the current blocking layer 16. An n-side electrode 21 is formed on the upper surface of a portion, of the contact layer 12, which is exposed when the above layers, from the contact layer 18 to an upper portion of the contact layer 12, are partly etched. A p-side electrode 22 is formed on the upper surface of the contact layer 18.

A method of manufacturing the gallium nitride-based compound semiconductor laser in FIG. 13 and its structure, especially a portion around the current blocking layer 16, will be described in detail next.

The active layer 14 is formed by stacking/growing a 100-nm thick undoped GaN light guide layer, a multiple quantum well (MQW) structure formed by cyclically stacking 10 pairs of two types of InGaAlN layers, i.e., 2-nm thick undoped $In_{0.2}Ga_{0.8}N$ layers and 4-nm thick undoped $In_{0.05}Ga_{0.95}N$ layers, a 40-nm thick Mg-doped p-$Al_{0.2}Ga_{0.8}N$ cap layer, and a 100-nm thick Mg-doped p-GaN light guide layer. The first p-$Ga_{0.85}Al_{0.15}N$ cladding layer 15 doped with Mg and having a thickness of 100 nm is formed on the active layer 14. An Si-doped $Ga_{0.8}Al_{0.2}N$ current blocking layer is grown to a thickness of 300 nm on the cladding layer 15. After the current blocking layer 16 is etched in the form of a 3-$\mu$m wide stripe, the second p-$Ga_{0.85}Al_{0.15}N$ cladding layer 17 doped with Mg and having a thickness of 300 nm is formed. The 200-nm thick $p^+$-GaN upper current injection layer (p-contact layer) 18 doped with Mg at a high concentration is stacked on the buried layer 17. With the same electrode formation process as in the embodiment shown in FIG. 10, the structure shown in FIG. 13 is obtained.

In the structure of the embodiment shown in FIG. 13, the second p-cladding layer 17 corresponding to at least a portion, of the current injection layer, which is near the active layer has a band gap larger than the band gap corresponding to the emission wavelength (420 nm) of the active layer 14. In addition, the refractive index of the second p-cladding layer 17 is higher than that of the current blocking layer 16.

With this structure, an optical waveguide mechanism could be formed, in which the effective refractive index in a direction parallel to the junction was high at the striped opening portion into which a current was to be injected. As a result, the fundamental transverse mode was stabilized, and an increase in threshold current due to light absorption and diffraction losses could be suppressed. In addition, the wave surface of light guided by the waveguide mechanism was made flat, thus realizing a small astigmatic difference indispensable to a laser used for optical disks.

It was confirmed that the laser device obtained in the above manner continuously oscillated at a wavelength of 420 nm at room temperature, the highest temperature in the continuous operation was 120° C., and the device continuously operated for 1,000 hours or more under the conditions of 50° C. and 3 mW. In addition, the astigmatic difference was as low as 3 $\mu$m or less.

In the embodiment shown in FIG. 13, the first p-cladding layer 15 and the second p-cladding layer 17 are formed from the same material to have almost the same refractive index. However, the same effects as in the above embodiment can be obtained as long as at least the portion, of the current injection layer as a characteristic feature of the present invention, which is near the active layer has a band gap larger than the band gap corresponding to the emission wavelength of the active layer, and also has a refractive index higher than that of the current blocking layer.

Figure 14:
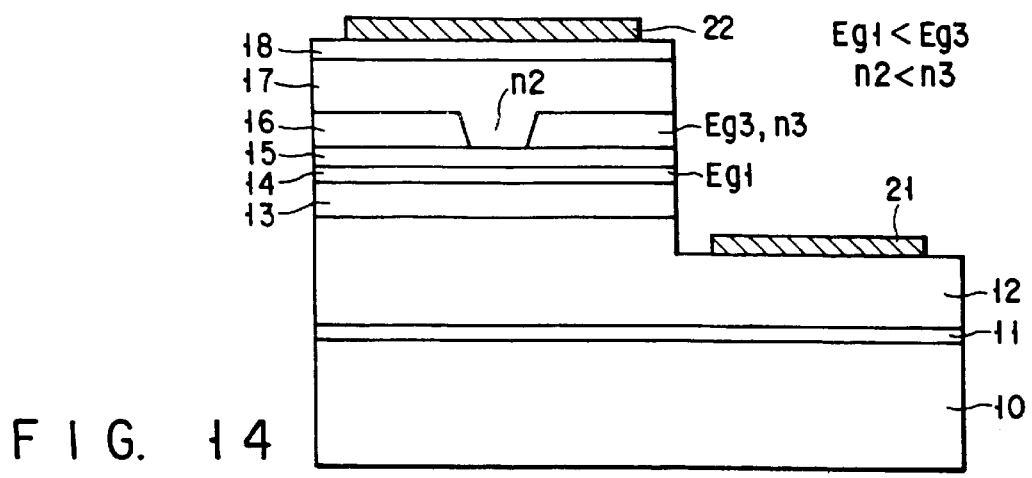

FIG. 14 is a sectional view showing the device structure of a gallium nitride-based compound semiconductor laser according to still another embodiment of the present invention.

In the embodiment shown in FIG. 14, a buffer layer 11, an n-contact layer 12, an n-cladding layer 13, an active layer 14, a p-cladding layer 15, and an Si-doped GaN current blocking layer 16 are stacked on a sapphire substrate 10. The current blocking layer 16 is etched in the form of a stripe.

A p-lower current injection layer (second p-cladding layer) 17 and a p-upper current injection layer (p-contact layer) 18 are stacked on a portion, of the cladding layer 15, which is exposed upon etching of the current blocking layer 16 and the current blocking layer 16. An n-side electrode 21 is formed on the upper surface of a portion, of the contact layer 12, which is exposed when the above layers, from the contact layer 18 to an upper portion of the contact layer 12, are partly etched. A p-side electrode 22 is formed on the upper surface of the contact layer 18.

A method of manufacturing the gallium nitride-based compound semiconductor laser in FIG. 14 and its structure, especially a portion around the current blocking layer 16, will be described in detail next.

The active layer 14 is formed by stacking/growing a 100-nm thick undoped GaN light guide layer, a multiple quantum well (MQW) structure formed by cyclically stacking 10 pairs of two types of InGaAlN layers, i.e., 2-nm thick undoped $In_{0.2}Ga_{0.8}N$ layers and 4-nm thick undoped $In_{0.5}Ga_{0.95}N$ layers, a 40-nm thick Mg-doped p-$Al_{0.2}Ga_{0.8}N$ cap layer, and a 100-nm thick Mg-doped p-GaN light guide layer. The first p-$Ga_{0.85}Al_{0.15}N$ cladding layer 15 doped with Mg and having a thickness of 100 nm is formed on the active layer 14. An Si-doped $Ga_{0.8}Al_{0.2}N$ current blocking layer is grown to a thickness of 300 nm on the cladding layer 15. After the current blocking layer 16 is etched in the form of a 3-$\mu$m wide stripe, the second p-$Ga_{0.9}Al_{0.1}N$ cladding layer 17 doped with Mg and having a thickness of 300 nm is formed. The 200-nm thick p$^+$-GaN upper current injection layer (p-contact layer) 18 doped with Mg at a high concentration is stacked on the buried layer 17. With the same electrode formation process as in the embodiment shown in FIG. 10, the structure shown in FIG. 14 is obtained.

In the structure of the embodiment shown in FIG. 14, the current blocking layer 16 has a band gap larger than the band gap corresponding to the emission wavelength of the active layer 14. In addition, the refractive index of the GaN current blocking layer 16 is higher than that of the second p-cladding layer 17 corresponding to at least a portion, of the current injection layer, which is near the active layer.

With this structure, an optical waveguide mechanism could be formed, in which the effective refractive index in a direction parallel to the junction was low at the striped opening portion into which a current was to be injected. As a result, the fundamental transverse mode was stabilized, and an increase in threshold current due to a light absorption loss could be suppressed. In addition, the wave surface of light guided by the waveguide mechanism was made flat, thus realizing a small astigmatic difference indispensable to a laser used for optical disks.

It was confirmed that the laser device obtained in the above manner continuously oscillated at a wavelength of 420 nm at room temperature, the highest temperature in the continuous operation was 120° C., and the device continuously operated for 1,000 hours or more under the conditions of 50° C. and 3 mW. In addition, the astigmatic difference was as low as 3 $\mu$m or less.

In the embodiment shown in FIG. 14, the first p-cladding layer 15 and the current blocking layer 16 are formed from the same kind of materials having different conductivity types to have almost the same refractive index. However, the same effects as in the above embodiment can be obtained as long as the current blocking layer as a characteristic feature of the present invention has a band gap larger than the band gap corresponding to the emission wavelength of the active layer, and also has a refractive. index higher than that of at least a portion, of the current injection layer, which is near the active layer.

Figure 15:
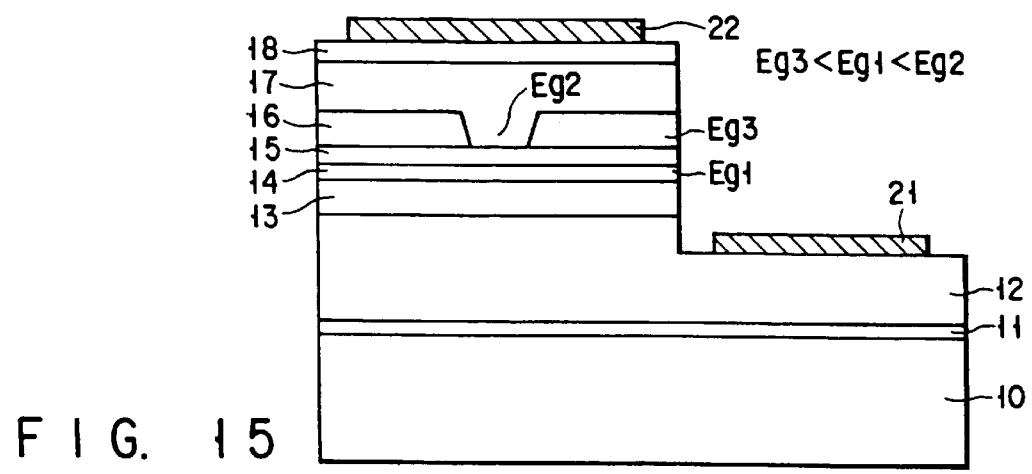

FIG. 15 is a sectional view showing the device structure of a gallium nitride-based compound semiconductor laser according to still another embodiment of the present invention.

In the embodiment shown in FIG. 15, a buffer layer 11, an n-contact layer 12, an n-cladding layer 13, an active layer 14, a p-cladding layer 15, and an Si-doped GaN current blocking layer 16 are stacked on a sapphire substrate 10. The current blocking layer 16 is etched in the form of a stripe.

A p-lower current injection layer (second p-cladding layer) 17 and a p-upper current injection layer (p-contact layer) 18 are stacked on a portion, of the cladding layer 15, which is exposed upon etching of the current blocking layer 16 and the current blocking layer 16. An n-side electrode 21 is formed on the upper surface of a portion, of the contact layer 12, which is exposed when the above layers, from the contact layer 18 to an upper portion of the contact layer 12, are partly etched. A p-side electrode 22 is formed on the upper surface of the contact layer 18.

A method of manufacturing the gallium nitride-based compound semiconductor laser in FIG. 15 and its structure, especially a portion around the current blocking layer 16, will be described in detail next.

The active layer 14 is formed by stacking/growing a 100-nm thick undoped GaN light guide layer, a multiple quantum well (MQW) structure formed by cyclically stacking 10 pairs of two types of InGaAlN layers, i.e., 2-nm thick undoped $In_{0.2}Ga_{0.8}N$ layers and 4-nm thick undoped $In_{0.05}Ga_{0.95}N$ layers, a 40-nm thick Mg-doped p-$Al_{0.2}Ga_{0.8}N$ cap layer, and a 100-nm thick Mg-doped p-GaN light guide layer. The first p-$Ga_{0.85}Al_{0.15}N$ cladding layer 15 doped with Mg and having a thickness of 100 nm is formed on the active layer 14. An Si-doped $In_{0.25}Ga_{0.75}N$ current blocking layer is grown to a thickness of 300 nm on the cladding layer 15. After the current blocking layer 16 is etched in the form of a 3-$\mu$m wide stripe, the second p-$Ga_{0.85}Al_{0.15}N$ cladding layer 17 doped with Mg and having a thickness of 300 nm is formed. The 200-nm thick p$^+$-GaN upper current injection layer (p-contact layer) 18 doped with Mg at a high concentration is stacked on the buried layer 17. With the same electrode formation process as in the embodiment shown in FIG. 10, the structure shown in FIG. 15 is obtained.

In the structure of the embodiment shown in FIG. 15, the second p-cladding layer 17 corresponding to at least a portion, of the current injection layer, which is near the active layer has a band gap larger than the band gap corresponding to the emission wavelength of the active layer. In addition, the band gap of the current blocking layer 16 is smaller than the band gap corresponding to the emission oscillation of the active layer.

With this structure, an optical waveguide mechanism could be formed, in which the effective refractive index in a direction parallel to the junction was high at the striped opening portion into which a current was to be injected. In addition, since a large absorption loss was allowed with respect to a high-order transverse mode, the fundamental transverse mode was stabilized, and an increase in threshold current due to a light diffraction loss could be suppressed. Furthermore, the wave surface of light guided by the waveguide mechanism was made flat, thus realizing a small astigmatic difference indispensable to a laser used for optical disks.

It was confirmed that the laser device obtained in the above manner continuously oscillated at a wavelength of 420 nm at room temperature, the highest temperature in the continuous operation was 100° C., and the device continuously operated for 1,000 hours or more under the conditions of 50° C. and 7 mW. In addition, the astigmatic difference was as low as 7 $\mu$m or less.

In the embodiment shown in FIG. 15, the first p-cladding layer 15 and the second p-cladding layer 17 are formed from the same material to have almost the same refractive index. However, the same effects as in the above embodiment can be obtained as long as at least the portion, of the current injection layer as a characteristic feature of the present invention, which is near the active layer has a band gap larger than the band gap corresponding to the emission wavelength of the active layer, and the current blocking layer has a band gap smaller than the band gap corresponding to the emission wavelength of the active layer.

Figure 16:
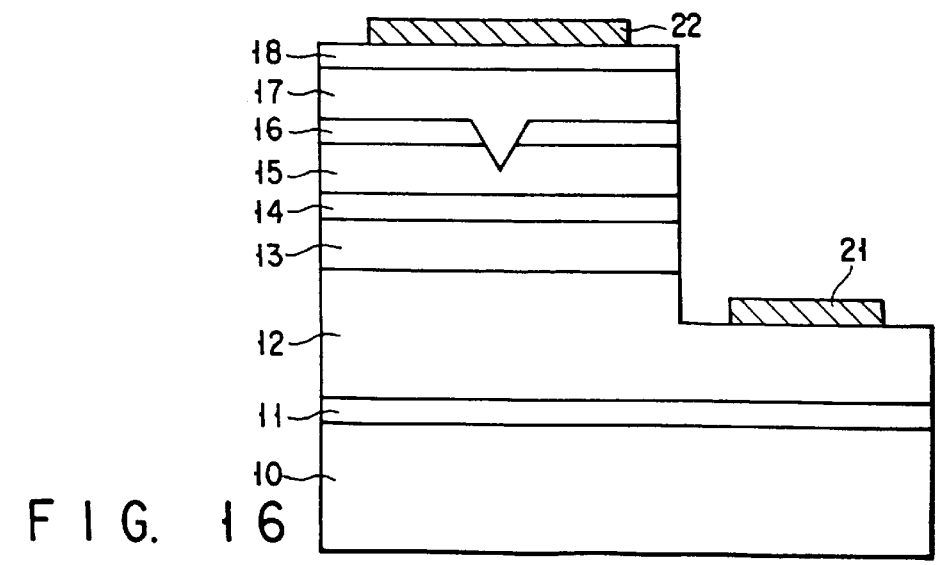

FIG. 16 is a sectional view showing the device structure of a gallium nitride-based compound semiconductor laser according to still another embodiment of the present invention.

In the embodiment shown in FIG. 16, a buffer layer 11, an n-contact layer 12, an n-cladding layer 13, an active layer 14, a p-cladding layer 15, and an current blocking layer 16 are stacked on a sapphire substrate 10. The current blocking layer 16 and the cladding layer 15 are etched in the form of a stripe having a V-shaped cross-section.

A p-lower current injection layer 17 and a p-upper current injection layer (p-contact layer) 18 are stacked on the V-shaped groove portion, of the cladding layer 15, which is exposed upon etching of the current. blocking layer 16 and the cladding layer 15 and the current blocking layer 16. An n-side electrode 21 is formed on the upper surface of a portion, of the contact layer 12, which is exposed when the above layers, from the contact layer 18 to an upper portion of the contact layer 12, are partly etched. A p-side electrode 22 is formed on the upper surface of the contact layer 18.

A method of manufacturing the gallium nitride-based compound semiconductor laser in FIG. 16 and its structure, especially a portion around the current blocking layer 16, will be described in detail next.

The active layer 14 is formed by stacking/growing a 100-nm thick undoped GaN light guide layer, a multiple quantum well (MQW) structure formed by cyclically stacking 10 pairs of two types of InGaAlN layers, i.e., 2-nm thick undoped $In_{0.2}Ga_{0.8}N$ layers and 4-nm thick undoped $In_{0.05}Ga_{0.95}N$ layers, a 40-nm thick Mg-doped $p\text{-}Al_{0.2}Ga_{0.8}N$ cap layer, and a 100-nm thick Mg-doped p-GaN light guide layer. The Mg-doped $p\text{-}Ga_{0.85}Al_{0.15}N$ cladding layer 15 having a thickness of 300 nm is formed on the active layer 14. An Si-doped GaN current blocking layer having a thickness of 1.5 $\mu$m is formed on the cladding layer 15. After the current blocking layer 16 is etched in the form of a 2-$\mu$m wide stripe to form a V-shaped groove portion reaching the cladding layer 15, the Mg-doped p-GaN lower current injection layer 17 having a thickness of 800 nm is formed. The 200-nm thick $p^+$-GaN upper current injection layer (p-contact layer) 18 doped with Mg at a high concentration is stacked on the buried layer 17. With the same electrode formation process as in the embodiment shown in FIG. 10, the structure shown in FIG. 16 is obtained.

In the structure of the embodiment shown in FIG. 16, the lower current injection layer 17 is formed in the striped opening portion to be in contact with the groove portion formed in the cladding layer 15 between the current injection layer and the MQW active layer 14. In addition, this embodiment is characterized in that this groove portion is formed in a V shape.

With this structure, a current could be made to concentrate on the central portion of the stripe so an ineffective current due to the spread of the current could be suppressed. In addition, it was assumed that a more noticeable ineffective current constriction effect was obtained by setting the resistivity of the buried layer 17 to be lower than that of the cladding layer 15. In this case, since the refractive index of the material filling the V-shaped groove was higher than that of the cladding layer as well, an optical waveguide mechanism could be formed, in which the effective refractive index in a direction parallel to the junction was high at the V-shaped portion of the striped opening portion into which a current was to be injected. The fundamental transverse mode was therefore stabilized, and an increase in threshold current due to light absorption and diffraction losses could be suppressed. Furthermore, the wave surface of light guided by the waveguide mechanism was made flat, thus realizing a small astigmatic difference indispensable to a laser used for optical disks.

It was confirmed that the laser device obtained in the above manner continuously oscillated at a wavelength of 420 nm at room temperature, the highest temperature in the continuous operation was 110° C., and the device continuously operated for 1,000 hours or more under the conditions of 50° C. and 3 mW. In addition, the astigmatic difference was as low as 7 $\mu$m or less.

In the embodiment shown in FIG. 16, as the p-lower current injection layer 17, the layer having a higher refractive index than the cladding layer 15 is used. However, instead of such a layer having a higher refractive index, a material having a refractive index equal to or higher than that of the cladding layer 15 may be used as long as the material has a resistivity lower than that of the cladding layer 15.

FIG. 17 is a sectional view showing the device structure of a gallium nitride-based compound semiconductor laser according to still another embodiment of the present invention.

In the embodiment shown in FIG. 17, a buffer layer 11, an n-contact layer 12, an n-cladding layer 13, an active layer 14, a p-cladding layer 15, and an current blocking layer 16 are stacked on a sapphire substrate 10. The current blocking layer 16 and the cladding layer 15 are etched in the form of a striped groove portion having a flat bottom portion.

A p-lower current injection layer 17 and a p-upper current injection layer (p-contact layer) 18 are stacked on the groove portion, of the cladding layer 15, which is exposed upon etching of the current blocking layer 16 and the cladding layer 15 and the current blocking layer 16 and the cladding layer 15. An n-side electrode 21 is formed on the upper surface of a portion, of the contact layer 12, which is exposed when the above layers, from the contact layer 18 to an upper portion of the contact layer 12, are partly etched. A p-side electrode 22 is formed on the upper surface of the contact layer 18.

A method of manufacturing the gallium nitride-based compound semiconductor laser in FIG. 17 and its structure, especially a portion around the current blocking layer 16, will be described in detail next.

The active layer 14 is formed by stacking/growing a 100-nm thick undoped GaN light guide layer, a multiple quantum well (MQW) structure formed by cyclically stacking 10 pairs of two types of InGaAlN layers, i.e., 2-nm thick undoped $In_{0.2}Ga_{0.8}N$ layers and 4-nm thick undoped $In_{0.05}Ga_{0.95}N$ layers, a 40-nm thick Mg-doped $p\text{-}Al_{0.2}Ga_{0.8}N$ cap layer, and a 100-nm thick Mg-doped p-GaN light guide layer. The Mg-doped $p\text{-}Ga_{0.85}Al_{0.15}N$ cladding layer 15 having a thickness of 300 nm is formed on the active layer 14. An Si-doped GaN current blocking layer having a thickness of 1.5 $\mu$m is formed on the cladding layer 15. After the current blocking layer 16 is etched in the form of a 3-$\mu$m wide stripe to form a groove portion having a flat groove bottom portion, the Mg-doped p-GaN lower current injection layer 17 having a thickness of 800 nm is formed. The 200-nm thick $p^+$-GaN upper current injection layer (p-contact layer) 18 doped with Mg at a high concentration is stacked on the buried layer 17. With the same electrode formation process as in the embodiment shown in FIG. 10, the structure shown in FIG. 17 is obtained.

In the structure of the embodiment shown in FIG. 17, the lower current injection layer 17 is formed in the striped opening portion to be in contact with the groove portion formed in the cladding layer 15 between the current injection layer and the MQW active layer 14. In addition, this embodiment is characterized in that this groove portion has a flat groove bottom portion.

With this structure, the width of current injection can be made almost equal to the width of the optical waveguide mechanism. This is effective in producing a laser with a small astigmatic difference. Since the refractive index of a material filling the groove was higher than that of the p-cladding layer, an optical waveguide mechanism could be formed, in which the effective refractive index in a direction parallel to the junction was high at the striped opening portion into which a current was to be injected. The fundamental transverse mode was therefore stabilized, and an increase in threshold current due to light absorption and diffraction losses could be suppressed. Furthermore, the wave surface of light guided by the waveguide mechanism was made flat, thus realizing a small astigmatic difference indispensable to a laser used for optical disks.

It was confirmed that the laser device obtained in the above manner continuously oscillated at a wavelength of 420 nm at room temperature, the highest temperature in the continuous operation was 110° C., and the device continuously operated for 1,000 hours or more under the conditions of 50° C. and 5 mW. In addition, the astigmatic difference was as low as 5 $\mu$m or less.

In the embodiment shown in FIG. 17, as the buried layer 17, the GaN layer having a high refractive index than the cladding layer 15 is used. However, as shown in FIG. 18, for example, a second p-cladding layer 17a having a refractive index almost equal to or lower than that of the cladding layer 15 may be used.

FIG. 19 is a sectional view showing the device structure of a gallium nitride-based compound semiconductor laser according to still another embodiment of the present invention. The embodiment shown in FIG. 19 differs from the embodiment shown in FIG. 17 only in that a groove portion formed in a p-cladding layer has two steps, and the groove portion is narrower than the striped opening portion.

With this structure, the width of current injection can be made smaller than the width of an optical waveguide mechanism. This promotes absorption at the non-injection portions on the two sides of the portion, of the active layer, into which a current is to be injected, thereby forming an oversaturation absorber. This structure is favorable for the manufacture of a low-noise laser which causes self-pulsation.

It was confirmed that the laser device obtained in the above manner continuously oscillated at a wavelength of 420 nm at room temperature, the highest temperature in the continuous operation was 90° C., and the device continuously operated for 1,000 hours or more under the conditions of 50° C. and 5 mW. In addition, the astigmatic difference was as low as 7 $\mu$m or less. Furthermore, the device having low-noise characteristics and capable of causing self-pulsation could be obtained.

In the embodiment shown in FIG. 19, as a p-lower current injection layer, a layer having a higher refractive index than a p-cladding layer is used. However, instead of such a layer having a higher refractive index, a material having a refractive index equal to or higher than that of a cladding layer 15 may be used as long as the material has a resistivity lower than that of the cladding layer 15.

According to the embodiments shown in FIGS. 10 to 19, the following effects can be obtained.

In a conventional semiconductor laser device having a striped opening in a current blocking layer, while crystal growth of the current blocking layer is performed by adding an n-type impurity such as Si without intentionally adding a p-type impurity such as Mg, a p-type impurity material such as Mg mixes with a current blocking layer crystal. This phenomenon is assumed to occur because a p-type impurity material such as Mg adheres to the inner wall of the reaction furnace, pipes, and the like of the crystal growth apparatus when the impurity material is added to form a cladding layer or the like between the current blocking layer and the active layer, and the p-type impurity material such as Mg separates from the inner wall of the reaction furnace, pipes, and the like of the crystal growth apparatus during crystal growth of the current blocking layer (memory effect).

In addition, an impurity such as Mg added to the cladding layer formed between the current blocking layer and the active layer or the current injection layer formed on the current blocking layer is diffused in the current blocking layer when annealing is performed to perform crystal growth or an device structure formation process. Owing to the influence of such a phenomenon, the current block layer is doped with an undesired impurity, resulting in a deterioration in crystallinity. In the prior art, a current blocking layer, which is to be formed as an n-type layer to have good current constriction characteristics, has a conductivity type different from the n conductivity type upon mixing of a p-type impurity. As a result, the current constriction characteristics of the layer are impaired, and an ineffective current is generated. If the n-conductivity type of the layer is to be maintained by doping it with an n-type impurity larger in amount than a p-type impurity which mixes with the layer, the crystallinity is impaired by the large amount of n-type impurity added, resulting in an ineffective current.

In contrast to this, according to the present invention, as in the embodiment shown in FIG. 10, the above problem can be solved by making the current blocking layer thicker than the p-layer between the current blocking layer and the active layer. More specifically, with this structure, even if a p-type impurity, which is not intentionally added, mixes with the current blocking layer owing to the above influence, since an n-type region can be left at least partly, the current constriction effect can be improved. This structure is based on the consideration of the phenomenon that the amount of an impurity adhering/separating to/from the reaction furnace and the pipes due to the memory effect increases depending on the time taken to form a layer, i.e., the thickness of the layer. By increasing the thickness of the current blocking layer in accordance with the thickness of the p-layer between the current blocking layer and the active layer, an n-type region can be left at least partly. With this structure, an ineffective current can be reduced, and decreases in threshold and operating voltages and an improvement in reliability can be attained.

According to the present invention, since the thickness of the current blocking layer is set to be more than two times the distance between current blocking layer and the active layer, mixing of a p-type impurity due to the memory effect can be suppressed more effectively. For this reason, a good current constriction effect can be obtained without excessively increasing the amount of n-type impurity added. Therefore, decreases in threshold and operating voltage and an improvement in reliability can be attained. If, however, the thickness of the current blocking layer becomes more than 10 times the distance between the current blocking layer and the active layer, the opening portion of the current blocking layer is difficult to form with high controllability, resulting in a decrease in yield. That is, the thickness of this layer has its upper limit in practice.

According to the present invention, since the current blocking layer is thicker than the current injection layer, even if a p-type impurity, which is not to be intentionally added, mixes with the current blocking layer upon diffusion in the process of forming the current injection layer, an n-type region can be left at least partly. As a result, the current constriction effect can be enhanced for the following reason. Since the amount of p-type impurity diffused increases depending on the time taken to form the current injection layer, i.e., the thickness of the layer. By thickening the current blocking layer in accordance with this increase in impurity, an n-type region can be left at least partly. With this structure, an ineffective current can be reduced, and decreases in threshold and operating voltage and an improvement in reliability can be attained.

According to the present invention, by setting the thickness of the current blocking layer to be 1.2 times that of the current injection layer, mixing of a p-type impurity due to diffusion can be suppressed more effectively. For this reason, a good current constriction effect can be obtained without excessively increasing the amount of n-type impurity added. Therefore, decreases in threshold and operating voltage and an improvement in reliability can b attained. If, however, the thickness of the current blocking layer becomes more than two times that of the current injection layer, satisfactory crystallinity cannot be obtained at a portion, of the opening portion of the current blocking layer, on which the current injection layer is formed, and the electrode contact formed on the current injection layer becomes insufficient, resulting in an increase in operating voltage. That is, the thickness of this layer has its upper limit in practice.

According to the present invention, by setting the thickness of the current injection layer to be greater than the distance between the current blocking layer and the active layer, the distortion of the cladding layer between the current blocking layer and the active layer due to annealing in the device formation process can be reduced, thereby preventing the development of cracks in the crystal. Therefore, a good current constriction effect can be obtained, and decreases in threshold and operating voltage and an improvement in reliability can be attained. It is, however, preferable that the thickness of the current injection layer be 1.7 to 5 times the distance between the current blocking layer and the active layer. Where the current injection layer has a thickness larger than this range, relative to the distance between the current blocking layer and the active layer (the thickness of the p-cladding layer), an increase in operating voltage is brought about due to an increase in DC resistance. Where the current injection layer has a thickness smaller than this range, light confinement becomes unsatisfactory.

In the conventional gallium nitride-based compound semiconductor laser device having the striped opening in the current blocking layer, defects such as pinholes tend to occur in the interface between the current blocking layer and the p-layer formed thereunder and the interface between the current blocking layer and the p-current injection layer. Since the interfaces between these layers and the p-n junction surface are located at almost the same position, the generation-recombination caused by the defects in the p-n junction surface becomes a cause that generates an ineffective current, resulting in a deterioration in current constriction characteristics.

In contrast to this, according to the present invention, at least a region other than an n-type region is formed in the current blocking layer doped with an n-type impurity such as Si to intentionally shift the p-n junction surface from the crystal layer. With this structure, the ineffective current generated by generation-recombination caused by the defects in the p-n junction interface is reduced, and decreases in threshold and operating voltage and an improvement in reliability can be attained.

The above region other than an n-type region is preferably formed on either or both of the interface between the current blocking layer and the layer formed thereunder, in which defects tend to occur, and the interface between the current blocking layer and the p-type current injection layer. In addition, the region other than n-type region is preferably a p-type region lightly doped with a p-type impurity such as Mg, or a high-resistance i-type region. Since the carrier concentration profile of this region continuously changes, electric fields do not concentrate on one portion, and an ineffective current can be suppressed more effectively.

In a conventional gallium nitride-based compound semiconductor laser device having a striped opening in a current blocking layer, since the effective refractive index in a direction parallel to the junction is constant, neither an optical waveguide mechanism nor a fundamental transverse mode stabilizing mechanism is formed. For this reason, a high-order transverse mode is produced, or the threshold current increases due to absorption and diffraction losses. In addition, a large astigmatic difference and the like are caused by a curvature in the wave surface of guided light. It is therefore difficult to realize characteristics indispensable to a laser for an optical disk and the like.

In contrast to this, according to the present invention, at least a portion, of the current injection layer, which is near the active layer can be made to have a band gap larger than the band gap corresponding to the emission wavelength of the active layer and to have a refractive index higher than that of the current blocking layer. With this structure, an optical waveguide mechanism can be formed, in which the effective refractive index in a direction parallel to the junction is high at the striped opening portion into which a current is to be injected. As a result, the fundamental transverse mode is stabilized, and an increase in threshold current due to light absorption and diffraction losses can be suppressed. In addition, the wave surface of light guided by the waveguide mechanism is made flat, thus realizing a small astigmatic difference indispensable to a laser used for optical disks.

In the above structure, the refractive index of the cladding layer between the current injection layer and the active layer can be made almost equal to the refractive index of the refractive index of the current blocking layer, or the refractive index of at least a portion, of the current injection layer, which is near the active layer. With this structure, a slight difference in refractive index need not be controlled, facilitating the manufacturing process and providing a semiconductor laser with high reproducibility and a high yield.

In addition, according to the present invention, the current blocking layer can be made to have a band gap larger than the band gap corresponding to the emission wavelength of the active layer and to have a refractive index higher than that of at least a portion, of the current injection layer, which is near the current injection layer. With this structure, an optical waveguide mechanism can be formed, in which the effective refractive index in a direction parallel to the junction is low at the striped opening portion into which a current is to be injected. As a result, the fundamental transverse mode is stabilized, and an increase in threshold current due to a light absorption loss can be suppressed. In addition, the wave surface of light guided by the waveguide mechanism is made flat, thus realizing a small astigmatic difference indispensable to a laser used for optical disks.

In the above structure as well, the refractive index of the cladding layer between the current injection layer and the active layer can be made almost equal to the refractive index of the refractive index of the current blocking layer, or the refractive index of at least a portion, of the current injection layer, which is near the active layer. With this structure, a slight difference in refractive index need not be controlled, facilitating the manufacturing process and providing a semiconductor laser with high reproducibility and a high yield.

According to the present invention, at least a portion, of the current injection layer, which is near the active layer can be made to have a band gap larger than the band gap corresponding to the emission wavelength of the active layer, and the current blocking layer can be made to have a band gap smaller than the band gap corresponding to the emission wavelength of the active layer. With this structure, an optical waveguide mechanism can be formed, in which the effective refractive index in a direction parallel to the junction is high at the striped opening portion into which a current is to be injected. As a result, a light absorption loss can be increased with respect to a higher transverse mode. Therefore, the fundamental transverse mode is stabilized, and an increase in threshold current due to a light diffraction loss can be suppressed. In addition, the wave surface of light guided by the waveguide mechanism is made flat, thus realizing a small astigmatic difference indispensable to a laser used for optical disks.

In the conventional gallium nitride-based compound semiconductor laser device having the striped opening in the current blocking layer, since the thickness of the cladding layer or the like formed between the active layer and the current blocking layer is uniform in the junction direction, an ineffective current that does not contribute to oscillation is generated due to the spread of a current.

In contrast to this, according to the present invention, the current injection layer is formed in contact with the groove portion formed in the cladding layer between the current injection layer and the active layer at the striped opening portion so as to cause a current to concentrate on the central portion of the striped opening portion, thereby suppressing an ineffective current due to the spread of a current. The effect of this structure becomes conspicuous when the resistivity of at least a portion, of the current injection layer, which is in contact with the groove portion of the cladding layer is set to be lower than a that of the cladding layer.

In the above structure, an optical waveguide mechanism in which the effective refractive index in a direction parallel to the junction is high or low at the portion into which a current is to be injected can be formed by setting the refractive index of at least a portion, of the current injection layer, which is near the active layer to be higher or lower than the refractive index of the cladding layer. As a result, the fundamental transverse mode is stabilized, and an increase in threshold current due to light absorption and diffraction losses can be suppressed. In addition, the wave surface of light guided by the waveguide mechanism is made flat, thus realizing a small astigmatic difference indispensable to a laser used for optical disks.

In the above structure, the width of current injection and the width of the optical waveguide mechanism can be separately controlled by controlling the shape of the groove portion formed in the cladding layer. When the groove portion of the cladding layer is formed into a V shape, a current can be made to concentrate on the central portion of the groove. This effect is favorable for the manufacture of a laser with a low current threshold. When the groove portion of the cladding layer is formed to have a flat bottom portion, the width of current injection can be made almost equal to the width of the optical waveguide mechanism. This effect is favorable for the manufacture of a laser with a small astigmatic difference. When the with of the groove portion of the cladding layer is formed to be narrower than the striped opening portion, the width of the current injection can be made smaller than the width of the optical waveguide mechanism. This promotes absorption at the non-injection portions on the two sides of the portion, of the active layer, into which a current is injected, thereby forming an oversaturation absorber. This structure is favorable for the manufacture of a low-noise laser which causes self-pulsation.

FIG. 20 is a sectional view showing the device structure of a gallium nitride-based compound semiconductor laser according to still another embodiment of the present invention. This embodiment is characterized in that each side wall of the opening portion of a current constriction structure forms an angle of 45° to 90° with the interface between a current blocking layer 16 and a current injection layer (layer 17+layer 18). A method of manufacturing the semiconductor laser in FIG. 20 will be described with reference to FIGS. 21A to 21C and 22A to 22C.

Figure 21A:
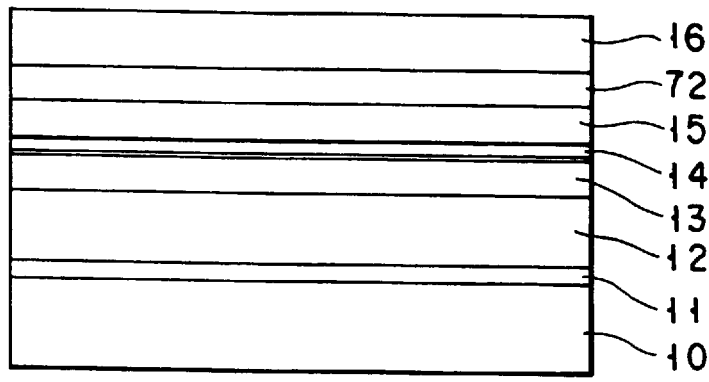
FIGS. 21A to 21C are sectional views showing the first half of a manufacturing process in a method of manufacturing the semiconductor laser in FIG. 20.

First of all, a GaN buffer layer 11 was grown to a thickness of about 10 nm to 200 nm on a sapphire substrate 10 by metal organic chemical vapor deposition (MOCVD). An Si-doped n-GaN contact layer 12 was grown to a thickness of 4 µm on the buffer layer 11. An Si-doped n-$Ga_{0.8}Al_{0.2}$N cladding layer 13 was grown to a thickness of 250 nm on the contact layer 12. An MQW active layer 14 was formed on the cladding layer 13 by stacking/growing a 200-nm thick undoped GaN light guide layer, a multiple quantum well (MQW) structure formed by cyclically stacking 50 pairs of two types of InGaN layers, i.e., 1.5-nm thick undoped $In_{0.25}Ga_{0.75}$N layers and 3-nm thick undoped $In_{0.05}Ga_{0.95}$N layers, and a 200-nm thick GaN light guide layer. An Mg-doped p-$Ga_{0.8}Al_{0.2}$N cladding layer 15 was grown on the MQW active layer 14. A 0.6-nm thick Mg-doped p-GaN etching stop layer 72 and the 1.0-µm thick Si-doped n-GaN current blocking layer 16 were sequentially stacked on the cladding layer 15 (FIG. 21A).

Figure 21B:
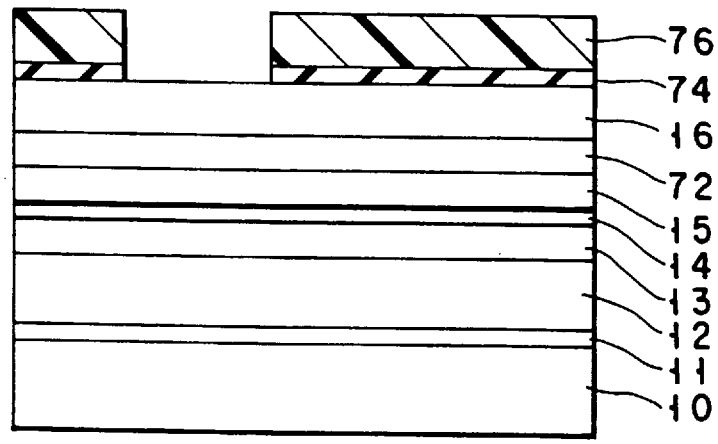

As shown in FIG. 21B, a 400-nm thick $SiO_2$ film was deposited as an inorganic material layer 74 on the current blocking layer 16 by thermal CVD. The layer 74 was then coated with a 3-µm thick resist layer (AZ4330) 76, and a strip pattern was transferred thereto by an optical exposure process. After developing, the wafer was placed in an oven containing a 150° C. nitrogen atmosphere for 20 minutes to set the resist.

In this process, with an increase in temperature, the resist was set, and the resistance to a plasma during dry etching increased. At 100° C. or higher, the resistance to a plasma increased. At 250° C. or higher, the resist was difficult to remove after etching. In practice, therefore, this process was effective within the range of 100° C. to 250° C.

Figure 21C:
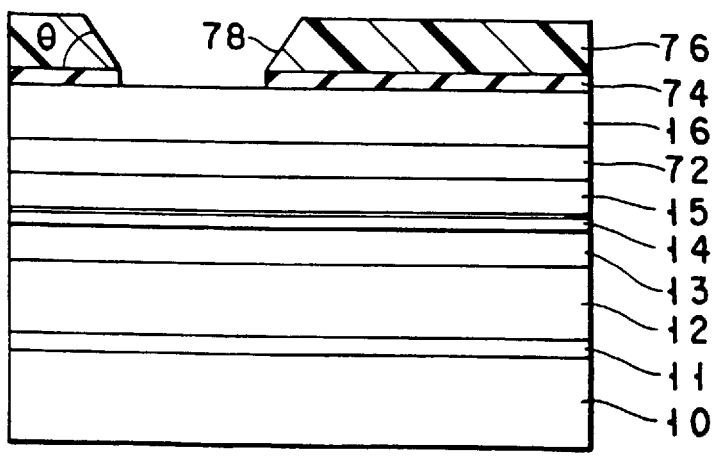
Figure 22A:
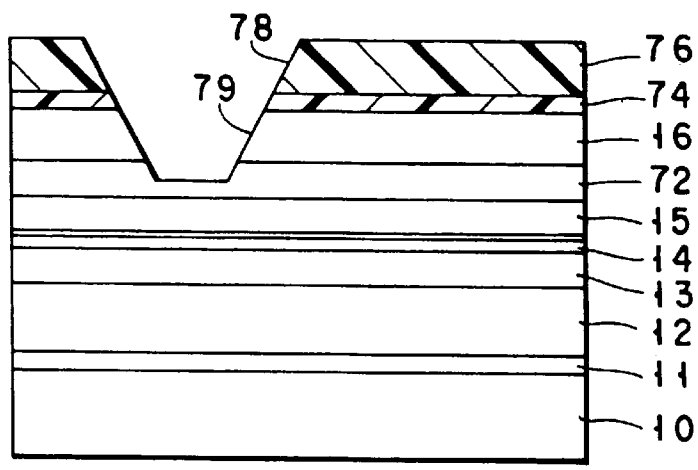
FIGS. 22A to 22C are sectional views showing the second half of the process in the method of manufacturing the semiconductor laser in FIG. 20.

Immediately after developing, each side wall of the resist layer 76 was almost perpendicular to the interface between the resist layer 76 and the current blocking layer 16. With this resist setting process, a resist reflow phenomenon occurred, so a taper 78 could be formed on each side wall of the mask of the resist layer 76, as shown in FIG. 21C. With the taper on each side wall of the resist, regression of the resist layer 76 was caused by sputtering in the dry etching process. As a result, as shown in FIG. 22A, a taper 79 could be formed on each side wall of the gallium nitride-based compound semiconductor etching portion. Note that the angle of the taper 79 can be controlled by controlling the temperature set in the resist setting process and the thicknesses of the resist layer 76 and the inorganic material layer 74.

The current blocking layer 16 was partly etched by the reactive ion beam etching (RIBE) method using the two-layer mask constituted by the inorganic material layer 74 and the resist layer 76, formed in the above manner, and chlorine gas until the etching stop layer 72 was exposed in the form of a stripe. The etching conditions for the current blocking layer 16 were: chlorine pressure: 0.4 mTorr; microwave power: 200 W; and ion accelerating voltage: 500 V. As a result, a 5-$\mu$m wide, 1.7-$\mu$m deep opening portion which formed an angle of about 500 with the interface between the current blocking layer and the mask on the etching side wall could be formed.

Figure 22B:
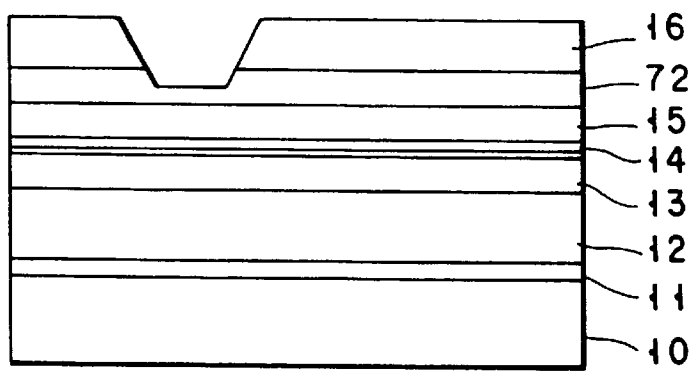

After dry etching, the wafer was processed first in a solution mixture of sulfuric acid, hydrogen peroxide, and water, and then was processed in hydrofluoric acid, thereby removing the etching mask, as shown in FIG. 22B. In addition, the resultant structure was dipped in a solution of $HNO_3$: HCl=3:1 which was heated to 100° C. or higher for 30 minutes, and then was rinsed with pure water.

Figure 22C:
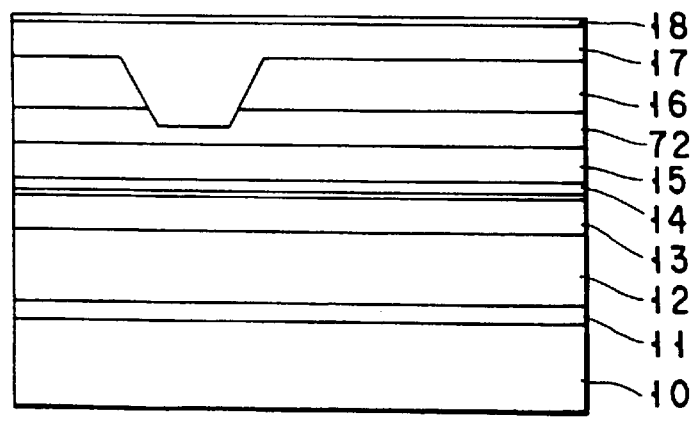

After the above process, as shown in FIG. 22C, the 1.0-$\mu$m thick Mg-doped first p-GaN contact layer 17 and the 0.2-$\mu$m thick second $p^+$-GaN buried layer 18 doped with Mg at a concentration higher than the Mg concentration of the first p-contact layer 17 were regrown by MOCVD.

The above layers were partly etched up to the contact layer 12 again by RIBE at a position shifted from the position of the striped opening portion of the current blocking layer 16 in a direction parallel to the striped opening portion, thereby forming a mesa having a double-heterostructure and a current constriction structure. An exposed portion is formed on the contact layer 12 alongside the mesa. An n-side electrode 21 was formed on the exposed surface of the contact layer 12, and a p-side electrode 22 was formed on the upper surface of the contact layer 18. An device isolation process was further performed to manufacture the gallium nitride-based compound semiconductor laser device shown in FIG. 20.

Figure 23:
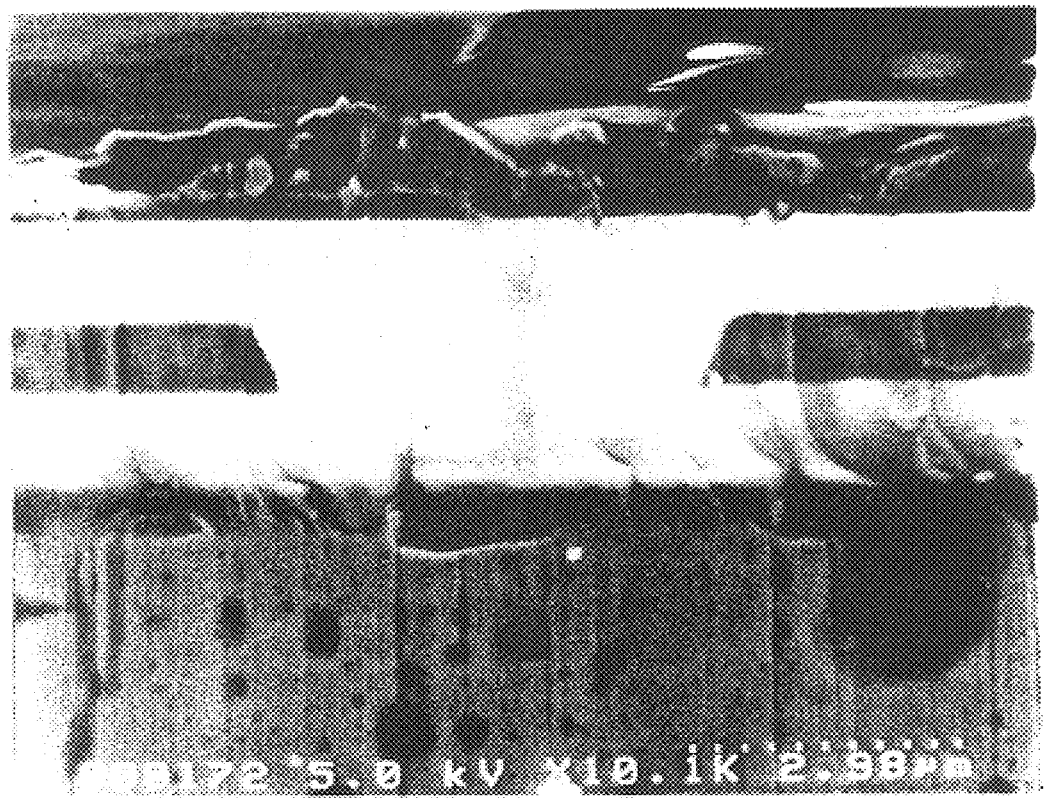
FIG. 23 is a scanning electron micrograph of a portion around an opening portion after regrowth of a p-contact layer in the semiconductor laser in FIG. 20.

FIG. 23 shows a scanning electron micrograph of a portion around the opening portion after the p-contact layer (with the first and second p-contact layers 17 and 18 being regarded as one layer as in the following description) is regrown. As shown in FIG. 23, the surface obtained upon regrowth exhibited high evenness. In addition, no deterioration in crystallinity was observed on the interface between the regrown layer and the bottom surface of the opening portion of the current blocking layer and on the interface between the regrown layer and each side surface of the current blocking layer.

Figure 24:
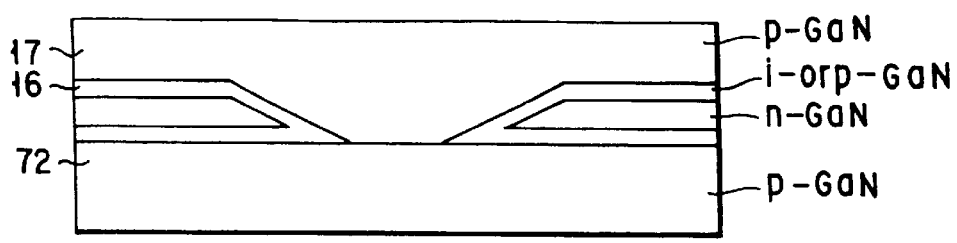
FIG. 24 is an enlarged sectional view of the portion around the opening portion of the semiconductor laser in FIG. 20.

According to this manufacturing method, the angle defined by each side wall of the opening portion of the current blocking layer 16 and the interface between the upper surface of the current blocking layer 16 and the p-contact layer can be controlled. When this angle is too small, regression of the mask becomes noticeable, resulting in difficulty in controlling the width of the opening portion of the current blocking layer 16. As shown in FIG. 24, Mg diffused from the p-GaN etching stop layer 72 or the p-GaN contact layer into the current blocking layer 16 during the first crystal growth or in the regrowth process, and Mg mixes with the n-GaN layer 16 due to contamination of a portion around the reactive tube with Mg. For this reason, the i-GaN or p-GaN.region is formed on the interface between the n-GaN layer 16 and the p-GaN layer, resulting in a decrease in effective thickness. If, therefore, the angle defined by each side wall of the opening portion of the current blocking layer 16 and the interface between the upper surface of the current blocking layer 16 and the contact layer is small, the width of the opening portion of the n-GaN current blocking layer 16 which can exhibit a current constriction effect increases, and controllability associated with the width of the opening portion deteriorates. For this reason, the practical angle is preferably equal to or larger than 45° FIGS. 25A to 25C and 26A to 26C show methods of manufacturing gallium nitride-based compound semiconductor lasers according to other embodiments of the present invention.

To enhance the current constriction effect, the width of the opening portion of a current blocking layer 16 must be decreased to 3 $\mu$m or less. To obtain such a narrow opening portion, each pattern side wall of a resist layer 76 must be set to be almost vertical, and each side wall of the opening portion of the current blocking layer, which is formed by dry etching, must be set to be almost vertical.

Figure 25A:
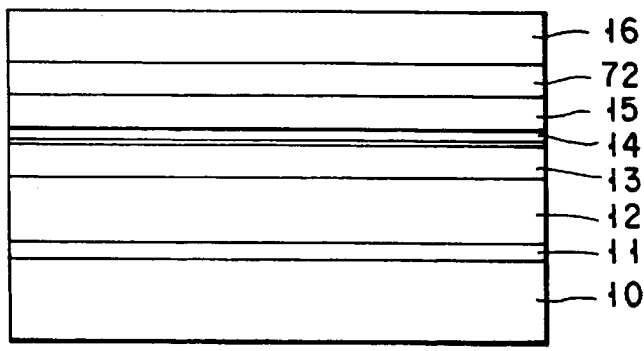
FIGS. 25A to 25C are sectional views showing the first half of a manufacturing process in a method of manufacturing a gallium nitride-based compound semiconductor laser according to still another embodiment of the present invention.
Figure 25B:
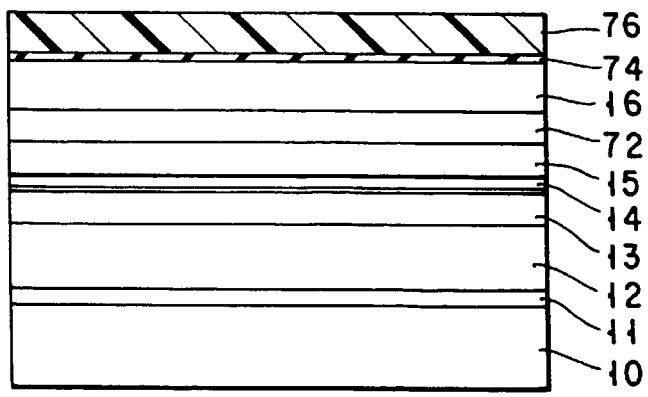
Figure 25C:
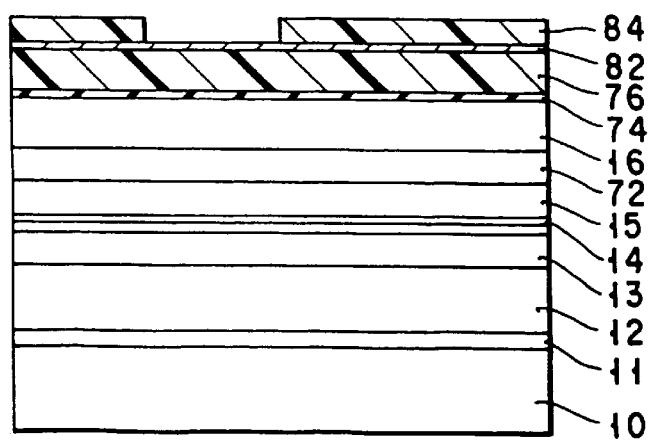
Figure 26A:
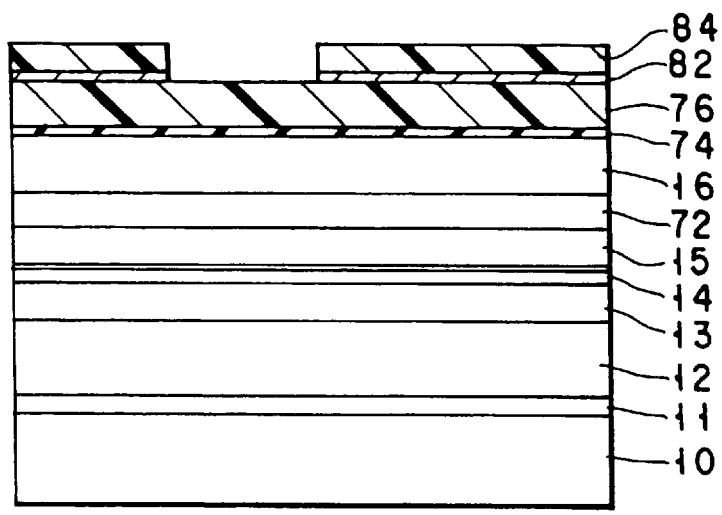
FIGS. 26A to 26C are sectional views showing the second half of the process following the first half of the process in FIGS. 25A to 25C in the method of manufacturing the semiconductor laser.
Figure 26B:
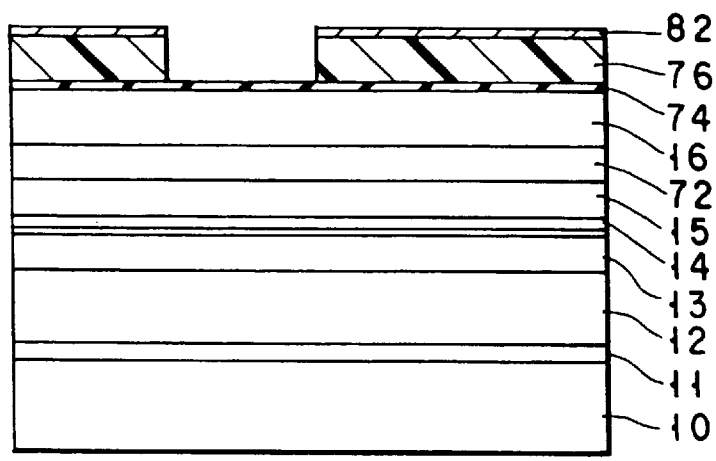
Figure 26C:
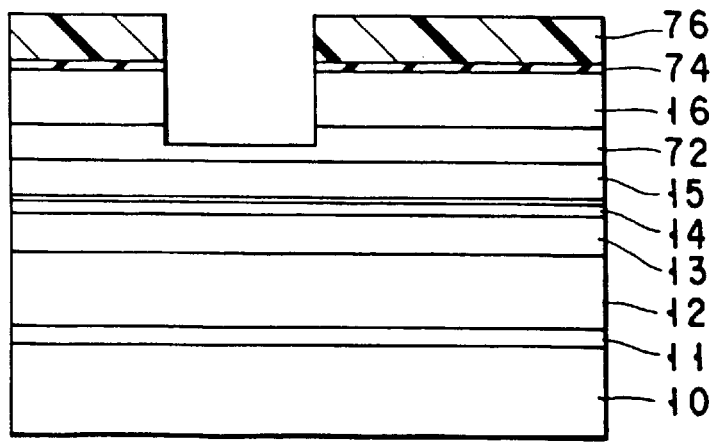

With the same step as that described with reference to FIG. 21A, a multilayer structure was grown up to the n-GaN current blocking layer 16 (FIG. 25A). As shown in FIG. 25B, an $SiO_2$ layer 74 was deposited to a thickness of 0.4 $\mu$m on the current blocking layer 16 by thermal CVD. The $SiO_2$ layer 74 was then coated with the 3-$\mu$m thick resist layer (AZ4330) 76. Thereafter, the wafer was placed in an oven containing a 250° C. nitrogen atmosphere for 20 minutes to set the resist. Subsequently, a Ti or Al layer 82 having a thickness of 100 nm to 200 nm was formed by evaporation using an electron beam evaporation apparatus. The layer 82 was coated with a 1-$\mu$m thick resist layer (AZ4110) 84, and a stripe pattern was transferred onto the resist layer 84 by an optical exposure process (FIG. 25C). After developing, the Ti or Al layer 82 was etched by the reactive ion beam etching method using chlorine gas to form the stripe pattern (FIG. 26A). The resist layer 76 was etched by the RIBE method using oxygen gas and the Ti or Al layer 82 as a mask, thereby transferring the stripe pattern (FIG. 26B).

With the above process, the resist layer 76 having almost vertical side walls could be formed. Since the resist layer 76 has already undergone the resist setting process at 250° C., the resistance to a chlorine plasma was high. After the $SiO_2$ layer 74 was selectively etched, the current blocking layer 16 was etched to form an opening portion by using a two-layer mask constituted by the resist layer 76 and the $SiO_2$ layer 74. As a result, a 1-$\mu$m wide opening portion having vertical side walls could be formed.

According to the embodiments described with reference to FIGS. 20 to 26C, the following effects can be obtained. Even if the regrown contact layer 17 is thin, the opening portion of the current blocking layer 16 can be embedded with the layer 17 to obtain a flat surface. In addition, a deterioration in crystallinity on the interface between the bottom surface of the opening portion of the current blocking layer 16 and the regrown contact layer 17 and on the interface between each side surface of the opening portion and the regrown contact layer 17 can be suppressed. Therefore, leakage currents on these interfaces can be suppressed, and currents can be uniformly injected into the constriction/active layer. For this reason, a decrease in threshold and an improvement in reliability can be attained. Consequently, a highly reliable gallium nitride-based compound semiconductor laser to be used for optical disks and the like can be realized.

Figure 27A:
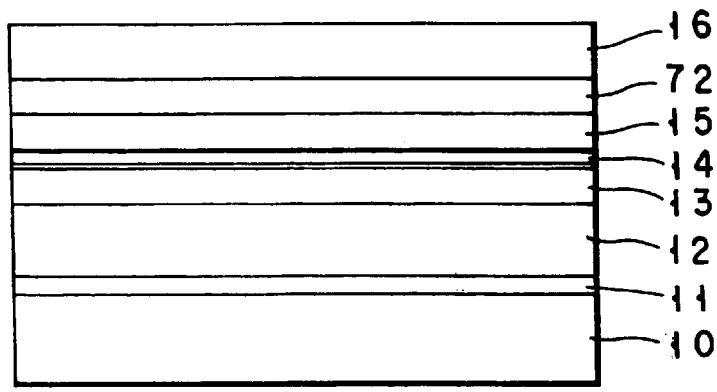
FIGS. 27A to 27C are sectional views showing the first half of a manufacturing process in a method of manufacturing a gallium nitride-based compound semiconductor laser according to still another embodiment of the present invention.
Figure 27B:
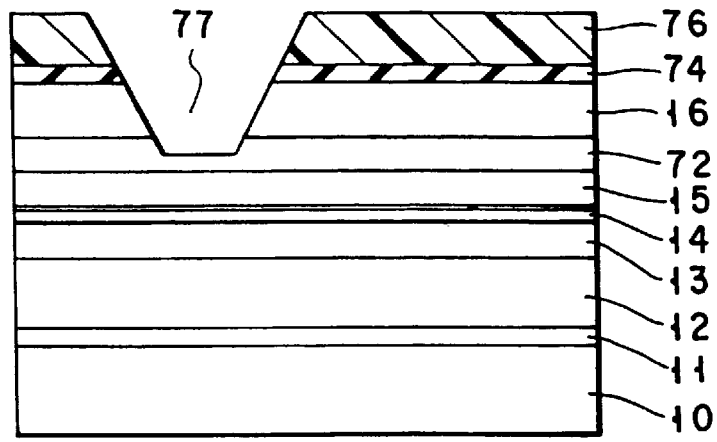
Figure 27C:
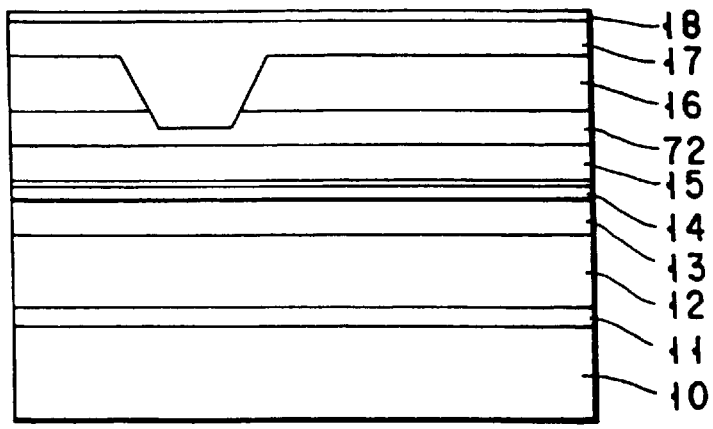

FIGS. 27A to 27C show a method of manufacturing a gallium nitride-based compound semiconductor laser a according to still another embodiment of the present invention. Since the manufacturing method of this embodiment is substantially the same as that described with reference to FIGS. 21A to 21C and 22A to 22C, only an outline of the method will be described below.

A GaN buffer layer 11 having a thickness of about 10 nm to 200 nm, a 4-μm thick Si-doped n-GaN contact layer 12, a 250-nm thick Si-doped n-Ga$_{0.8}$Al$_{0.2}$N cladding layer 13, an MQW active layer 14 having a multilayer structure, an Mg-doped p-Ga$_{0.8}$Al$_{0.2}$N cladding layer 15, a 0.6-μm thick Mg-doped p-GaN etching stop layer 72, and a 1.0-μm thick Si-doped n-GaN current blocking layer 16 were sequentially stacked on a sapphire substrate 10 (FIG. 27A).

A 400-nm thick SiO$_2$ inorganic material layer 74 and a 3-μm thick resist layer (AZ4330) 76 were formed on the current blocking layer 16. After a stripe pattern was transferred onto the resist layer 76 by an optical exposure process, the wafer having undergone developing was placed in an oven containing a 150° C. nitrogen atmosphere for 20 minutes, thus setting the resist. With this resist setting process, a resist reflow phenomenon occurred, and a taper could be formed on each side wall of the resist layer 76.

In etching the gallium nitride-based compound semiconductor, the selectivity with respect to the resist mask is as low as almost 1. For this reason, if a taper is formed on each side wall of the mask of the resist layer 76, a taper can be formed on each side. wall of the etching portion of the gallium nitride-based compound semiconductor owing to mask regression in the etching process. The angle of this taper can be controlled by controlling the temperature in the resist setting process and the thicknesses of the resist layer 76 and the inorganic material layer 74. Note that the inorganic mask layer need not be formed from SiO$_2$ and may be formed from SiN$_x$.

The current blocking layer 16 was partly etched by the reactive ion beam etching (RIBE) method using chlorine gas and the two-layer mask formed in the above manner by using the inorganic material layer 74 and the. resist layer 76 until the etching stop layer 72 was exposed in the form of a stripe. As a result, a 5-μm wide, 1.7-μm deep opening portion 77 could be formed such that each etching side wall formed an angle of about 50° with the interface between the current blocking layer and the mask (FIG. 27B).

After dry etching, the wafer was processed first in a solution mixture of sulfuric acid, hydrogen peroxide, and water, and then was processed in hydrofluoric acid, thereby removing the etching mask. The resultant structure was dipped in a solution of HNO$_3$:HCl=3:1 heated to 100° C. or higher for 30 minutes, and was rinsed with pure water. By dipping the resultant structure in a solution of HNO$_3$:HCl= 3:1 heated to 100° C. or higher for 30 minutes, the surfaces of the opening portion 77 and the current blocking layer 16 were etched to a depth of about 4 nm to remove the etching residue and a damaged layer in the crystal owing to dry etching. No morphological deterioration was caused by this process, and a good embedding process could be performed, as will be described later.

As general GaN etchants, KOH and NaOH are known. In the etching process using these etchants, however, a morphological deterioration is noticeable, and hence a proper regrowth process is assumed to be impossible, as reported by, for example, M. S. Minsky et al. (Appl. Phys. Lett., Vol. 68, No. 11 (1996), p. 1531). It is taken for granted that the solution of HNO$_3$:HCl=3:1 used in the present invention does not etch GaN, as reported by S. J. Pearton et al. (Materials Science and Engineering B31 (1995), p. 309).

In contrast to this, in the present invention, it was found that GaN was etched at an etching rate of about 0.13 nm/min by using the solution of HNO$_3$:HCl=3:1 heated to 100° C. or higher. This technique was applied to the manufacturing process for a gallium nitride-based compound semiconductor laser. With this technique, no morphological deterioration occurred, and a slight etching amount could be controlled. In the regrowth step, dislocation on an interface, and a morphological deterioration of a regrown layer surface, and the like due to a morphological deterioration on the interface were not observed.

After the above process, a first Mg-doped p-GaN contact layer 17 and a second p$^+$-GaN contact layer 18 doped with Mg at a concentration higher than the Mg concentration of the first contact layer 17 were regrown by MOCVD, as shown in FIG. 27C.

The above layers were partly etched up to the n-contact layer 12 to form a mesa having a double-heterostructure and a current constriction structure, and an exposed portion of the contact layer 12 was formed alongside the mesa. An n-side electrode 21 was formed on the exposed surface of the contact layer 12. A p-side electrode 22 was formed on the upper surface of the contact layer 18. In addition, an device isolation process was performed. With this process, the gallium nitride-based compound semiconductor laser shown in FIG. 20 was manufactured.

FIG. 23 shows a scanning electron micrograph of a portion around the opening portion after the p-contact layer (with the first and second p-contact layers 17 and 18 being regarded as one layer as in the following description) is regrown. As shown in FIG. 23, the surface obtained upon regrowth exhibited high evenness.

Figure 28A:
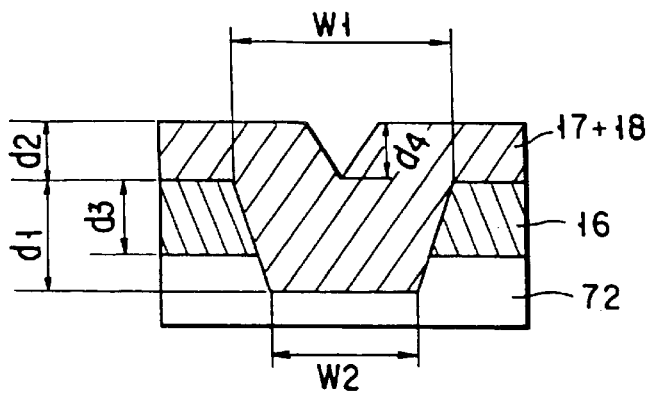
FIG. 28A is an enlarged sectional view of a portion around an opening portion after regrowth of a p-contact layer in the semiconductor laser in FIGS. 27A to 27C.
Figure 28B:
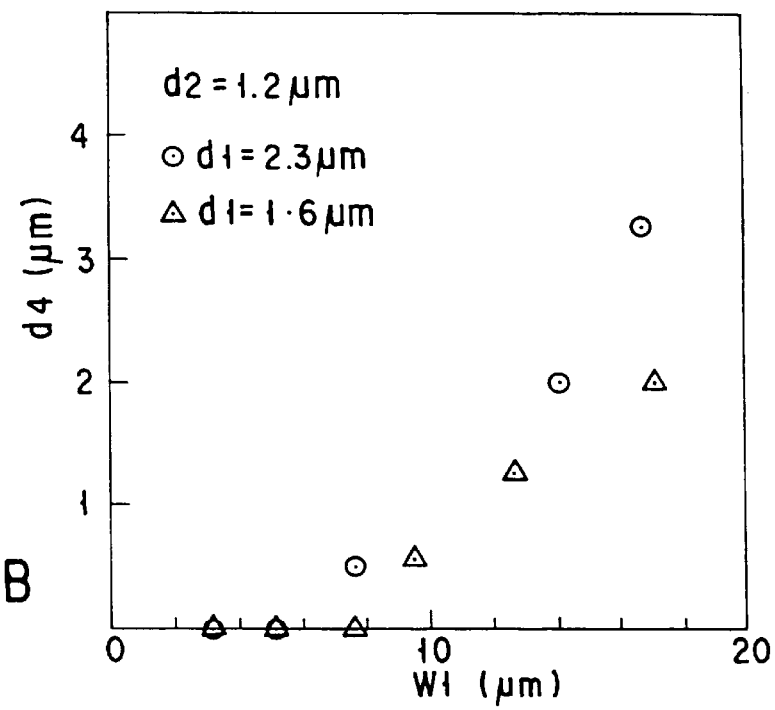
FIG. 28B is a graph showing the relationship between the width of the upper portion of the opening portion and the depth of a groove in the surface of the p-contact layer, with the depth of the opening portion being a variable.

FIG. 28A is an enlarged view of a portion around an opening portion 77 after regrowth of the p-contact layer. FIG. 28B shows the relationship between a width W1 of the upper portion of the opening portion 77 formed by dry etching and a depth d4 of the groove in the upper surface of the p-contact layer after regrowth, with a depth d1 of the opening portion 77 being a variable. That is, FIG. 28B shows the dependence of the evenness of the p-contact layer on the width W1 and the depth d1 of the opening portion 77.

When the thickness d2 of the regrown contact layer was 1.2 μm, and the depth d1 of the opening portion 77 was 2.3 μm, the opening portion 77 whose width W1 was 5 μm or less was evenly filled up. When the depth d1 was 1.6 μm, the opening portion 77 whose width W1 was 7.5 μm or less was evenly filled up. That is, when the width W1 of the opening portion was small, the opening portion could be evenly filled up with a regrown layer having a thickness smaller than the depth d1 of the opening portion. When the width W1 of the opening portion was large, a V-shaped groove (depth d4) was formed in the upper surface of the regrown layer, and hence the opening portion was not evenly filled up.

To evenly fill up the opening portion 77 with a regrown layer, the growth rate of the regrown layer at the opening portion 77 must be higher than that at the non-opening portion, and a regrown layer portion corresponding to the volume of the opening portion 77 must be embedded while a layer portion is grown on the non-opening portion by d2 in a direction perpendicular to the wafer. In MOCVD for a gallium nitride-based compound semiconductor, surface diffusion plays an important role; a material is supplied from the non-opening portion to the opening portion by surface diffusion. In addition, the rate at which a material is attached to each side wall portion of the opening portion of the current blocking layer 16 is higher than the rate at which the material is attached to the upper surface of the current blocking layer 16. For example, where the thickness d2 of the regrown contact layer was 1.2 μm, and the depth d1 of the opening portion was 1.6 μm, a layer was grown to a thickness of about 4.5 μm on each side wall of the opening portion 77 in the lateral direction. That is, the growth rate of the layer is higher at the opening portion 77 than at the non-opening portion. If a portion corresponding to the volume of the opening portion of the current blocking layer can be compensated by this difference in growth rate, the opening portion 77 can be evenly filled up.

Assume that the width of the lower portion of the opening portion 77 is represented by W2, and the length of the stripe of the opening portion 77 is represented by L. In this case, while a contact layer is grown by the thickness d2, a layer grows in the opening portion of the current blocking layer to fill it more than a layer on the non-opening portion by about $2\times(4.5\times1.6)\times d2/1.2\times L$. If the cross-section of the opening portion of the current blocking layer is approximated by a trapezoid, the volume of the opening portion is represented by $(W1+W2)\times d1/2\times L$. Therefore, $$12\times d2\times L \geq (w1+w2)\times d1/2\times L$$

That is, the opening portion can be filled up if the following inequality is satisfied:

$$(W1+W2)\times d1/d2 \leq 24 \quad (11)$$

According to this inequality, d2, i.e., the thickness of the p-contact layer, is set to be large, the opening can always be filled up evenly. However, since the contact layer, i.e., the p-GaN layer, has a high resistance, if the thickness d2 is excessively increased, the device resistance increases to cancel out the device characteristics of the current constriction structure, resulting in a deterioration in quality. It is therefore preferable that the thickness d2 of the p-GaN contact layer be smaller than the depth of the opening portion 77 of the current blocking layer 16. That is, the following inequality is preferably satisfied:

$$d2 \leq d1 \quad (12)$$

According to the embodiment described with reference to FIGS. 27A to 27C, since the opening portion 77 of the current blocking layer 16 can be completely filled up without increasing the thickness of the p-contact layer, no increase in device resistance occurs. In addition, since the current blocking layer 16 exhibits a good current constriction effect, a current can be uniformly and efficiently injected into the active layer 14.

Figure 29:
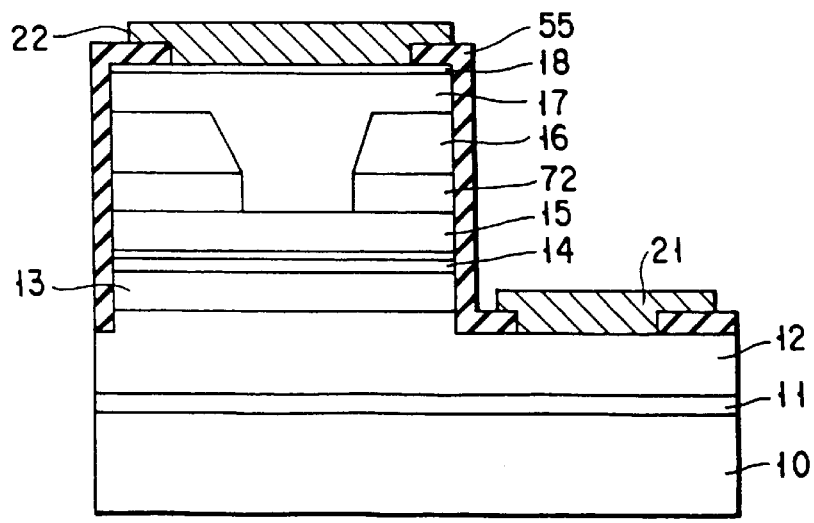
FIG. 29 is a sectional view showing the device structure of a gallium nitride-based compound semiconductor laser according to still another embodiment of the present invention.

FIG. 29 is a sectional view showing the device structure of a gallium nitride-based compound semiconductor laser according to still another embodiment of the present invention. A method of manufacturing the semiconductor laser shown in FIG. 29 will be described with reference to FIGS. 30A to 30C.

This embodiment differs from the embodiment shown in FIGS. 27A to 27C in that InGaN is used for an p-InGaN etching stop layer 72 in the process of forming an opening portion 77 in a current blocking layer 16. Since the steps up to some step in the manufacturing process in this embodiment are the same as those in the embodiment shown in FIGS. 27A to 27C, a detailed description thereof will be omitted.

In this embodiment, the undoped $In_{0.15}Ga_{0.85}N$ etching stop layer 72 was grown to a thickness of 0.2 $\mu$m on a p-cladding layer 15. The n-GaN current blocking layer 16 was grown to a thickness of 1.5 $\mu$m on the etching stop layer 72 (FIG. 30A).

Subsequently, an $SiO_2$ layer 74 was deposited to a thickness of 0.3 $\mu$m on the current blocking layer 16 by thermal CVD, and the layer 74 was coated with a resist layer 76. Optical exposure and developing processes were performed to form a stripe pattern. The resultant structure was heated to 150° C. in an oven containing a nitrogen atmosphere to set the resist. Subsequently, the current blocking layer 16 was partly etched by reactive ion beam etching until the undoped $In_{0.15}Ga_{0.85}N$ etching stop layer 72 was exposed, thereby forming the opening portion 77. The wafer was then dipped in a solution mixture of sulfuric acid, hydrogen peroxide, and water, and in hydrofluoric acid, thereby removing the resist layer 76 serving as an etching mask and the $SiO_2$ layer 74 (FIG. 30B).

The wafer was loaded into the growth apparatus again to be exposed to an atmosphere mainly containing hydrogen gas well as ammonia gas at 900° C. or higher. With this process, the $In_{0.15}Ga_{0.85}N$ layer as the etching stop layer 72 was evaporated to obtain the clean upper surface of the p-cladding layer 15 and the clean upper surface of the current blocking layer. The Mg-doped first p-GaN contact layer 17 and the second $p^+$-GaN contact layer 18 were sequentially stacked on the current blocking layer 16 and the exposed surface of the cladding layer 15 (FIG. 30C). Thereafter, the same steps as those in the manufacturing method in FIGS. 27A to 27C were performed to manufacture the gallium nitride-based compound semiconductor laser shown in FIG. 29.

In this manufacturing method, the opening portion 77 of the current blocking layer 16 can be evenly filled up if the opening portion 77 is designed to satisfy the following inequality:

$$(W1+W2)\times d1/d2 \leq 24 \quad (11)$$

where d1 is the distance from the upper portion of the current blocking layer 16 in the opening portion 77 to the upper portion of the cladding layer 15, d2 is the thickness of the regrown p-contact layer (layer 17+layer 18), W1 is the width of the upper portion of the opening portion 77, and W2 is the width of the lower portion of the opening portion 77. In addition, to reduce the device resistance, the thickness of the p-GaN contact layer must be decreased. This thickness is preferably smaller than the depth of the opening portion 77. That is, the following inequality is preferably satisfied:

$$d2 \leq d1 \quad (12)$$

According to the embodiment described with reference to FIGS. 29 and 30A to 30C, since the InGaN etching stop layer 72 which is damaged by dry etching is removed, a clean interface can be obtained. A leakage current on the interface can therefore be reduced. In addition, since the p-GaN contact layer can be directly formed on the cladding layer 15, the effective thickness of the p-GaN layer in the opening portion of the current blocking layer can be decreased. For this reason, the device resistance can be decreased.

Figure 31:
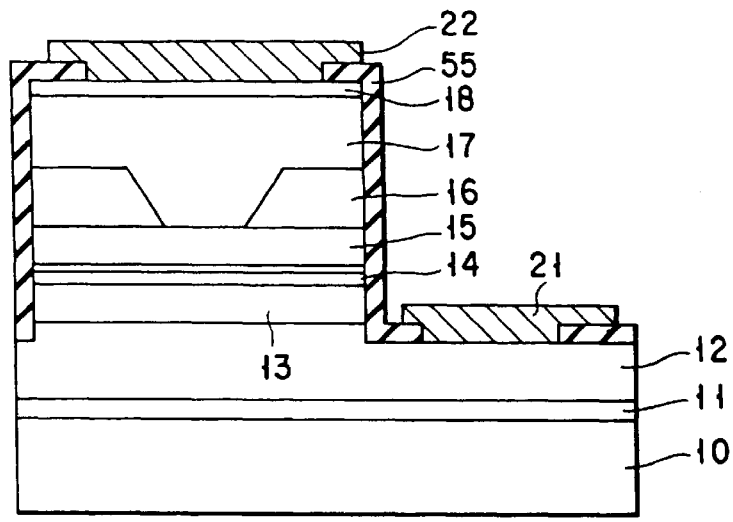
FIG. 31 is a sectional view showing the device structure of a gallium nitride-based compound semiconductor laser according to still another embodiment of the present invention.

FIG. 31 is a sectional view showing the device structure of a gallium nitride-based compound semiconductor laser according to still another embodiment of the present invention. A method of manufacturing the semiconductor laser in FIG. 31 will be described with reference to FIGS. 32A to 32C.

This embodiment differs from the embodiment in FIGS. 27A to 27C in that no etching stop layer 72 is formed in the process of forming an opening portion 77 in a current blocking layer 16. Since the steps up to some step in the manufacturing process in this embodiment are the same as those in the embodiment shown in FIGS. 27A to 27C, a detailed description thereof will be omitted.

Figure 32A:
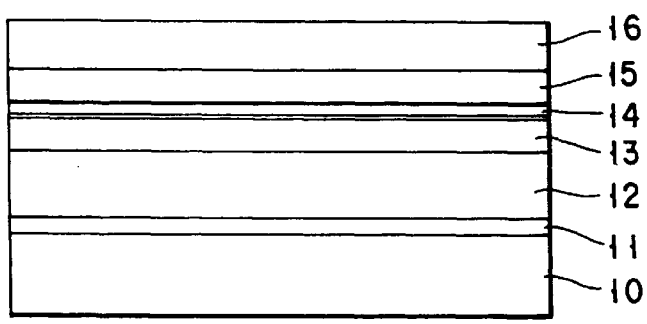
FIGS. 32A to 32C are sectional-views showing a method of manufacturing the semiconductor laser in FIG. 31.

In this embodiment, the n-GaN current blocking layer 16 was directly grown to a thickness of 1.5 $\mu$m on a p-cladding layer 15 (FIG. 32A).

Figure 32B:
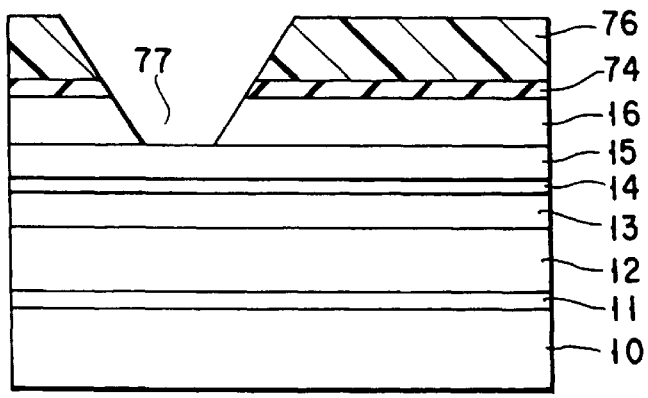

Subsequently, an SiO$_2$ layer 74 was deposited to a thickness of 0.3 µm on the current blocking layer 16 by thermal CVD, and coated with a resist layer 76. Optical exposure and developing processes were performed to form a stripe pattern. The resultant structure was heated to 150° C. in an oven containing a nitrogen atmosphere to set the resist. Subsequently, the current blocking layer 16 was partly etched by reactive ion beam etching until the cladding layer 15 was exposed, thereby forming the opening portion 77. The wafer was then dipped in a solution mixture of sulfuric acid, hydrogen peroxide, and water, and then in hydrofluoric acid, thereby removing the resist layer 76 serving as an etching mask and the SiO$_2$ layer 74 (FIG. 32B).

The resultant structure was dipped in a solution of HNO$_3$:HCl=3:1 heated to 100° C. or higher for 30 minutes, and was rinsed with pure water. By dipping the resultant structure in a solution of HNO$_3$:HCl=3:1 heated to 100° C. or higher for 30 minutes, the surfaces of the opening portion and the current blocking layer were etched to a depth of about 4 nm to remove the etching residue and a damaged layer in the crystal owing to dry etching.

Figure 32C:
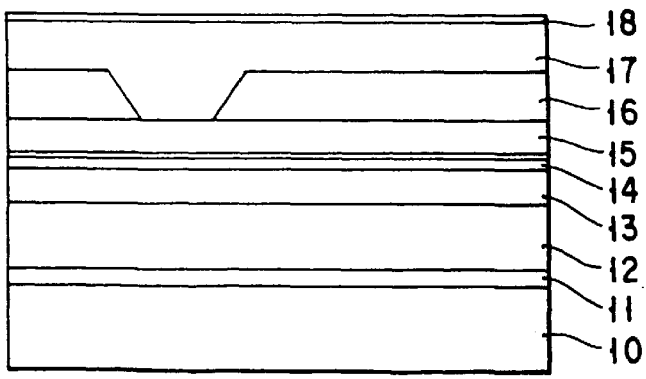

The resultant structure was loaded into the growth apparatus again to sequentially grow a first Mg-doped p-GaN contact layer 17 and a second p$^+$-GaN contact layer 18 on the current blocking layer 16 and the exposed surface of the cladding layer 15 (FIG. 32C). Thereafter, the same steps as those in the manufacturing method in FIGS. 27A to 27C were performed to manufacture the gallium nitride-based compound semiconductor laser shown in FIG. 31.

In this manufacturing method, a depth d1 of the opening portion 77 of the current blocking layer 16 is equal to the thickness of the current blocking layer 16. The opening portion 77 of the current blocking layer 16 can be evenly filled up if the opening portion 77 is designed to satisfy the following inequality:

$$(W1+W2) \times d1/d2 \leq 24 \quad (11)$$

where d2 is the thickness of the regrown p-contact layer (layer 17+layer 18), W1 is the width of the upper portion of the opening portion 77, and W2 is the width of the lower portion of the opening portion 77. In addition, to reduce the device resistance, the thickness of the p-GaN contact layer must be decreased. This thickness is preferably smaller than the depth of the opening portion 77. That is, the following inequality is preferably satisfied:

$$d2 \leq d1 \quad (12)$$

According to the embodiment described with reference to FIGS. 31 and 32A to 32C, dry etching on the interface between the cladding layer 15 and the current blocking layer 16 must be stopped, posing some difficulty in terms of the manufacturing process. If, however, the opening portion is designed in consideration of over-etching on the cladding layer 15, the sacrifice of a light confining efficiency and the like can be suppressed. In addition, since the p-GaN contact layer can be directly formed on the cladding layer 15, the effective thickness of the p-GaN layer in the opening portion 77 of the current blocking layer 16 can be decreased. The device resistance can therefore be reduced.

Figure 33:
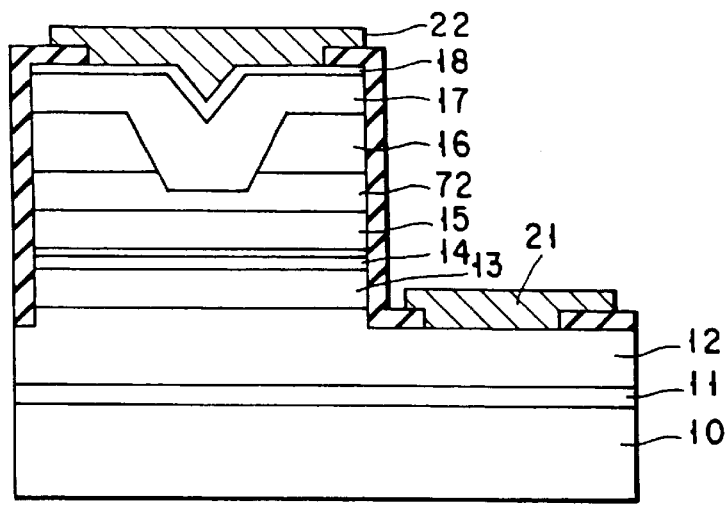
FIG. 33 is a sectional view showing the device structure of a gallium nitride-based compound semiconductor laser according to still another embodiment of the present invention.

FIG. 33 is a sectional view showing the device structure of a gallium nitride-based compound semiconductor laser according to still another embodiment of the present invention.

This embodiment is characterized in that a V-shaped groove 86 is formed in the upper surface of a contact layer on the upper portion of an opening portion 77 of a current blocking layer 16. The V-shaped groove is formed in the upper surface of the contact layer on the upper portion of the opening portion of the current blocking layer if the opening portion is designed to satisfy the following inequality:

$$24 < (W1+W2) \times d1/d2 \quad (13)$$

where d1 is the depth of the opening portion 77 of the current blocking layer 16, d2 is the thickness of the regrown contact layer (layer 17+layer 18), W1 is the width of the upper portion of the opening portion 77, and W2 is the width of the lower portion of the opening portion 77. In addition, to reduce the device resistance, the thickness of the p-GaN contact layer must be decreased. This thickness is preferably smaller than the depth of the opening portion 77. That is, the following inequality is preferably satisfied:

$$d2 \leq d1 \quad (12)$$

A method of manufacturing the semiconductor laser in FIG. 33 will be described next with reference to FIGS. 34A to 34C. Since the steps up to some step in the manufacturing process in this embodiment are the same as those in the embodiment shown in FIGS. 27A to 27C, a detailed description thereof will be omitted.

Figure 34A:
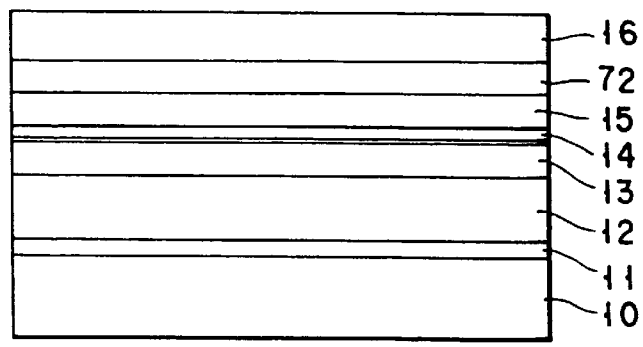
FIGS. 34A to 34C are sectional views showing a method of manufacturing the semiconductor laser in FIG. 34.

First of all, layers were grown up to the n-GaN current blocking layer 16 by MOCVD (FIG. 34A). An SiO$_2$ layer was deposited to a thickness of 0.3 µm on the current blocking layer 16 by thermal CVD, and coated with the resist layer 76. Optical exposure and developing processes were performed to form a stripe pattern. The resultant structure was heated to 150° C. in an oven containing a nitrogen atmosphere to set the resist. Subsequently, the current blocking layer 16 was partly etched by reactive ion beam etching until a p-GaN etching stop layer 72 was exposed, thereby forming the opening portion 77. The wafer was then dipped in a solution mixture of sulfuric acid, hydrogen peroxide, and water, and then in hydrofluoric acid, thereby removing the resist layer 76 serving as an etching mask and the SiO$_2$ layer 74 (FIG. 34B).

The resultant structure was dipped in a solution of HNO$_3$:HCl=3:1 heated to 100° C. or higher for 30 minutes, and was rinsed with pure water. By dipping the resultant structure in a solution of HNO$_3$:HCl=3:1 heated to 100° C. or higher for 30 minutes, the surfaces of the opening portion and the current blocking layer were etched to a depth of about 4 nm to remove the etching residue and a damaged layer in the crystal owing to dry etching.

Figure 34B:
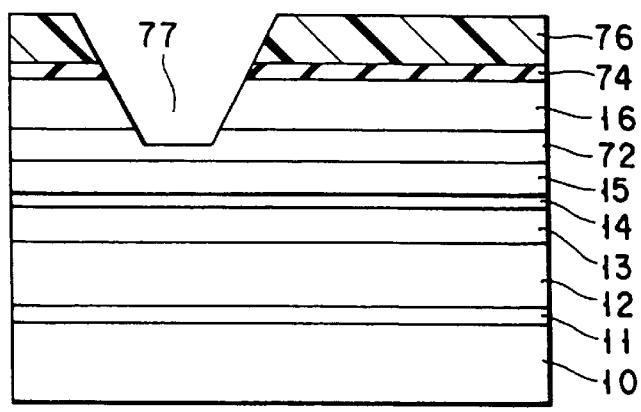
Figure 34C:
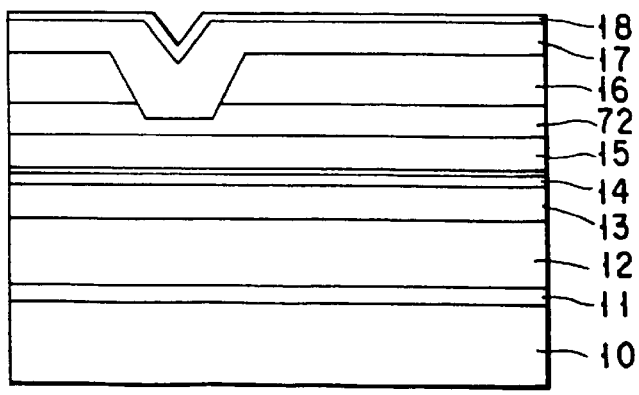

The resultant structure was loaded into the growth apparatus again to sequentially grow a first Mg-doped p-GaN contact layer 17 and a second p$^+$-GaN contact layer 18 on the current blocking layer 16 and the exposed surface of the etching stop layer 72 (FIG. 34C). Thereafter, the same steps as those in the manufacturing method in FIGS. 27A to 27C were performed to manufacture the gallium nitride-based compound semiconductor laser shown in FIG. 33.

Figure 35:
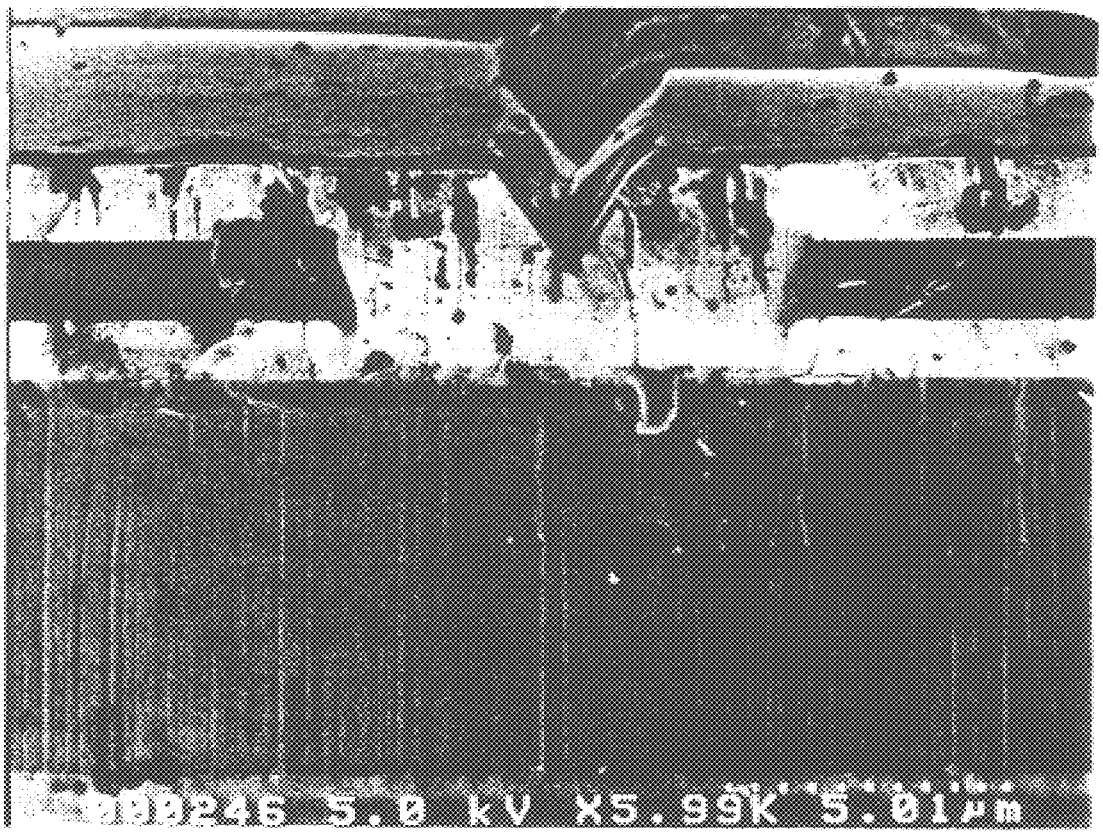
FIG. 35 is a scanning electron micrograph of a portion around an opening portion after regrowth of a p-contact layer and formation of electrodes in the semiconductor laser in FIG. 33.

In this embodiment, the width W1 and depth d1 of the opening portion 77 of the current blocking layer 16 were respectively set to 12 µm and 2.3 µm, and the p-GaN contact layer (layer 17+layer 18) was regrown to the depth d2=1.2 µm. As a result, as indicated by the micrograph of FIG. 35, the 4-µm wide, 2-µm deep V-shaped groove 86 could be formed in the upper surface of the p-contact layer on the upper portion of the opening portion 77 of the current blocking layer 16.

When the p-side electrode 22 was formed to cover the V-shaped groove 86, the contact resistance between each side surface of the groove 86 and the electrode 22 became lower than the contact resistance on the upper surface of the contact layer, thus attaining a reduction in device resistance. In addition, since the distribution of an injection current can be set such that the maximum amount of current is injected from the bottom portion of the groove, a current constriction effect higher than that obtained by only the current blocking layer can be expected.

Figure 36:
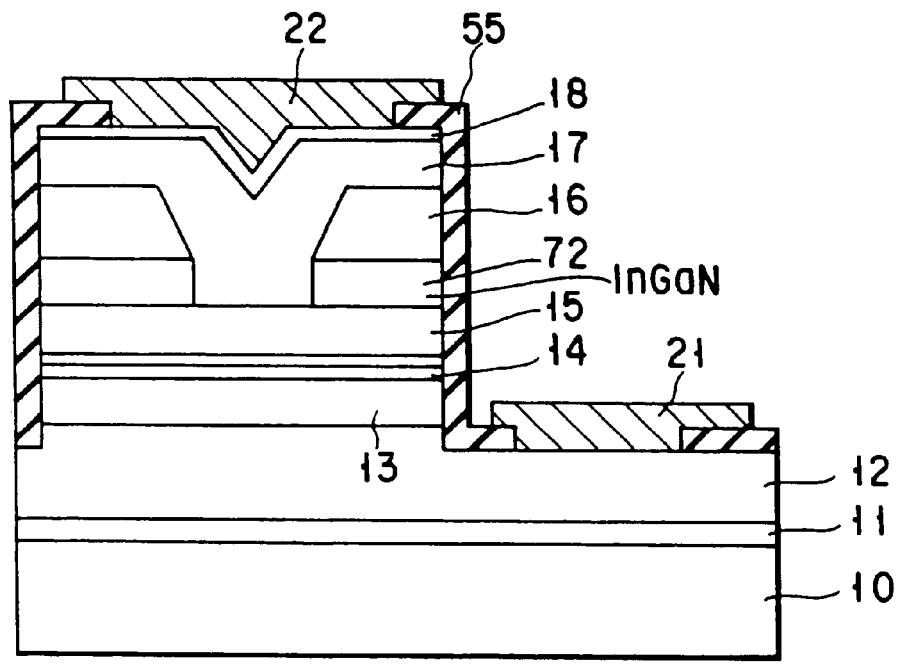
FIGS. 36 and 37 are sectional views showing the device structures of gallium nitride-based compound semiconductor lasers according to other embodiments of the present invention.
Figure 37:
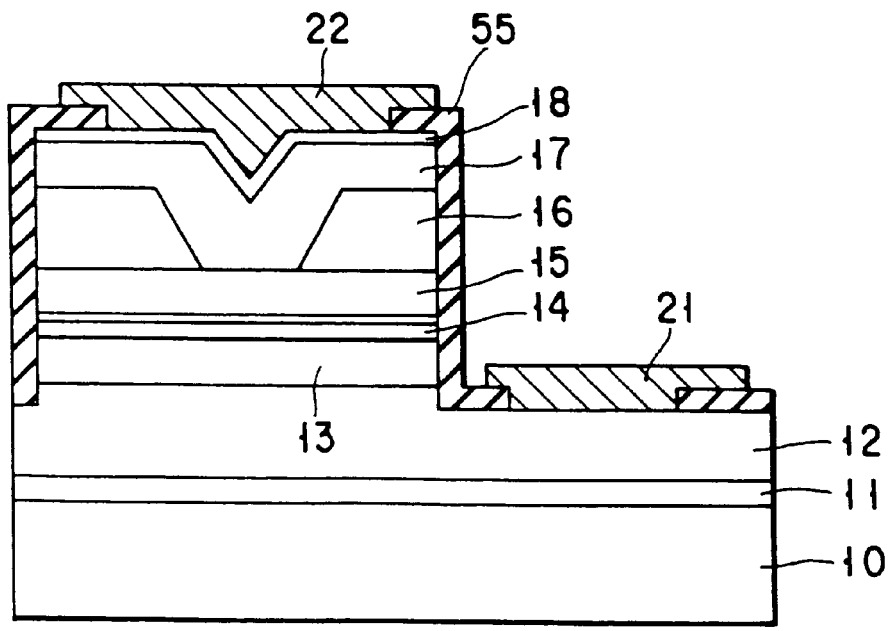

In the embodiment shown in FIGS. 34A to 34C, p-GaN is used for the etching stop layer 72. As in other embodiments, however, this embodiment can be applied to a structure using InGaN for the etching stop layer 72 and a structure using no etching stop layer 72. FIG. 36 shows a finished device structure using InGaN for an etching stop layer 72. FIG. 37 shows a finished device structure using no etching stop layer 72.

Other embodiments of the present invention will be described next with reference to FIGS. 38 to 42. Each of these embodiments is characterized in that oxygen (O) is introduced (ion implantation or diffusion) into at least a portion of a p-type hexagonal semiconductor layer doped with Mg to form a structure in which p- and i-regions are present in the same plane.

Since a Group III nitride compound semiconductor such as GaN is a hard material, dry etching is used to process it. In this case, a semiconductor layer such as an active layer is damaged by a reactive gas. For this reason, in each of these embodiments, O is introduced into a portion of an Mg-doped p-type semiconductor layer to form MgO in the p-type layer. With this process, a structure in which p- and i-regions are present in the same plane can be formed without performing an etching process, a regrowth process, and the like.

Typically, as will be described later, O is introduced into portions of an Mg-doped p-GaAlN cladding layer 15 and an Mg-doped p-GaN contact layer 92 (layer 17+layer 18) to form high-resistance current blocking layers 93 and 94, thereby forming a current constriction structure. The current blocking layers 93 and 94 formed in this manner contain MgO and hence differ in refractive index from the original layers, thereby obtaining a light confining effect. Therefore, a mode-controlled semiconductor laser device with a low oscillation threshold can be obtained.

In the semiconductor laser according to the embodiment shown in FIG. 38, an undoped GaN buffer layer 11, an Si-doped n-GaN contact layer 12, an Si-doped n-GaAlN cladding layer 13, an active layer 14, an Mg-doped p-GaAlN cladding layer 15, and an Mg-doped low-resistance p-GaN contact layer 92 are sequentially stacked on a hexagonal system substrate, e.g., a sapphire substrate 10. The active layer 14 has a multilayer structure constituted by an undoped GaN light guide layer 14a, an InGaN/InGaN quantum well layer 14b, and a p-GaN light guide layer 14c.

O is ion-implanted into a portion of the p-GaN contact layer 92, and the resultant structure is annealed to form a high-resistance GaN current blocking layer 94. The current blocking layer 94 has a 3-$\mu$m wide striped opening portion, which forms a current constriction structure. In addition, the above layers, from the contact layer 92 to an upper portion of the contact layer 12 are partly etched. An n-side electrode 21 is formed on the exposed upper surface of the contact layer 12. A p-side electrode 22 is formed on the upper surface of the contact layer 92. The threshold of the laser having this structure is 1 kA/cm$^2$, which is 1/5 or less that of the conventional laser.

In the semiconductor laser according to the embodiment shown in FIG. 39, an Si-doped n-GaN contact layer 12, an Si-doped n-GaAlN cladding layer 13, an active layer 14 having the structure as that in the embodiment shown in FIG. 38, an Mg-doped p-GaAlN cladding layer 15, and an Mg-doped low-resistance p-GaN contact layer 92 are sequentially stacked on a hexagonal system substrate, e.g., an SiC substrate 90.

O is ion-implanted into portions of the cladding layer 15 and the contact layer 92, and the resultant structure is annealed to form a high-resistance GaAlN current blocking layer 93 and a high-resistance GaN current blocking layer 94. The current blocking layers 93 and 94 have 3-$\mu$m wide striped opening portions, which form current constriction structures. In addition, the above layers, from the contact layer 92 to an upper portion of the contact layer 12 are partly etched. An n-side electrode 21 is formed on the exposed upper surface of the contact layer 12. A p-side electrode 22 is formed on the upper surface of the contact layer 92. The threshold of the laser having this structure is 1 kA/cm$^2$, which is 1/5 or less that of the conventional laser.

The embodiment shown in FIG. 40 is similar to the embodiment shown in FIG. 39 except that an n-side electrode 21 is formed on the lower surface of an SiC substrate 90.

The embodiment shown in FIG. 41 is similar to the embodiment shown in FIG. 38 except that a GaN current blocking layer 94 extends to the interface between a p-cladding layer 15 and a p-contact layer 92.

The embodiment shown in FIG. 42 is obtained by combining the two embodiments shown in FIGS. 39 and 41. This embodiment uses a sapphire substrate 10. O is ion-implanted into portions of an Mg-doped p-GaAlN cladding layer 15 and an Mg-doped p-GaN contact layer 92, and the resultant structure is annealed to form a high-resistance GaAlN current blocking layer 93 and a high-resistance GaN current blocking layer 94.

Other embodiments of the present invention will be described next with reference to FIGS. 43 to 46. Each of these embodiments is characterized in that oxygen (O) is introduced (ion implantation or diffusion) into at least a portion of a hexagonal system semiconductor layer containing Al as a constituent device to form a structure in which high- and low-resistance regions are present in the same plane.

Since a Group III nitride compound semiconductor such as GaN is a hard material, dry etching is used to process it. For this reason, it is difficult to form an device structure that requires a micropatterning process. For this reason, in each of these embodiments, O is introduced into a portion of a semiconductor layer containing Al as a constituent device to form $Al_xO_y$ in the semiconductor layer. With this process, a structure in which low- and high-resistance regions are present in the same plane can be formed without performing an etching process, a regrowth process, and the like. In a flat device, in particular, a refractive index difference and a current constriction effect can be provided for a fine resonator, resulting in a great improvement in performance. For example, in a laser, a great decrease in oscillation threshold can be expected.

Typically, as will be described later, current constriction structures can be formed by introducing O into portions of n- and p-GaAlN cladding layers 13 and 15 and the like to form a high-resistance current blocking layer 106. Since the current blocking layer 106 formed in this manner contains $Al_xO_y$, the current blocking layer has the lowest refractive index among the layers. This layer therefore exhibits a light confining effect. For this reason, a mode-controlled semiconductor laser device with a low oscillation threshold.

Figure 43:
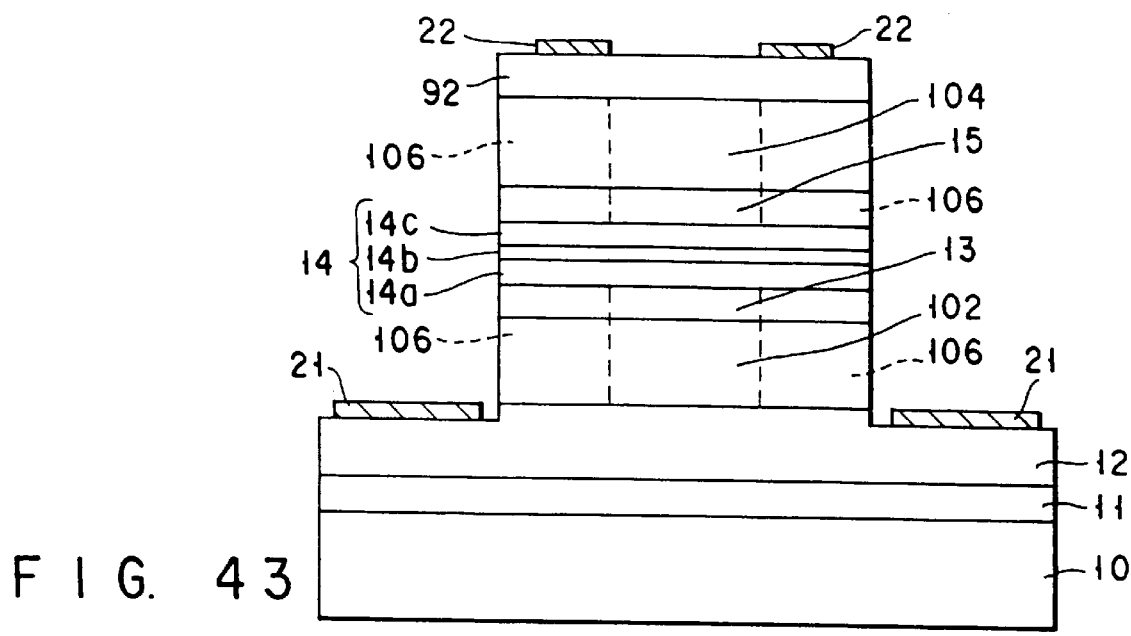
FIGS. 43 to 46 are sectional views showing semiconductor lasers according to other embodiments of the present invention.

In the semiconductor laser according to the embodiment shown in FIG. 43, an undoped GaN buffer layer 11, an Si-doped n-GaN contact layer 12, an n-GaN/GaAlN reflector layer 102, an Si-doped n-GaAlN cladding layer 13, an active layer 14, an Mg-doped p-GaAlN cladding layer 15, a p-GaN/GaAlN reflector layer 104, and an Mg-doped low-resistance p-GaN contact layer 92 are sequentially stacked on a hexagonal system substrate, e.g., a sapphire substrate 10. The active layer 14 has a multilayer structure constituted by an undoped GaN light guide layer 14a, an InGaN/InGaN quantum well layer 14b, and a p-GaN layer 14c.

O is ion-implanted into portions of the n- and p-cladding layers 13 and 15 and the n- and p-reflector layers 102 and 104 to form a high-resistance current blocking layer 106 containing $Al_xO_y$. The current blocking layer 106 is formed to surround a current injection region having a diameter of a 3-μm, so that a current constriction structure is formed. The above layers, from the p-contact layer 92 to an upper portion of the n-contact layer 12, are partly etched, and an n-side electrode 21 is formed on the exposed surface of the contact layer 12. A p-side electrode 22 is formed on the upper surface of the contact layer 92. The laser having this structure is of the plane emission type which emits light in a direction along which the layers stacked. The threshold of the laser is 0.3 kA/cm$^2$, which is 1/5 or less that of the conventional laser.

Figure 44:
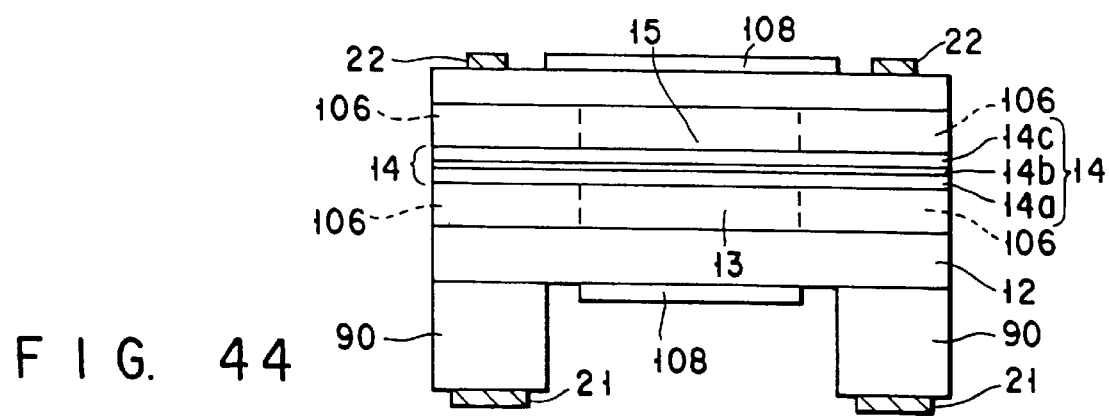

In the semiconductor laser according to the embodiment shown in FIG. 44, an Si-doped n-GaN contact layer 12, an Si-doped n-GaAlN cladding layer 13, an active layer 14 having the same structure as that in the embodiment in FIG. 43, an Mg-doped p-GaAlN cladding layer 15, and an Mg-doped low-resistance p-GaN contact layer 92 are sequentially stacked on a hexagonal system substrate, e.g., an SiC substrate 90. The substrate 90 is partly etched from its lower surface, and SiO/TiO reflector layers 108 are formed on the exposed surface of the contact layer 12 and the upper surface of the contact layer 92.

O is ion-implanted into portions of the n- and p-cladding layers 13 and 15 to form a high-resistance current blocking layer 106 containing $Al_xO_y$. The current blocking layer 106 is formed to surround a current injection region having a diameter of a 3-μm, so that a current constriction structure is formed. An n-side electrode 21 is formed on the lower surface of the SiC substrate 90, and a p-side electrode 22 is formed on the upper surface of the p-contact layer 92. The threshold of the laser having this structure of the plane emission type is 1 kA/cm$^2$, which is 1/5 or less that of the conventional laser.

Figure 45:
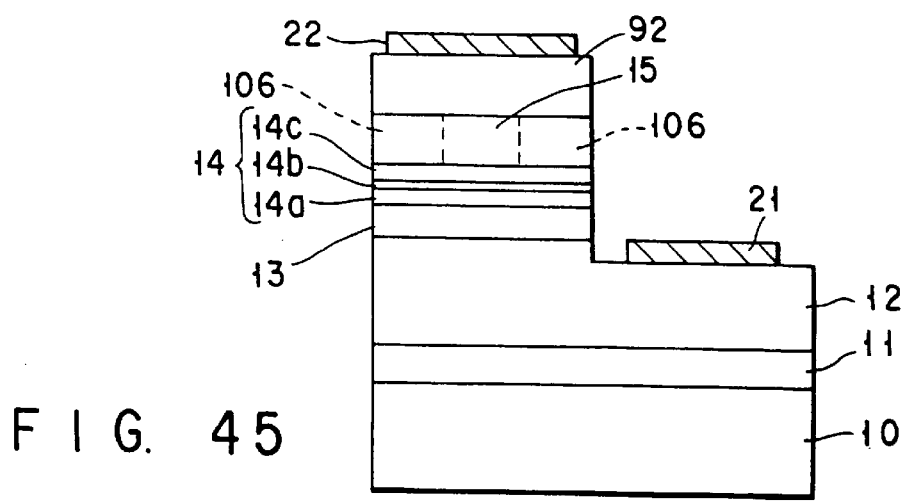

In the semiconductor laser according to the embodiment shown in FIG. 45, an undoped GaN buffer layer 11, an Si-doped n-GaN contact layer 12, an Si-doped n-GaAlN cladding layer 13, an active layer 14 having the same structure as that in the embodiment shown in FIG. 43, an Mg-doped p-GaAlN cladding layer 15, and an Mg-doped low-resistance p-GaN contact layer 92 are sequentially stacked on a hexagonal system substrate, e.g., a sapphire substrate 10.

O is ion-implanted into a portion of the p-cladding layer 15 to form a high-resistance current blocking layer 106 containing $Al_xO_y$. The current blocking layer 106 has a 3-μm wide striped opening portion. With this opening portion, a current constriction structure is formed. The above layers, from the contact layer 92 to an upper portion of the contact layer 12, are partly etched. An n-side electrode 21 is formed on the exposed surface of the contact layer 12, and a p-side electrode 22 is formed on the upper surface of the contact layer 92. The threshold of the laser having this structure is 1 kA/cm$^2$ which is 1/5 or less that of the conventional laser.

Figure 46:
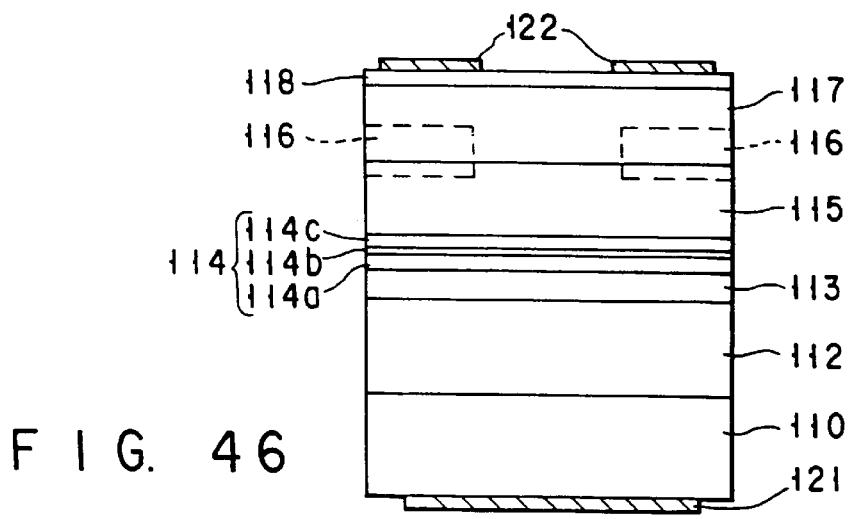

In the semiconductor laser according to the embodiment shown in FIG. 46, an n-DBR (Distributed Bragg Reflector) layer 112 formed from AlGaAs/AlGaAs/AlAs/AlGaAs/AlGaAs, an n-AlGaAs cladding layer 113, an active layer 114, an p-AlGaAs cladding layer 115, a p-DBR layer 117 formed from AlGaAs/AlGaAs/AlAs/AlGaAs/AlGaAs, and a p-GaAs contact layer 118 are sequentially stacked on a hexagonal system substrate, e.g., an n-GaAs substrate 110. The active layer 114 has a multilayer structure constituted by a light guide layer 114a, an AlGaAs/GaAs quantum well layer 114b, and a p-GaAs light guide 114c.

O is ion-implanted into portions of the p-cladding layer 115 and the p-DBR layer 117 to form a high-resistance current blocking layer 116 containing $Al_xO_y$. The current blocking layer 116 is formed to surround a current injection region having a diameter of a 3-μm, so that a current constriction structure is formed. An n-side electrode 121 is formed on the lower surface of the GaAs substrate 110, and a p-side electrode 122 is formed on the upper surface of the p-contact layer 118. The threshold of the laser having this structure of the plane emission type is 1 k/cm$^2$, which is 1/5 or less that of the conventional laser.

Other embodiments of the present invention will be described next with reference to FIGS. 47 to 50. Each of these embodiments is characterized in that an impurity is introduced into at least a portion of a hexagonal system semiconductor layer to form a structure in which two of p-, n-, and i-regions are present in the same plane.

Since a Group III nitride compound semiconductor such as GaN is a hard material, dry etching is used to process it. In this case, a semiconductor layer such as an active layer is damaged by a reactive gas. For this reason, in each of these embodiments, an impurity is introduced into at least a portion of the semiconductor layer. With this process, a structure in which two of p-, n-, and i-regions are present in the same plane can be formed without performing an etching process, a regrowth process, and the like. With this structure, a current constriction structure, an electrode extraction portion, and the like can be formed.

In an Mg-doped p-semiconductor layer, the number of carriers increases with a rise in temperature. When an impurity is introduced (ion implantation or diffusion) into the semiconductor layer to form a heating layer, since heat can be locally generated during an operation, a semiconductor laser device with a low oscillation threshold can be obtained. With the use of the heating layer, sufficient carriers are generated, and a light-receiving device especially suitable for reception of ultraviolet rays.

Figure 47:
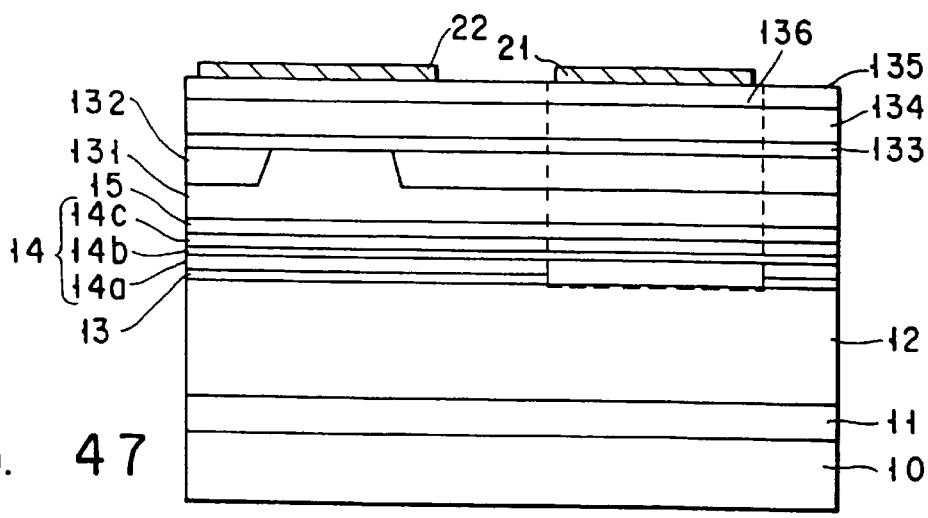
FIGS. 47 to 50 are sectional views showing semiconductor devices according to other embodiments of the present invention.

In the semiconductor laser according to the embodiment shown in FIG. 47, an undoped GaN buffer layer 11, an Si-doped n-GaN contact layer 12, an Si-doped n-GaAlN cladding layer 13, an active layer 14, and an Mg-doped p-GaAlN cladding layer 15 are sequentially stacked on a hexagonal system substrate, e.g., a sapphire substrate 10. The active layer 14 has a multilayer structure constituted by an undoped GaN light guide layer 14a, an InGaN/InGaN quantum well layer 14b, and a p-GaN light guide layer 14c.

A low-resistance p-GaN layer 131, a high-resistance GaN current blocking layer 132, a high-resistance p-GaN layer 133, a p-GaN layer 134, and a p-GaN contact layer 135 are sequentially stacked on the p-cladding layer 15. The current blocking layer 132 has a 3-μm wide striped opening portion. With this opening portion, a current constriction structure is formed.

Si is partly ion-implanted as an impurity into the above layers from the p-contact layer 135 to reach the n-contact layer 12 through the n-cladding layer 13 so as to form a low-resistance n-electrode extraction layer 136. An n-side electrode 21 is formed on the upper surface of the n-electrode extraction layer 136. A p-side electrode 22 is formed on the upper surface of the p-contact layer 135. The threshold of the laser having this structure is 1 kA/cm², which is ⅕ or less that of the conventional laser.

Figure 48:
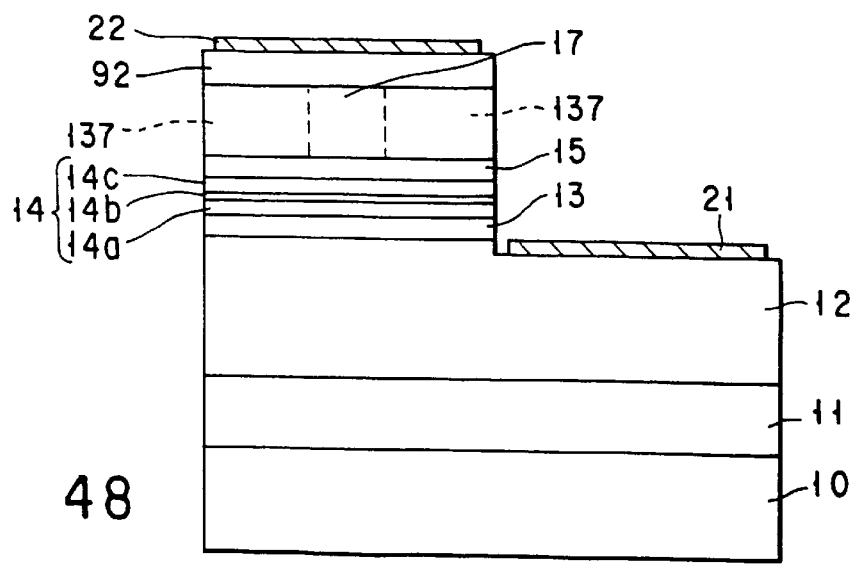

In the semiconductor laser according to the embodiment shown in FIG. 48, an undoped GaN buffer layer 11, an Si-doped n-GaN contact layer 12, an Si-doped n-GaAlN cladding layer 13, an active layer 14 having the same structure as in the embodiment shown in FIG. 47, an Mg-doped p-GaAlN cladding layer 15, an Mg-doped p-GaN current injection layer 17, and an Mg-doped low-resistance p-GaN contact layer 18 are sequentially stacked on a hexagonal system substrate, e.g., a sapphire substrate 10.

Si is ion-implanted into a portion of the p-current injection layer 17 to form a high-resistance GaN current blocking layer 137. The current blocking layer 137 has a 3-$\mu$m wide striped opening portion. With this opening portion, a current constriction structure is formed. In addition, the above layers, from the contact layer 18 to an upper portion of the contact layer 12, are partly etched. An n-side electrode 21 is formed on the exposed surface of the contact layer 12. A p-side electrode 22 is formed on the upper surface of the contact layer 18. The threshold of the laser having this structure is 1 kA/cm², which is ⅕ or less that of the conventional laser.

Figure 49:
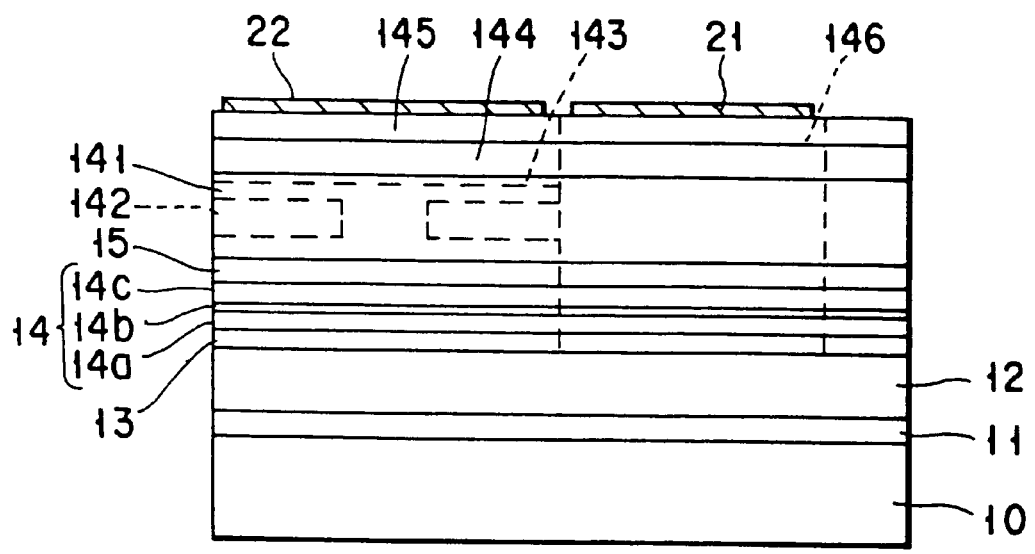

In the semiconductor laser according to the embodiment shown in FIG. 49, an undoped GaN buffer layer 11, an Si-doped n-GaN contact layer 12, an Si-doped n-GaAlN cladding layer 13, an active layer 14 having the same structure as that in the embodiment shown in FIG. 47, and an Mg-doped p-GaAlN cladding layer 15 are sequentially stacked on a hexagonal system substrate, e.g., a sapphire substrate 10.

A low-resistance p-GaN layer 141, a low-resistance p-GaN layer 144, and a p-GaN contact layer 145 are sequentially stacked on the cladding layer 15. Si is diffused as an impurity into a portion of the p-GaN layer 141 to form a high-resistance GaN current blocking layer 142. The current blocking layer 142 has a 3-$\mu$m wide striped opening portion. With this opening portion, a current constriction structure is formed. Si is diffused as an impurity into the entire upper surface of the p-GaN layer 141 to form a high-resistance p-GaN layer 143.

Si is partly ion-implanted as an impurity into the above layers from the p-contact layer 145 to reach the n-contact layer 12 through the n-cladding layer 13 so as to form a low-resistance n-electrode extraction layer 146. An n-side electrode 21 is formed on the upper surface of the n-electrode extraction layer 146. A p-side electrode 22 is formed on the upper surface of the p-contact layer 145. The threshold of the laser having this structure is 1 kA/cm², which is ⅕ or less that of the conventional laser.

Figure 50:
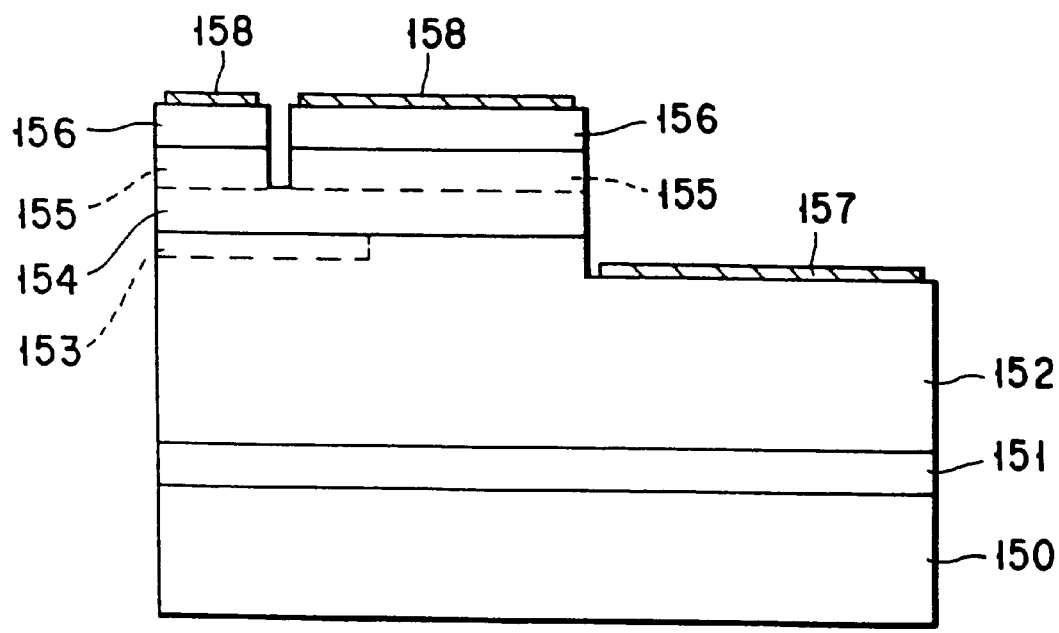

In the semiconductor light-receiving device according to the embodiment shown in FIG. 50, an undoped GaN buffer layer 151, an n-GaN contact layer 152, a low-resistance p-GaN layer 154, and a p-GaN contact layer 156 are sequentially stacked on a hexagonal system substrate, e.g., a sapphire substrate 150. An impurity is introduced into a portion of the upper surface of the n-contact layer 152 to form a high-resistance GaN current blocking layer 153. An impurity is introduced into the upper surface of the p-layer 154 to form a high-resistance GaN heating layer 155.

The above layers, from the contact layer 156 to an upper portion of the contact layer 152, are partly etched. An n-side electrode 157 is formed on the exposure surface of the contact layer 152. A p-side electrode 158 is formed on the upper surface of the contact layer 156. According to this structure, since heat can be locally generated by the heating layer 155 during an operation, sufficient carriers can be supplied.

In each embodiment described above, the materials, the compositions, the thicknesses of the layers, and the like are specifically described. However, they can be changed within the spirit and scope of the invention. The gallium nitride-based compound semiconductors, in particular, can be variously changed within the composition formula of $\text{In}_x\text{Ga}_y\text{Al}_z\text{N}$ (x+y+z=1, $0 \leq x, y, z \leq 1$). In addition, instead of a sapphire substrate, for example, an SiC, GaAs, Si, GaN, AlN, MgO, GaP, or $\text{MgAl}_2\text{O}_4$ substrate can be used.

In the above embodiments, the present invention is mainly applied to semiconductor lasers. However, the present invention is not limited to semiconductor lasers, and can be applied to various semiconductor devices using gallium nitride-based compound semiconductor materials.

According to the present invention, carriers can be efficiently injected into the active layer, and voltage drops at the electrode contacts and the like can be suppressed, thereby realizing a highly reliable gallium nitride-based compound semiconductor laser which is used for optical disks and the like and operates at a low threshold and a low operating voltage.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nitride-based compound semiconductor laser comprising:

an active layer having a cyclic structured formed by cyclically stacking not less than two types of semiconductor layers, which are different in band energy and 10 nm or less in thickness;

first and second cladding layers of first and second conductivity types formed to sandwich said active layer so as to form a double-heterojunction structure, said second cladding layer being of p-type conductivity and doped with Mg used as a p-type impurity;

first and second electrodes connected to said first and second cladding layers;

a current blocking layer formed between said second electrode and said second cladding layer and having a striped opening portion for constricting a current for said double-heterojunction structure, a current injection layer formed between said second electrode and said current blocking layer and in said opening portion and having an area larger than that of said opening portion; and a contact layer formed between said second electrode and said current injection layer, said contact layer being of p-type conductivity and doped with Mg used as a p-type impurity, wherein each of said first and second cladding layers, said current blocking layer, said current injection layer consists essentially of a material represented by the following composition formula:

$\text{In}_x\text{Ga}_y\text{Al}_z\text{N}$ where x+y+z=1, and $0 \leq x, y, z \leq 1$, and when a distance between said current blocking layer and said active layer is represented by TB, and a thickness of said current injection layer excluding a portion in said opening portion is represented by TC, a condition of TB<TC is satisfied.

2. The laser according to claim 1, wherein a condition of 1.7TB<TC<5TB is satisfied.

3. The laser according to claim 1, wherein when a thickness of said current blocking layer is represented by TA, a condition of TC<TA is satisfied.

4. The laser according to claim 3, wherein a condition of 1.2TC<TA is satisfied.

5. The laser according to claim 4, wherein a condition of 1.2TC<TA<2TC is satisfied.

6. The laser according to claim 1, wherein when a depth of said opening portion is represented by d1, and widths of upper and lower portions of said opening portion are respectively represented by W1 and W2, a condition of $(W1+W2) \times d1/TC \leq 24$ is satisfied.

7. The laser according to claim 6, wherein a condition of $d1 \leq TC$ is satisfied.

8. The laser according to claim 1, wherein a V-shaped groove is formed in an upper surface of said current injection layer in a form of a stripe above said opening portion, and said second electrode has a portion in contact with said current injection layer in said groove.

9. The laser according to claim 8, wherein when a depth of said opening portion is represented by d1, and widths of upper and lower portions of said opening portion are respectively represented by W1 and W2, a condition of $24<(W1+W2) \times d1/TC$ is satisfied.

10. The laser according to claim 1, wherein a portion, of said current injection layer, which is near said active layer has a band gap larger than a band gap corresponding to an emission wavelength of said active layer and a refractive index higher than that of said current blocking layer.

11. The laser according to claim 10, wherein said second cladding layer and said current blocking layer have substantially the same refractive index.

12. The laser according to claim 10, wherein a portion, of said current injection layer, which is near said active layer has substantially the same refractive index as that of said second cladding layer.

13. The laser according to claim 1, wherein said current blocking layer has a band gap larger than a band gap corresponding to an emission wavelength of said active layer, and a refractive index higher than that of a portion, of said current injection layer, which is near said active layer.

14. The laser according to claim 13, wherein said second cladding layer and said current blocking layer have substantially the same refractive index.

15. The laser according to claim 13, wherein a portion, of said current injection layer, which is near said active layer has substantially the same refractive index as that of said second cladding layer.

16. The laser according to claim 1, wherein a portion, of said current injection layer, which is near said active layer has a band gap larger than a band gap corresponding to an emission wavelength of said active layer, and said current blocking layer has a band gap smaller than said band gap corresponding to said emission wavelength of said active layer.

17. The laser according to claim 1, wherein a striped groove continuous with said opening portion is formed in an upper surface of said second cladding layer, and said current injection layer is formed to be in contact with said second cladding layer in said groove.

18. The laser according to claim 17, wherein said groove has a V shape.

19. The laser according to claim 17, wherein said groove has a flat bottom portion.

20. The laser according to claim 17, wherein said groove has a width smaller than that of said opening portion.

21. The laser according to claim 17, wherein a portion, of said current injection layer, which is in contact with said groove has a refractive index higher than that of said current blocking layer.

22. The laser according to claim 17, wherein a portion, of said current injection layer, which is in contact with said groove has a refractive index lower than that of said current blocking layer.

* * * * *

UNITED STATES PATENT AND TRADEMARK OFFICE
CERTIFICATE OF CORRECTION

PATENT NO. : 6,359,919 B1  Page 1 of 1
DATED : March 19, 2002
INVENTOR(S) : Ishikawa et al.

It is certified that error appears in the above-identified patent and that said Letters Patent is hereby corrected as shown below:

<u>Title page,</u>
Item [62], the Related U.S. Application Data is incorrect. Item [62] should read as follows:
--                  Related U.S. Application Data
[62]   Division of application No. 09/373,624, filed on Aug, 13, 1999, now Pat. No. 6,118,801, which is a division of application No. 08/900,121, filed on Jul. 25, 1997, now Pat. No. 5,987,048 --

Signed and Sealed this

Twenty-second Day of October, 2002

*Attest:*

*Attesting Officer*

JAMES E. ROGAN
*Director of the United States Patent and Trademark Office*